US007461234B2

(12) United States Patent
Ray et al.

(10) Patent No.: US 7,461,234 B2
(45) Date of Patent: Dec. 2, 2008

(54) LOOSELY-BIASED HETEROGENEOUS RECONFIGURABLE ARRAYS

(75) Inventors: Nicholas John Charles Ray, Swindon (GB); Andrea Olgiati, Newport (GB); Anthony I. Stansfield, North Somerset (GB); Alan D Marshall, Bristol (GB)

(73) Assignee: Panasonic Corporation, Osaka (JP)

( * ) Notice: Subject to any disclaimer, the term of this patent is extended or adjusted under 35 U.S.C. 154(b) by 93 days.

(21) Appl. No.: 11/130,613

(22) Filed: May 16, 2005

(65) Prior Publication Data

US 2005/0257024 A1    Nov. 17, 2005

(51) Int. Cl.
*G06F 15/00* (2006.01)
*G06F 15/163* (2006.01)

(52) U.S. Cl. .............................. 712/10; 712/15; 712/11; 712/16

(58) Field of Classification Search ................... 712/18; 708/234, 207
See application file for complete search history.

(56) References Cited

U.S. PATENT DOCUMENTS

| | | | | |
|---|---|---|---|---|
| 4,811,214 A | * | 3/1989 | Nosenchuck et al. | 712/11 |
| 5,038,386 A | * | 8/1991 | Li | 382/302 |
| 5,442,577 A | | 8/1995 | Cohen | |
| 5,448,496 A | * | 9/1995 | Butts et al. | 716/16 |
| 5,715,186 A | | 2/1998 | Curtet | |
| 5,742,180 A | * | 4/1998 | DeHon et al. | 326/40 |
| 5,829,262 A | * | 11/1998 | Urata et al. | 62/174 |
| 5,988,881 A | * | 11/1999 | Sutherland | 383/103 |
| 6,023,573 A | * | 2/2000 | Bai et al. | 703/2 |
| 6,052,773 A | * | 4/2000 | DeHon et al. | 712/43 |
| 6,088,526 A | * | 7/2000 | Ting et al. | 712/33 |
| 6,092,174 A | * | 7/2000 | Roussakov | 712/15 |
| 6,145,072 A | * | 11/2000 | Shams et al. | 712/22 |
| 6,405,299 B1 | * | 6/2002 | Vorbach et al. | 712/11 |

(Continued)

FOREIGN PATENT DOCUMENTS

WO      WO 00/69073 A1    11/2000

(Continued)

OTHER PUBLICATIONS

Alan Marshall et al. A Reconfigurable Arithmetic Array for Multimedia Application, Proceedings of the 1999 ACM/SIGDA on FPGA.*

(Continued)

*Primary Examiner*—Matt Kim
*Assistant Examiner*—Cheng-Yuan Tseng
(74) *Attorney, Agent, or Firm*—Orrick, Herrington & Sutcliffe LLP

(57) ABSTRACT

A heterogeneous array includes clusters of processing elements. The clusters include a combination of ALUs and multiplexers linked by direct connections and various general-purpose routing networks. The multiplexers are controlled by the ALUs in the same cluster, or alternatively by ALUs in other clusters, via a special purpose routing network. Components of applications configured onto the array are selectively implemented in either multiplexers or ALUs, as determined by the relative efficiency of implementing the component in one or the other type of processing element, and by the relative availability of the processing element types. Multiplexer control signals are generated from combinations of ALU status signals, and optionally routed to control multiplexers in different clusters.

50 Claims, 26 Drawing Sheets

U.S. PATENT DOCUMENTS

| | | | |
|---|---|---|---|
| 6,469,540 B2* | 10/2002 | Nakaya | 326/41 |
| 6,526,498 B1* | 2/2003 | Mirsky et al. | 712/11 |
| 6,609,189 B1* | 8/2003 | Kuszmaul et al. | 712/23 |
| 6,684,318 B2 | 1/2004 | DeHon et al. | |
| 6,738,891 B2* | 5/2004 | Fujii et al. | 712/16 |
| 6,769,056 B2* | 7/2004 | Barry et al. | 712/15 |
| 6,781,408 B1 | 8/2004 | Langhammer | |
| 6,859,869 B1* | 2/2005 | Vorbach | 712/10 |
| 7,272,691 B2 | 9/2007 | Stewart et al. | |
| 2002/0138716 A1 | 9/2002 | Master | |
| 2003/0135710 A1* | 7/2003 | Farwell et al. | 712/10 |
| 2004/0001445 A1* | 1/2004 | Stansfield | 370/254 |
| 2004/0027155 A1* | 2/2004 | Schlansker et al. | 326/38 |
| 2004/0208171 A1* | 10/2004 | Ovadia et al. | 370/360 |
| 2005/0063373 A1* | 3/2005 | DeHon et al. | 370/380 |

FOREIGN PATENT DOCUMENTS

WO    WO 2004/075403 A2    9/2004

OTHER PUBLICATIONS

Kai Hwang, Advanced Computer Architecture, McGraw Hill, 1993.*
Bursky, D, "PFGA Combines Multiple Serial Interfaces and Logic" Electronic Design, Penton Publishing, Cleveland, Ohio vol. 28, No. 20, Oct. 2, 2000, pp. 74-76, 78.
"Virtex-II 1.5V Field-Programmable Gate Arrays", Virtex-II Platform FPGA Handbook, Xilinx Inc, v1.0, Dec. 6, 2000, p. 47.
Anthony Stansfield and Ian Page, "The Design of a New FPGA Architecture", 1995, Proceedings of FPL 1995 Conference, pp. 1-14.

\* cited by examiner

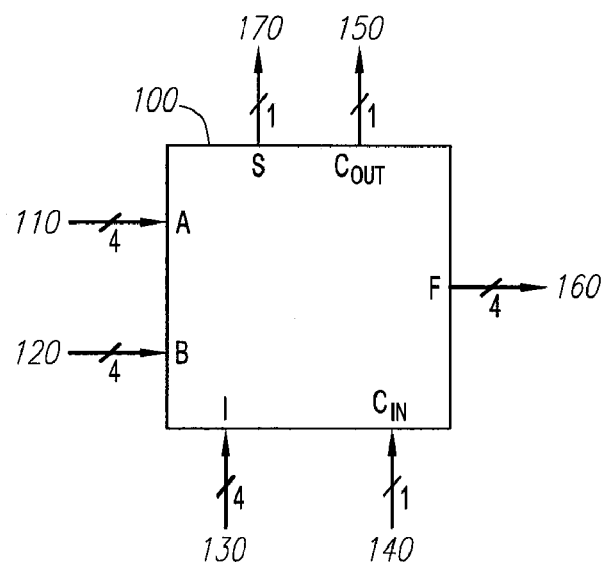
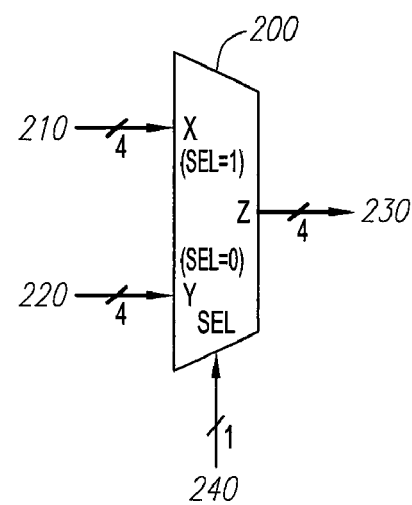
*FIG. 1*          *FIG. 2*
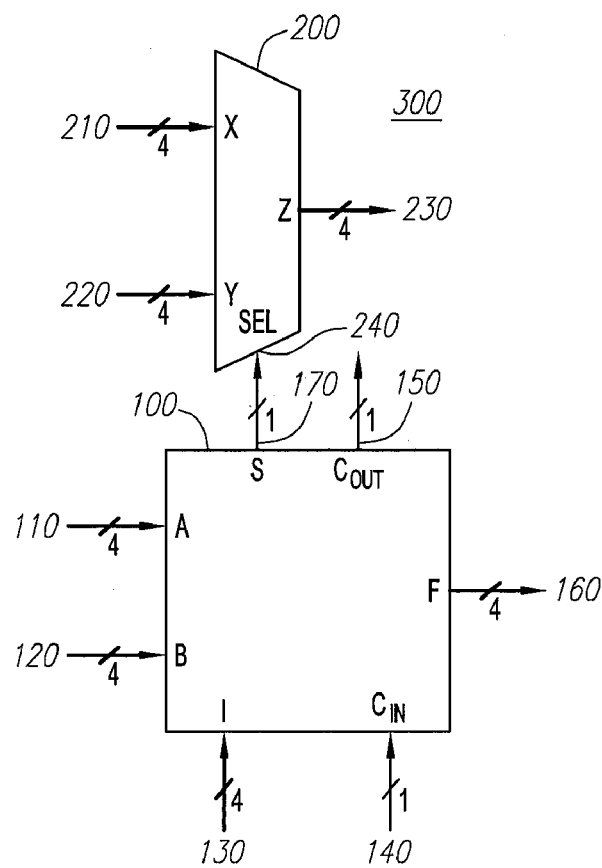
*FIG. 3*

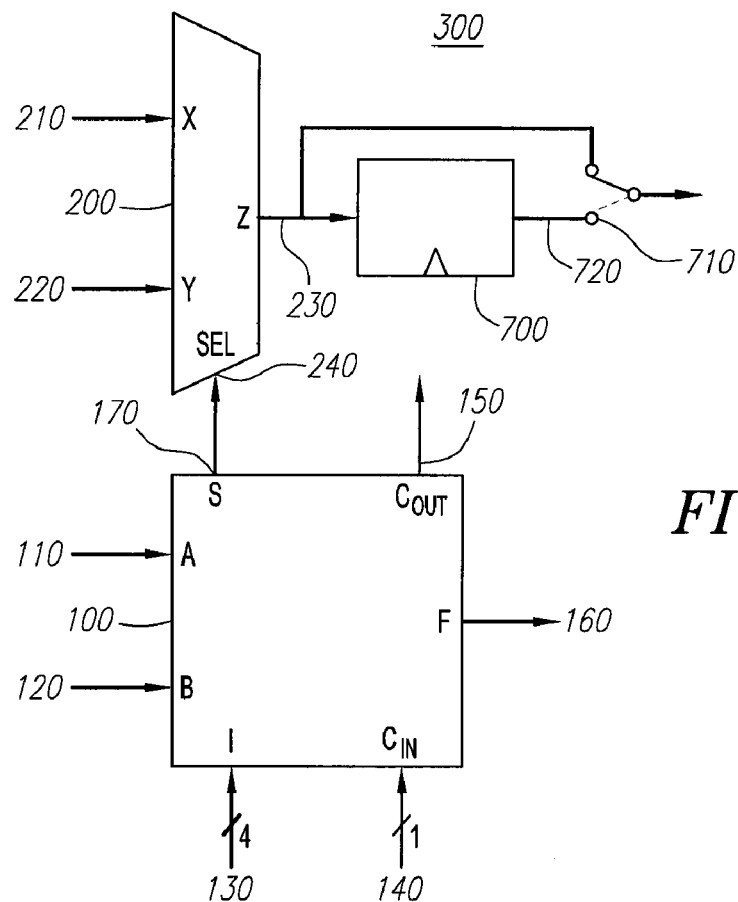
*FIG. 7*
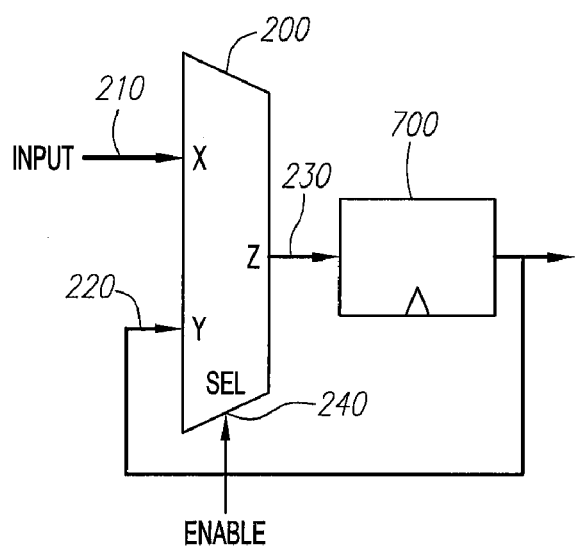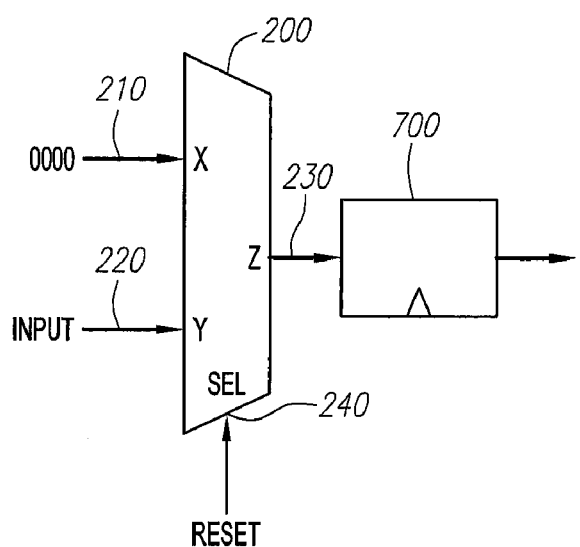
*FIG. 8A*  *FIG. 8B*

LOOSELY-BIASED HETEROGENEOUS RECONFIGURABLE ARRAYS

This application is a continuation-in-part of application Ser. No. 10/188,388 filed on Jul. 1, 2002, all of which is expressly incorporated herein by reference.

BACKGROUND AND SUMMARY

The invention relates to reconfigurable computing devices. More particularly the invention relates to heterogeneous arrays with array element types capable of implementing multiple aspects of an application.

Reconfigurable devices, such as field programmable gate arrays ("FPGAs"), processor arrays and reconfigurable arithmetic arrays ("RAAs"), normally include a number of processing elements together with an interconnect scheme to connect them together. This interconnect commonly takes the form of a general-purpose routing network, but sometimes other more restrictive forms of interconnect are used. The interconnect typically includes one or more types of routing elements.

A routing element is a device used to route signals across an interconnect from one processing element to another. A routing element is controllable solely by configuration signals, which are signals directly or indirectly derived from the configuration process, and not dependent on run-time data. Examples of routing elements include pass transistors, tristate buffers, and statically configured multiplexers (i.e. multiplexers with the select input controlled by the configuration of the array) but regardless of the construction of the network its function remains the same—to propagate data from network inputs to network outputs.

A processing element has one or more data inputs and computes one or more data outputs, each of which is a function that may depend on one or more input values. Processing elements are controllable by data signals received from other processing elements, or by configuration signals, or by both. Examples of processing elements include adders, multipliers, FPGA-like Look-up tables (LUTs), and multiplexers with the select signal capable of being connected to a data input. Processing elements may include registers, so that the output is a function of the values of some or all of the inputs at earlier times.

A general purpose routing network has multiple input terminals and multiple output terminals (and possibly also some bi-directional terminals configurable as either input terminals or output terminals), and can be configured to create a connection between any input terminal and any output terminal. The general purpose routing network carries values of the same bit width. When configured, a general purpose routing network makes multiple independent connections, each one connecting a network input to one or more network outputs, while each network output is connected to at most one network input. A general purpose routing network can simultaneously make any two arbitrary connections (A→B) and (C→D) between any two network inputs A, C and any two network outputs B, D, where B≠D. These connections may pass through registers (so that there may be some time offset between network input and network output) and switches used to route the data. The bit width of a general purpose routing network is determined by the number of 1-bit data lines which are controlled by each bit of configuration memory in the switches of the general purpose routing network. Thus, in a 4-bit general purpose routing network, each bit of configuration memory controls 4 1-bit data lines. Data is therefore sent across the network as 4-bit wide words.

The design of a reconfigurable device is a process of specifying the properties of the processing elements and the interconnect. For both of these elements this involves a series of compromises, discussed below.

The choice of processing element is a compromise between functionality and various parameters such as physical size, operating speed or power dissipation. For example, adding functionality increases the size of each element, but may reduce the total number of elements needed to implement an application. Functionality is only worth adding if the reduction in number of elements outweighs the increase in size of each individual element, so that there is no net increase in application area. Increasing functionality impacts other parameters similarly.

There are various different types of reconfigurable devices, as noted above. There are also various different types of applications for reconfigurable devices. Each of the different types of reconfigurable devices typically perform some types of applications better than others. The assessment of the suitability of a particular processing element used in a reconfigurable device is therefore dependent on the type of applications the device is intended to be used for.

There are several "sweet spots" in the size/functionality space, partly due to partitioning of the application space (e.g. processor arrays are typically used for different types of applications than FPGAs), and partly because a combination of features together may be better than any one of them on their own (e.g. adding a multiplier or a divider to a processor may not be worthwhile, but adding both—with some sharing of hardware between them—is a net benefit).

The interconnect is also a compromise between functionality and various parameters such as physical size, operating speed or power dissipation. The ideal interconnect has zero propagation delay, no risk of one route interfering with another, and a negligible physical area. This ideal does not exist in practice. In reaching a suitable compromise, the properties of various elements can be considered, such as:

The processing elements:
High-speed processing elements can only be fully exploited with a high-speed interconnect;
It is beneficial to route data in the same bit width as the data is processed by the processing elements.

The array:
The number of possible connections grows as the square of the number of processing elements. The "cost per element" of an interconnect that guarantees no interference between connections therefore increases with the number of processing elements. This may be affordable for small arrays, but is not for large ones.
Propagation delay will tend to increase with the size of the array.

The applications:
If the applications written for use on the reconfigurable device are written such that the application can be implemented on a device having only nearest-neighbor connectivity, then the interconnect can be greatly simplified. If such simplification is not possible then a general-purpose routing network (as described above) is normally used as the basis of the interconnect, the terminals of the network being the terminals of the processing elements.

To improve performance, a reconfigurable device may also include additional elements such as heterogeneous processing elements, a hierarchical routing network, and/or a heterogeneous interconnect. Heterogeneous processing elements are a combination of two or more different types of processing elements on one device, for example:

FPGAs with both lookup table based elements and dedicated multiplier blocks;

FPGAs with both lookup table based elements and product-term based logic; or

Processor arrays containing both integer and floating-point processors.

Combining processing elements may be done for a variety of reasons, for example to attempt to reduce the "functionality vs. cost" tradeoff problem—if a feature is added as an alternative type of block on a device, then it doesn't add to the cost of all processing elements, just those processing elements that contain the added feature. While superficially attractive this approach has one significant problem—determining what the ratio of different types of processing elements should be and how they should be arranged relative to each other. For example, whether there should be a fine grain mixing of element types: ABABAB . . . or coarser grain mixing: AAABBBAAABBB, such as in a row or column of an array. The mixing analysis becomes more significant as more different types of processing elements are incorporated into a reconfigurable device.

A hierarchical routing network scheme typically allocates processing elements into groups, with heavy connections within groups, and additional connections between groups (and between groups of groups, etc.). In extensions to this model the groups may overlap—the boundaries are not opaque walls with no connections other than inter-group connections. For instance, processing elements at group boundaries may be members of both groups.

With a heterogeneous interconnect scheme there are two or more types of connections available, for example an additional fast but limited interconnect added to complement a slower but more capable general-purpose routing network:

Dedicated wiring may be added to support common connection patterns, e.g. the "Carry wires" in many FPGAs.

There may be dedicated nearest-neighbor connections in addition to a general purpose routing network.

There is a significant difference between "heterogeneous" and "hierarchical" interconnects—hierarchical routing networks use the same type of connections for all levels of the hierarchy, but vary the reach of the connections from level to level, while heterogeneous interconnects use different types of connections for different networks. Note that an array may contain both heterogeneous and hierarchical interconnects.

Processors typically manage the flow of control within an application with a mixture of conditional and unconditional branches and jumps, and/or predicated execution of instructions. "Reconfigurable computing," defined herein as computing by constructing an application-specific datapath to perform a computation on a reconfigurable device, is not normally so good at managing the control flow.

In processor arrays, while the individual processors are good at managing their own instruction flow they have little or no influence on the other processors in the array.

In FPGA-based reconfigurable computing, every path through the program has to be implemented in the hardware, even those that are not used very often. Given that up to 90% of run-time operations for a processor may be specified in just 10% of the code, this can result in most of the FPGA silicon area being dedicated to infrequently used operations. In the above example, 90% of the area is only used 10% of the time, whereas the remaining 10% of the area is used 90% of the time.

In other devices designed for reconfigurable computing (such as RAA) an attempt is made to improve on the FPGA situation. RAA has arithmetic logic units ("ALUs") with instruction inputs so it is possible to dynamically change the functionality of the datapath by varying the instructions provided to the ALUs. However, this is not a perfect solution.

RAA ALUs process multi-bit words (e.g. 4-bit nibbles) rather than bits, and have a compact instruction encoding (again into 4 bits) to select the operation to perform on the input words. Control conditions, however, tend to be single bits expressing the true/false nature of the decision, for example:

Are the A and B inputs equal?
Is input A greater than input B?
Is bit 3 of an input set to 1?

Processing such single-bit conditions (in statements like "if condition1 or condition2 then . . . ) with n-bit ALUs makes inefficient use of the ALU datapath: (n−1) of the bits are unused.

This results in a situation where the 1-bit nature of FPGAs makes them good for processing conditions, but poor at branching based on the result of the condition, while multi-bit RAA-like devices are better at branching, but inefficient at processing the conditions.

A useful implementation technique for reconfigurable computing applications is to process data in a bit (or nibble, or some other fraction of the word or other full-width data item) serial form—a single processing element is used in consecutive clock cycles to process consecutive parts of a word. This technique allows area and throughput to be traded off against each other—serialized processing takes longer but uses a smaller number of processing elements.

The ability to transform data between serial and parallel formats is useful in serialized processing. One way of performing this transformation is by using circuits constructed from multiplexers and registers.

Multiplexers are also useful in a reconfigurable device to implement a number of common 1- and 2-input logic functions. These examples are written in terms of the C/java "conditional choice" operator: "a=(b?c:d);" being shorthand for "if (b) then {a=c;} else {a=d;}"

A & B=A?B:0
A|B=A?1:B
NOT A=A?0:1
A^B=A?(NOT B):B

As discussed above, a heterogeneous array provides a mix of processing elements optimized to handle different wordlengths. However conventional heterogeneous arrays suffer from the ratio determining problems discussed above. A useful solution to these problems is to design the first type of processing elements such that they are biased towards multi-bit processing but capable of 1-bit processing, and design the second type of processing elements such that they are biased towards 1-bit processing but capable of multi-bit processing.

BRIEF DESCRIPTION OF THE DRAWINGS

The accompanying drawings are included to provide a further understanding of embodiments of the invention and together with the Detailed Description, serve to explain the principles of the embodiments disclosed.

FIG. 1 depicts an arithmetic logic unit for use in an embodiment of the invention.

FIG. 2 depicts a multiplexer for use in an embodiment of the invention.

FIG. 3 depicts an example of an ALU and a multiplexer combined into a cluster, according to an embodiment of the invention.

FIG. 7 depicts a cluster with an output register connected to the multiplexer.

FIG. 8A depicts a register with enable configuration for a multiplexer with register.

FIG. 8B depicts a register with reset configuration for a multiplexer with register.

DETAILED DESCRIPTION OF THE PREFERRED EMBODIMENTS

Figure 4A:
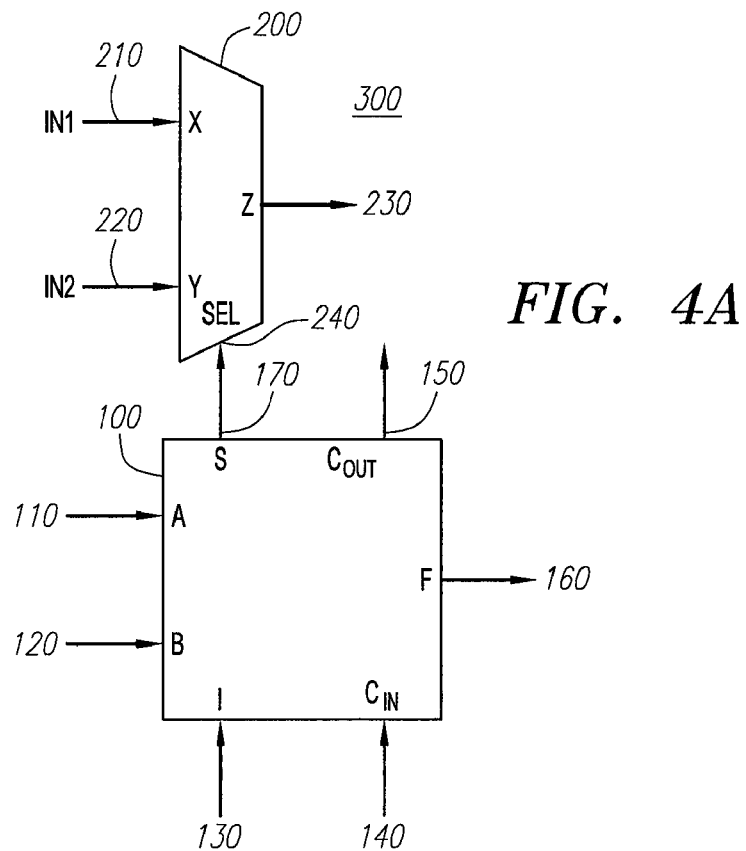
FIG. 4A depicts a cluster configured as a data selection circuit.

Various embodiments of the invention will now be disclosed. The arrays discussed in these embodiments are constructed using ALUs and multiplexers as first and second types of processing elements. Those skilled in the art will appreciate, however, that other processing elements can be used in place of the ALUs, the multiplexers, or both. For example, the array can be constructed using lookup table based elements, product-term based elements, hardwired elements such as dedicated multiplier blocks, floating-point processors, integer processors, or other elements capable of implementing a combinatorial logic function.

Several of the following embodiments include a special purpose routing network. A special purpose routing network is a network that has multiple inputs and multiple outputs, where every input can be connected to at least one output, and every output can be connected to at least one input. However, a special purpose routing network lacks one or both of 1) the ability to connect any arbitrary input to any arbitrary output (i.e. there is at least one input which cannot be connected to every output, or there is at least one output which cannot be connected to every input), or 2) the ability to make any arbitrary pair of connections A→B and C→D, for arbitrary inputs A, C and arbitrary outputs B, D, with B≠D.

The arrays of these embodiments are described in terms of a plurality of "clusters" of processing elements. A cluster includes a collection of processing elements, including at least one processing element of a first type and one processing element of a second type. The first type and second type processing elements within a cluster are connected to each other with direct intra-cluster connections, which may be wires, busses, or other forms of electrical connections. The intra-cluster connections may additionally or alternatively include a direct connect equivalent connection through a portion of a special-purpose routing network, such as an input selector or multiplexer which is part of the special-purpose routing network. A direct connect equivalent connection is a path which uses a portion of the special purpose routing network and does not use the general purpose routing network, between an arbitrary output of a first type processing element and an arbitrary input of a second type processing element, which path does not block any other physically and logically equivalent paths using any other equivalent portions of the special purpose routing network, between any other equivalent output of any other first type processing element and any other equivalent input of any other second type processing element. The intra-cluster connections are not part of any general-purpose routing network present on the array. There may, however, be a connection with the general-purpose routing network at a cluster boundary.

A cluster is defined as a set of processing elements that are connected directly or indirectly by the complete set of connections that directly connect non-identical elements. For embodiments with two types of processing elements, any of the processing elements within a cluster can be reached from any other processing element in the cluster by following the intra-cluster connections between first type and second type processing elements or vice versa, without regard to the direction that signals actually travel over the intra-cluster connections. For embodiments which have three or more types of processing elements, any path of intra-cluster connections connecting non-identical types of processing elements defines a cluster.

For example, where the first type of processing elements are ALUs and the second type of processing elements are multiplexers, the path ALU-MUX-ALU-MUX defines a cluster, but the path ALU-MUX-MUX does not, since there is a connection between two processing elements of the same type in the path. Similarly, for three processing element types A, B, C, a path A-B-C-A defines a cluster, but A-B-B-C-A does not, because of the B-B connection.

A cluster may also include connections between processing elements of the same type, as long as there exists a path between each pair of processing elements in the cluster using only connections that connect non-identical elements without passing through any processing elements of the same type as either of the pair of processing elements, as described above.

Figure 19:
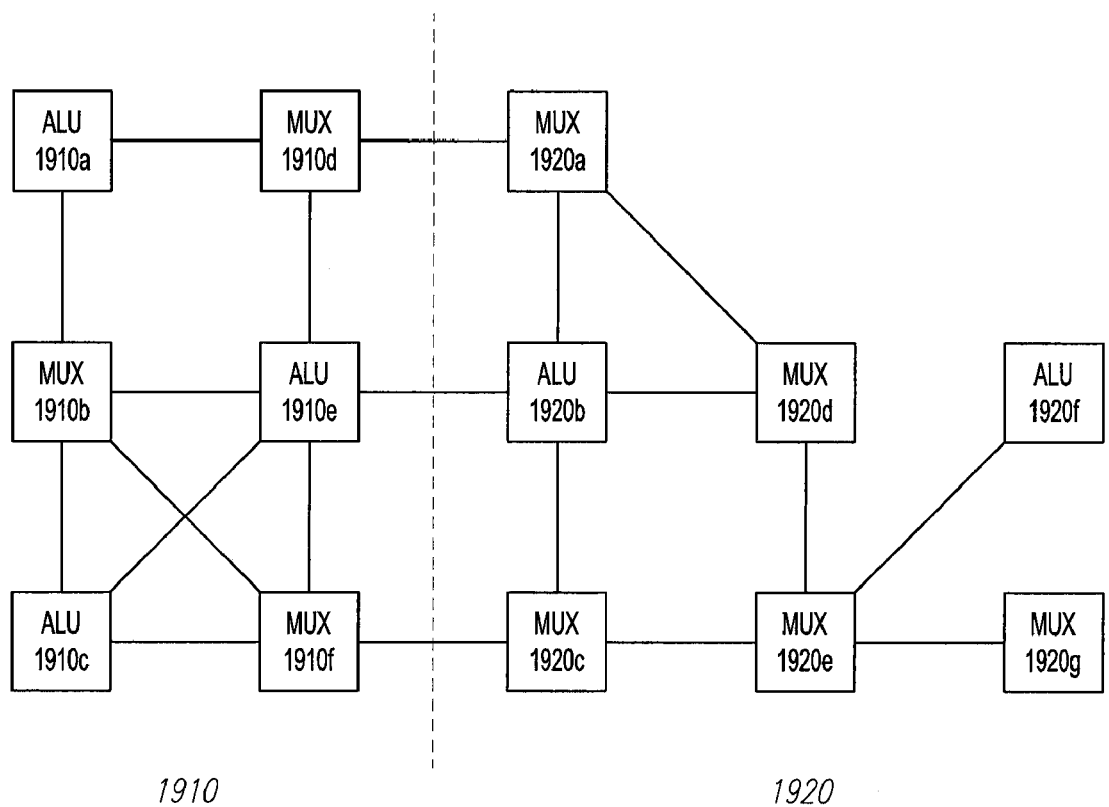
FIG. 19 depicts a collection of ALUs and multiplexers arranged into clusters.

FIG. 19 depicts an example of clusters. The processing elements are designated by the "ALU" and "MUX" elements, and the connections are designated by the lines connecting elements. The first cluster 1910 includes all of the processing elements 1910(a)-(f), on the left side of the dashed line. The second cluster 1920 includes all of the processing elements 1920(a)-(g), on the right side of the dashed line. Each processing element 1910(a)-(f) can be reached from each other processing element 1910(a)-(f) by following a series of ALU-MUX or MUX-ALU connections. Similarly, each processing element 1920(a)-(g) can be reached from each other processing element 1920(a)-(g) by following a series of ALU-MUX or MUX-ALU connections. No processing element 1910(a)-(g) can be reached from a processing element 1920(a)-(g) by following ALU-MUX or MUX-ALU connections. At least one ALU-ALU or MUX-MUX connection must be followed. Therefore, the processing elements 1910(a)-(f) are not members of the second cluster 1920, and the processing elements 1920(a)-(g) are not members of the first cluster 1910.

An "ALU" is a processing element which is configurable to implement various mathematic and logic functions, depending on an instruction value. The ALU receives one or more data inputs, and applies the function selected by the instruction value to the data inputs, generating a data output. The ALU may also receive a carry-in value from another processing element, and depending on the data and instruction values received, may provide a carry-out output value to another processing element.

A "multiplexer" is a processing element which receives two or more data input values and provides one of the data input values to a data output, based on a select input value.

Turning to FIG. 1, an ALU 100 for use in a reconfigurable array includes a first data input 110, a second data input 120, and an instruction input 130. The data and instruction inputs may receive input values from other elements within the array, or from elements connected to the array. The data input values may come from sources such as program memory, or from outputs of other processing elements, or from any other source of data signals. The instruction input values may come from sources such as configuration memory or some other source of configuration data, or they may be provided by data signals from other processing elements. The data and instruction inputs may receive input values of a first bit width. Alternatively, the instruction inputs may be of a different bit width, depending on the source of the instruction inputs. For example, if the instruction inputs are provided by a configuration memory which is not connected to the first bit width general purpose routing network, then the instruction inputs need not be of the first bit width.

The ALU 100 also includes a carry-in input 140 ("Cin"), which is of a second bit width. This input is used to receive a carry input from another ALU 100 in the array.

The ALU 100 also includes a carry-out output 150 ("Cout"), which is also of the second bit width. The carry-out output 150 provides a carry output to other elements within the array or to other elements connected to the array. Depending on the configuration of the ALU 100, the carry-in input 140 and the carry-out output 150 can provide values other than carry values, as desired by the designer.

The ALU 100 also includes a data output 160, of the first bit width. The data output 160 provides the result of the mathematic or logical function performed by the ALU to other elements within the array, or to other elements connected to the array.

The ALU 100 also includes a select signal output 170, of the second bit width. The select signal output 170 provides a select signal to other elements within the array or to other elements connected to the array. The select signal may be any of a wide variety of signals useful to control the functioning of another element within the array or connected to the array. For example, the select signal may be one or more of the following data-dependent signals:

Cout: The carry out from an ALU operation,
Sign: The correct sign of an ALU operation (even in the event of an arithmetic overflow),
Overflow: A signal indicating that there has been an arithmetic overflow.

Alternatively, it could be one or more of the bits of the instruction input 130. This allows for both data-dependent and instruction dependent signals to be provided. In some embodiments, the ALU 100 is adapted to store an internal instruction independent of the instruction input 130. This allows the instruction input 130 to be used as a dedicated select signal input, by providing part or all of the instruction input 130 directly to the select signal output 170, while using the stored instruction value to control the ALU 100. The select signal output 170 may also include additional circuitry to select various signals routed from the ALU 100, as discussed in further detail below.

Turning to FIG. 2, a multiplexer 200 for use in the reconfigurable array includes a first input 210 and a second input 220, both of the first bit width. The inputs 210, 220 receive input values from other elements within the array, or from elements connected to the array.

The multiplexer 200 also includes an output 230, of the first bit width. The output 230 provides the results of the input selection performed by the multiplexer 200 to other elements within the array, or to elements connected to the array.

The multiplexer 200 also includes a select input 240. The select input 240 receives a selection value that indicates which of the inputs 210, 220 is to be directed to the output 230. The select input 240 is of the second bit width. In this embodiment, a selection value of "1" results in the first input 210 being directed to the output 230, and a selection value of "0" results in the second input 220 being directed to the output 230.

In this embodiment, the first bit width is word-wide, being four bits wide and the second bit width is one bit wide. In other embodiments, the first bit width and second bit width can be any size, as desired by the particular implementation contemplated by the designer. The inputs and outputs of the first bit width are preferably connected to a first general-purpose routing network, useful to route signals across the various elements of the array. The inputs and outputs of the second bit width are preferably connected either directly to another processing element or else connected to a second general purpose routing network or a special-purpose routing network adapted to carry signals of the second bit width. In these cases, the second bit width signals bypass the first general-purpose routing network. Alternatively, the second bit width signals are routed across the first general-purpose routing network, along with the first bit width signals. The various inputs and outputs can be connected using various wires, busses, or other electrically conductive devices or current paths.

Turning to FIG. 3, a cluster 300 includes an ALU 100 and a multiplexer 200. The select output 170 of the ALU 100 provides a select signal to the select input 240 of the multiplexer 200. As discussed above, the multiplexer 200 can be controlled by either a data-dependent or an instruction-dependent signal. In terms of their usefulness in an application, these two cases are broadly equivalent to conditional and unconditional branching in a processor.

Additional multiplexers can be added to the cluster 300, as desired by the designer. These additional multiplexers may be controlled by the same select signal as controls the multiplexer 200, or they may be controlled by different select signals. The cluster 300 may also be extended by the addition of other elements, such as additional ALUs, registers, gates, etc., attached to the various inputs and outputs of the elements within the cluster 300. A cluster 300 may also be connected to other clusters, to implement more complex circuits. Various examples of such extensions are discussed in more detail below.

Figure 4B:
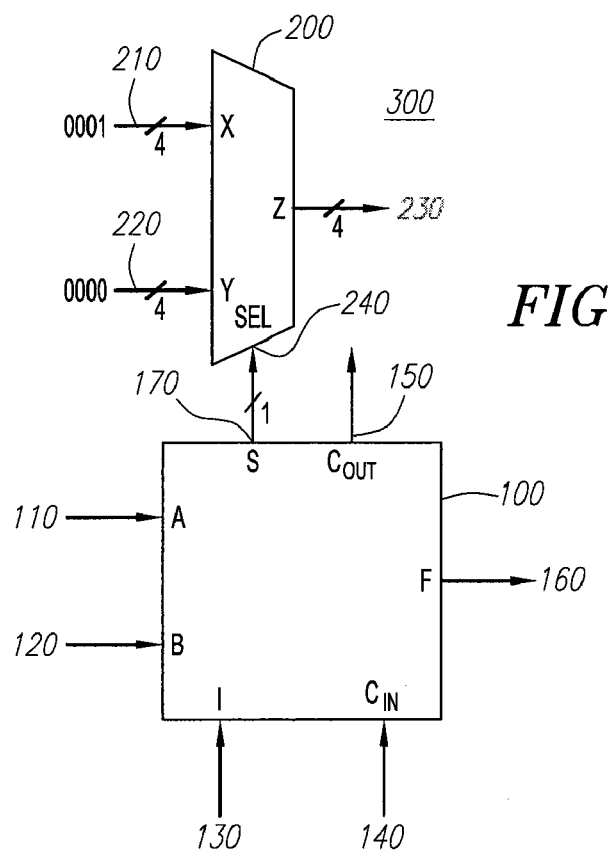
FIG. 4B depicts a cluster configured as a data propagation circuit.
Figure 5:
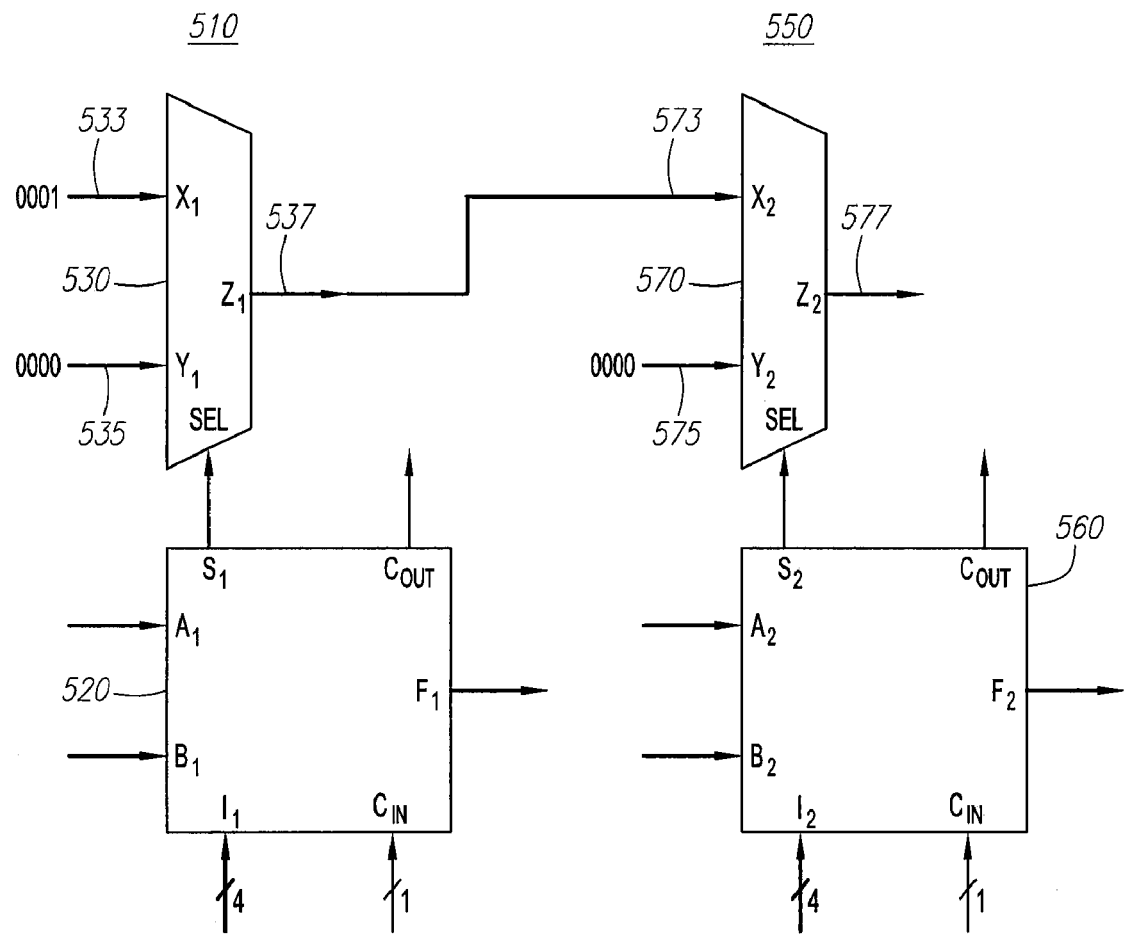
FIG. 5 depicts two clusters configured as a condition processing circuit.
Figure 6:
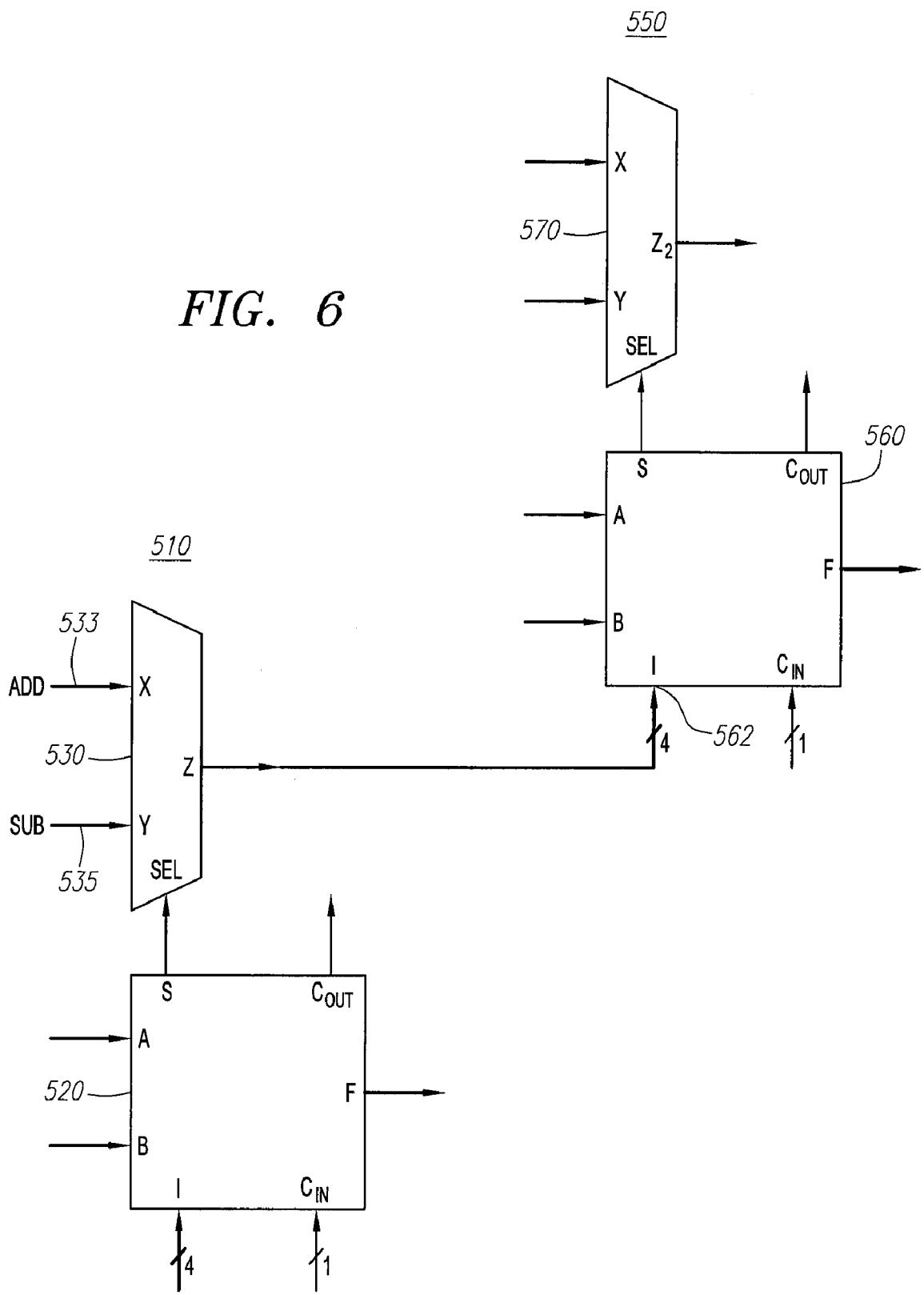
FIG. 6 depicts two clusters configured as a datapath control circuit.

The cluster 300 can be used alone or in combination with other clusters 300 to implement a wide variety of circuits, examples of which are provided in FIGS. 4-6. Turning to FIG. 4A, a cluster 300 is used to implement a data selection circuit. The data selection circuit selects either "in1" or "in2" depending on the result of the condition provided on the select signal output 170. For example, if the select signal output 170 is configured to provide an overflow signal, then the data selection circuit will select "in1" if there is an overflow (S=1), and "in2" if there is no overflow (S=0).

This circuit is useful in formatting data, for example by performing sign extension when the word length is changed. The first input 110 carries a signed 4-bit value A, to be converted to an 8-bit value. The multiplexer inputs 210, 220 carry the values "1111" and "0000" respectively. The ALU 100 evaluates the function A<0, to generate the proper sign signal in the select output 170 and to propagate the input value A to the ALU output 160. The sign output signal is used to switch the multiplexer 200 to select either "1111 " or "0000". The 8-bit result is constructed from the value on the ALU output 160, and the value on the multiplexer output 230.

Turning to FIG. 4B, the cluster 300 can also be configured to propagate a second bit width signal generated by the ALU 100 onto the first bit width general-purpose routing network. The second bit width select signal generated on the select output 170 of the ALU 100 is routed to the select input 240 of the multiplexer 200. The first input 210 is provided with a value "0001", which is a first bit width representation of the second bit width value "1". The second input 220 is provided with a value "0000", which is a first bit width representation of the second bit width value "0". When the select signal is "1", the multiplexer 200 causes the first input value 210 of "0001" to be routed to the output 230, and from there onwards to the general-purpose routing network. Similarly, when the select signal is "0", the multiplexer 200 causes the second input value 220 of "0000" to be routed to the output 230, and from there onwards to the first general-purpose routing network. Thus the select signals such as sign, overflow, carry out, etc, are efficiently converted from the second bit width to the first bit width and placed on the first general-purpose routing network, where they can be sent onwards to other processing elements. This provides an alternate path for these signals, in addition to the dedicated connections and second general purpose routing network discussed above.

Turning to FIG. 5, a first cluster 510 and a second cluster 550 are used to implement a condition processing circuit. The condition processing circuit performs a logical operation on one or more conditions provided as select output values of the ALUs. The first cluster 510 includes a first ALU 520 which generates a first condition (e.g. "sign" of the output value F1), and passes the first condition to a first multiplexer 530. The first multiplexer 530 receives a constant value of "0001" on the first input 533, and a constant value of "0000" on the second input 535. If the first condition is "1", then the first multiplexer 530 selects the first input 533 to provide to the output 537, otherwise the first multiplexer 530 selects the second input 535 to provide to the output 537.

The second cluster 550 includes a second ALU 560 which generates a second condition (e.g. "sign" of the output value F2), and passes the second condition to a second multiplexer 570. The second multiplexer receives the value from the output 537 on the first input 573, and a constant value of "0000" on the second input 575. If the second condition is "1", then the second multiplexer 570 selects the first input 573 to provide to the output 577, otherwise the second multiplexer 570 selects the second input 575 to provide to the output 577.

The outputs of this circuit, expressed as a function of the first condition and the second condition, is shown in Table 1 below:

TABLE 1

| $S_1$ | $Z_1 = X_2$ | $S_2$ | Output |
|---|---|---|---|
| 0 | 0000 | 0 | 0000 |
| 0 | 0000 | 1 | $X_2 = 0000$ |
| 1 | 0001 | 0 | 0000 |
| 1 | 0001 | 1 | $X_2 = 0001$ |

As can be seen from Table 1, the condition processing circuit of FIG. 5 produces as an output the logical AND of the two conditions S1 and S2. Other logic functions can be similarly generated.

Turning to FIG. 6, the first cluster 510 and the second cluster 550 are configured to implement a datapath control circuit. The first ALU 520 generates a select signal as discussed above and sends the select signal to the first multiplexer 530. The first multiplexer 530 receives a data input signal corresponding to an addition ("ADD") instruction value on the first input 533, and a data input signal corresponding to a subtraction ("SUB") instruction value on the second input 535. These data inputs will typically be multi-bit signals, as discussed above. Based on the value of the select signal, the first multiplexer 530 routes either the ADD or the SUB instruction value to the instruction input 562 of the second ALU 560. The output of the second ALU 560 is therefore either A+B or A−B, depending on the condition generated by the first ALU 520. Thus, a datapath within the array containing the first and second clusters 510, 550 is controlled by altering the function performed by the second ALU 560. Any desired datapath control function can be implemented by varying the data and instruction inputs to the first ALU 520 and first multiplexer 530.

Turning to FIGS. 7-8, an output register can be added to the cluster 300 to create additional useful circuits. These circuits are useful for performing data formatting for serial-to-parallel and parallel-to-serial conversion of data. The circuit of FIG. 7 includes the ALU 100 and multiplexer 200 as discussed above. Additionally, there is a register 700 attached to the output 230 of the multiplexer 200. The register 700 stores a value loaded in from the output 230 of the multiplexer 200. A switch 710 is adapted to route either the multiplexer output 230 or the register output 720 onwards to other elements. The switch 710 is set as part of the configuration of the application onto the array. In an alternate embodiment, there is a second register connected to the output 160 of the ALU 100, either with or without a corresponding switch.

FIGS. 8A and 8B show implementations of useful register circuits that can be implemented using the cluster 300. FIG. 8A is an implementation of a "register with enable" circuit, and FIG. 8B is an implementation of a "register with reset" circuit. The "register with enable" circuit of FIG. 8A provides a register where the register contents only update (with the "input" value) when "enable" is active on a clock edge, otherwise the stored value is recycled and the output is unchanged. The "register with reset" circuit of FIG. 8B provides the value "input" to the register as long as the reset signal is inactive. When the reset signal goes active, then a zero value is loaded into the register on the next clock edge. Both of these register options are commonly used in applications, and thus these circuits are useful in implementing applications on a reconfigurable array and can be easily constructed with the "multiplexer and register" arrangement of FIG. 7.

Many of the possible uses of multiplexers involve having a constant value on one or both of the inputs to the multiplexer, e.g.:

implementing an AND, OR or NOT gate,
  Propagating a carry out value to the first general purpose routing network, or
  Implementing a resettable register.

Figure 9:
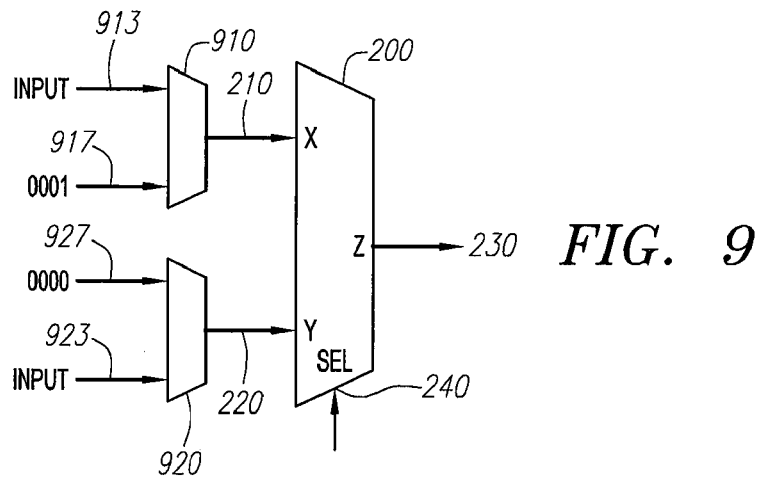
FIG. 9 depicts a multiplexer with additional input selection logic.

These uses are facilitated by adding input selection logic to the inputs of the multiplexer 200. The input selection logic is a trade-off which increases the size of the multiplexers but reduces the number of signals that are propagated through the routing networks. The multiplexer 200, as shown in FIG. 9, has a first input multiplexer 910 and a second input multiplexer 920 attached to the first input 210 and second input 220 respectively. The first input multiplexer 910 is adapted to provide either a first input value 913 or a first constant value 917 (here the value "0001") to the first input 210. The second input multiplexer 920 is adapted to provide either a second input value 923 or a second constant value 927 (here the value "0000") to the second input 220. The input multiplexers 910, 920 are not intended to be controlled dynamically by the application. The control signals for the input multiplexers 910, 920 are set when the application is loaded into the array, and do not vary thereafter. In an alternate embodiment where a higher level of control over the array is desired, the input multiplexers 910, 920 are dynamically controllable.

The input multiplexers 910, 920 may be extended to include other signals, either constant or variable. For example, turning to FIG. 10, the second input multiplexer 920 is extended by adding the feedback signal as an input to the second input multiplexer 920. Thus the second input multiplexer 920 can be configured to form a feedback path 1010 to the second input 220, in order to implement the "register with enable" circuit of FIG. 8A. Similarly, turning to FIG. 11, the first input multiplexer 910 is extended by providing the carry out signal from the carry out output 150 of the ALU 100 to the first input multiplexer 910. If the inputs to the first input multiplexer 910 are wider than the carry out output 150, then the carry out signal is padded with leading zeros. Thus for example a carry out signal of "1" is padded to "0001" when provided to the first input multiplexer 910. Thus, when properly configured, the first input multiplexer 910 provides the carry out output 150 to the multiplexer 200, via the first input 210. This provides another route to provide the carry out signal to the first general-purpose routing network. Although the carry out signal is already available to the multiplexer 200 via the select input 170, and thus can be propagated to the first general-purpose routing network that way, this modification makes it possible to create a carry register with enable (or reset by modifying the circuit of FIG. 8B) in one multiplexer 200 and one register 700 (not taking into consideration any input multiplexers that may be present). A resettable carry output register is useful in serial arithmetic applications.

Figure 11:
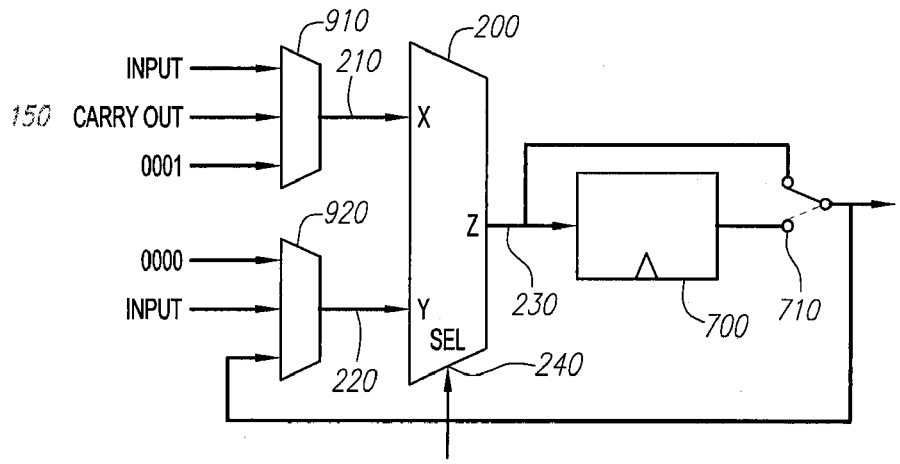
FIG. 11 depicts a multiplexer configured to provide an alternate route for a carry-out signal.
Figure 12:
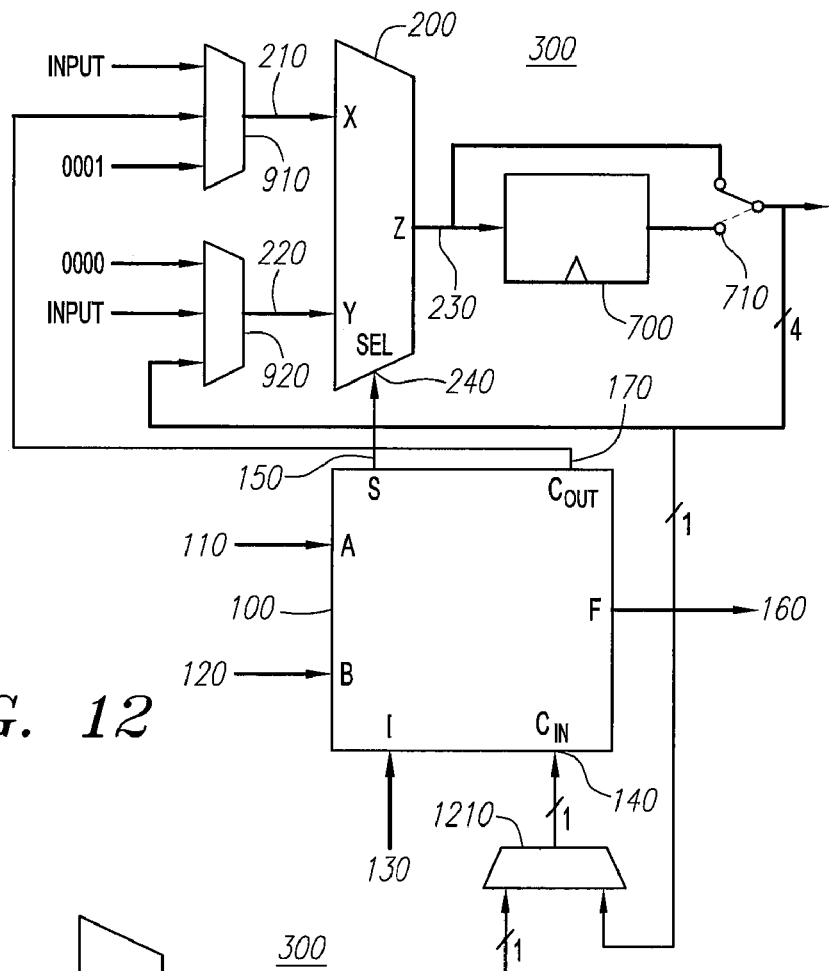
FIG. 12 depicts a cluster with additional elements to implement a registered path from the carry out output to the carry-in input of the ALU.

Turning to FIG. 12, a further useful modification of the circuit of FIG. 11 is to allow one of the bits of the register 700 or multiplexer 200 output to be used as a dedicated carry input to the ALU. A bit from the 4-bit output 230 of the multiplexer 200 is routed to an input multiplexer 1210 connected to the carry-in input 140 of the ALU 100. This creates a registered path from the carry out output 150 to the carry-in input 140. Such a path is useful when creating serialized arithmetic circuits, especially when combined with the ability to reset the register 700 as discussed above.

Figure 10:
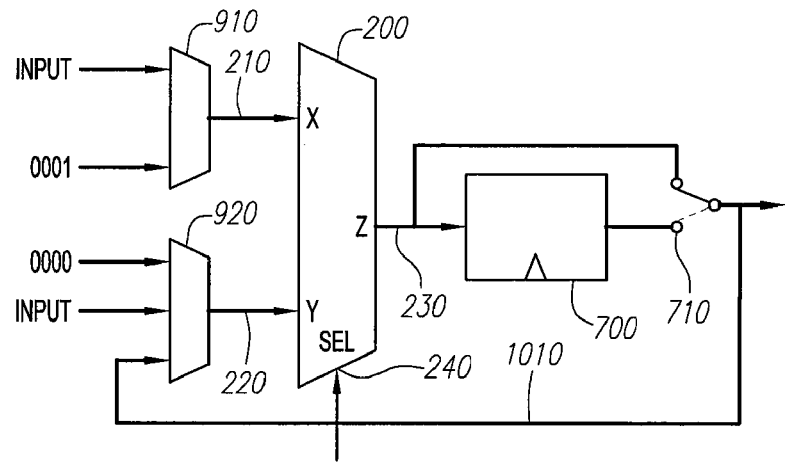
FIG. 10 depicts a multiplexer with input selection logic configured as a feedback circuit.

FIGS. 10-12 show the feedback path to the second input multiplexer 920 being connected to the output of the switch 710. Alternatively, the feedback path could be connected to the output of the register 700, before the switch 710. However, making the connection after the switch 710 makes it possible to choose the unregistered path, and thereby construct an asynchronous latch.

Figure 13:
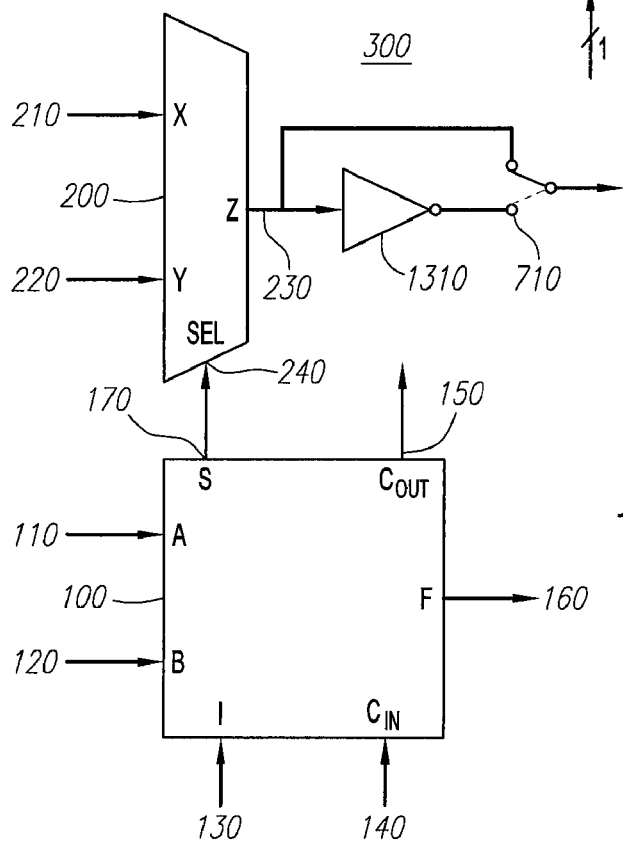
FIG. 13 depicts a cluster with an inverter connected to the multiplexer output.

Turning to FIG. 13, yet another extension of the basic circuit of the cluster 300 is shown. By adding an inverter 1310 to the output 230 of the multiplexer 200, the range of functions generatable by the multiplexer 200 is increased. It is possible for the multiplexer 200 to provide NAND and NOR gates:

NAND(A, B)=NOT(A?B:0)
  NOR(A, B)=NOT (A?1:B).

Additionally, this provides an alternative way to implement output inversion:

NOT A=A?0:1—this form doesn't use an inverter
  NOT A=NOT(1?A:0)—this form uses an inverter.

The latter option connects the A signal to a data input 210, 220 of the multiplexer 200 rather than to the select input 240. This may be preferable if there are different routing delays to the data inputs 210, 220 and the select input 240.

Additionally, an alternate way to do functions with one input inverted is provided:

$A$ & (NOT $B$) = $B$?0:$A$ – this form does not use an inverter $A$ & (NOT $B$) = NOT((NOT $A$) OR $B$)

= NOT($A$?$B$:1).

Again, this provides increased flexibility as to which multiplexer inputs to use to implement the function.

The circuits discussed above are merely examples of the wide variety of circuits that can be implemented using the clusters 300 of an embodiment of the invention.

Heterogeneous arrays including the clusters 300 discussed above are able to implement many circuits smaller and faster than homogeneous arrays purely of ALUs. Multiplexers are significantly smaller and faster than ALUs, and therefore circuits that can make use of multiplexers are smaller and faster than equivalent circuits made up purely of ALUs. Operations such as condition processing, data formatting and instruction selection are all implemented more efficiently with a mix of multiplexers and ALUs than they would be with ALUs alone.

Speed is further improved by use of an array with a heterogeneous interconnect. A first general-purpose routing network is provided for routing of data and instructions amongst the elements of the array, and additional interconnect provides a multiplexer control network for routing of select signals between ALUs and multiplexers. This multiplexer control network may be a simple direct connection between an ALU and one or more associated multiplexers within a cluster, or it may be a more complex control network adapted to connect an ALU select output to multiplexers within the same cluster, within other clusters, or both. This control network may take the form of a second general-purpose routing network, separate from the first and optimized for carrying multiplexer control signals rather than data and instructions. This control network may alternatively take the form of a special-purpose routing network, as discussed in detail below.

The different networks used on a reconfigurable device may be distinguished from each other in a variety of ways. For example, two different networks A and B are considered distinct if:

communication is not possible from A to B and from B to A without passing through a processing element; or A and B have different bit widths; or or one of A or B is a general purpose network, and the other is a special purpose network.

The heterogeneous array of an embodiment significantly reduces problems in determining the proper mixture of element types. Multiplexers are useful to implement a wide variety of application logic components, such as bit-level logic, data reformatting, and dynamic instruction selection. Therefore, most applications that a designer might wish to implement on the heterogeneous array will be able to use multiplexers to some degree.

Multiplexers, however, are not the only way to implement the functions for which they are useful. An ALU can be used to implement any functions that a multiplexer can do. The multiplexer is just usually a more efficient implementation. Therefore, an application can be divided into three types of logic components:

1. That logic which is preferably implemented in ALUs,
2. That logic which is preferably implemented in multiplexers,
3. That logic for which there is a choice of implementation.

Any or all of these categories may have subcategories, indicating a relative level of preference within the category. These subcategories are used to fine-tune the allocation of logic components to processing elements, depending on the specific mix of processing elements provided in the array and the various amounts of logic components in each category.

Figure 14:
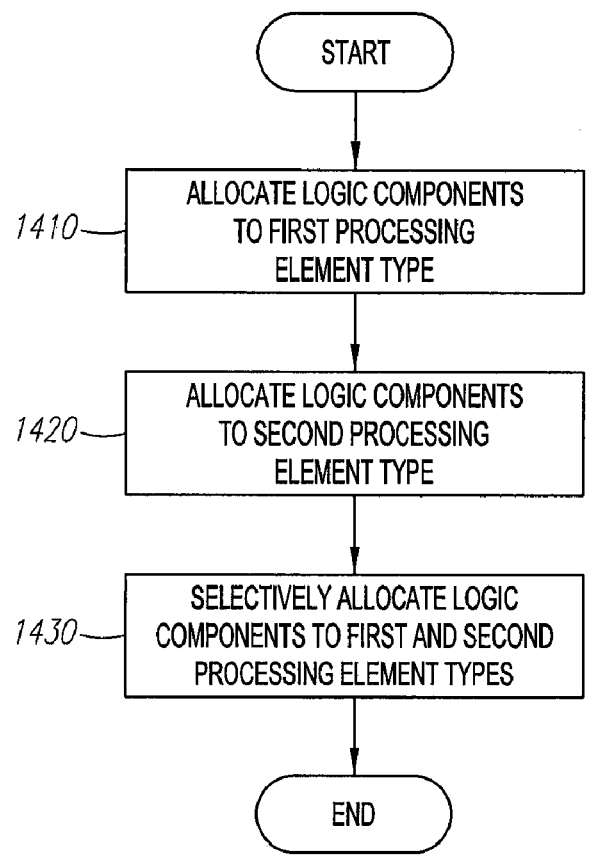
FIG. 14 is a flowchart of a method for assigning application logic components to processing elements.

The existence of the third category means that it is not necessary to find the "perfect" ALU-to-multiplexer ratio that guarantees there are always enough multiplexers (or ALUs) for all applications. Instead, when deciding how to allocate logic components amongst the processing elements, the method of FIG. 14 is used. At step 1410, the logic components which are preferably implemented in the first processing element type are identified and allocated to processing elements of the first type. If there are sub-categories indicative of a relative preference within the category, then the components with the strongest preference are allocated first.

At step 1420, the components which are preferably implemented in the second processing element type are identified and allocated to processing elements of the second type. If there are sub-categories indicative of a relative preference within the category, then the components with the strongest preference are allocated first.

At step 1430 the remaining logic components are allocated between the remaining processing elements of the first and second types according to a heuristic. For example, the remaining logic components are allocated to the second type elements until there are no more second type elements remaining, and then allocated to the first type elements. Alternatively, the remaining elements are split by their sub-category, with those logic components having a relative preference for the second type going to the second type and those logic components having a relative preference for the first type going to the first type.

Select Signal Output

Figure 15:
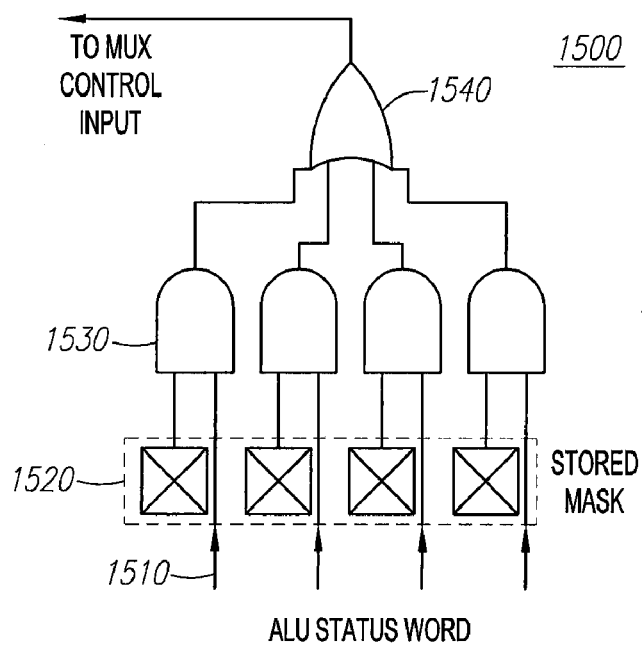
FIG. 15 depicts a circuit for generating and selecting a multiplexer control signal.

As discussed above, the select signal output 170 of the ALU 100 (shown in FIG. 1) can comprise any of a variety of different signals. Turning to FIG. 15, an example of a selection circuit 1500 for generating and selecting a control signal used to control the multiplexer 200 will now be discussed in more detail. The selection circuit 1500 includes a plurality of status inputs 1510 adapted to receive status bits from the ALU 100, together referred to as an ALU status word (ASW). Each of the status inputs 1510 carries a bit indicating a particular status signal, such as Sign, Overflow, Carry-Out, or a bit from the instruction input 130, or any other data useful for controlling the multiplexer 200.

The selection circuit 1500 also includes a plurality of mask inputs 1520, together referred to as a mask word. The mask inputs 1520 are adapted to receive mask values, which are used to mask out one or more of the status bits of the ALU status word. The mask inputs 1520 may receive their mask values from a wide variety of sources. For example. the mask inputs 1520 may be connected to the first general-purpose routing network, and thereby receive mask values dynamically from other processing elements in the array. Alternatively, the mask inputs 1520 may be connected to local memory cells which store mask values, including mask values loaded into the array when it is configured for a particular application.

The status inputs 1510 and the mask inputs 1520 are connected to a plurality of AND gates 1530, which are adapted to perform a bitwise AND on the inputs 1510, 1520. The AND gates 1530 are all connected to an OR gate 1540, which combines the AND'ed values together to form a single bit output provided to the select input 240 of the multiplexer 200, to control the multiplexer 200.

Setting the mask word to all 0's means that the multiplexer control signal sent to the select input 240 will be zero, i.e. the multiplexer 200 will be fixed to always supply the value on the second input 220 to the output 230. If one of the bits of the ASW is a constant 1, then selecting this bit with the mask word means that the control signal will be 1, i.e. the multiplexer 200 will be fixed to always supply the value on the first input 210 to the output 230. In combination with the all 0's case, this provides the ability to set the multiplexer control signal to either constant 0 or constant 1.

Figure 16:
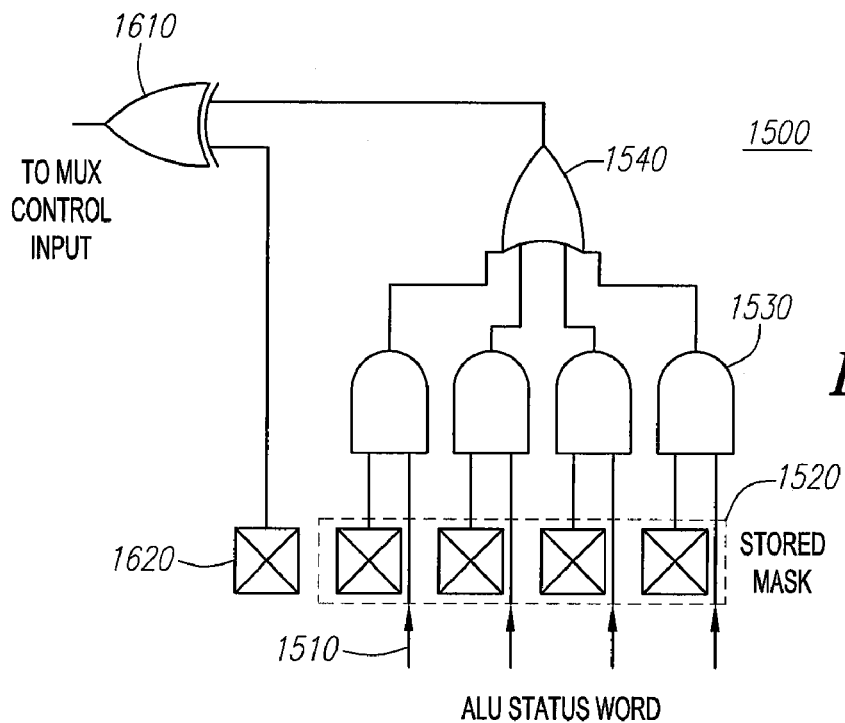
FIG. 16 depicts a circuit for selectively inverting a multiplexer control signal.

An alternative way to allow for both constant 0 and constant 1 is to extend the selection circuit 1500 as shown in FIG. 16. The selection circuit 1500 is extended by placing an XOR gate 1610 on the output of the OR gate 1540, so that the output of the OR gate can be inverted. The other input to the XOR gate 1610 is tied to a data source 1620 which is loaded with a value during configuration of the array. If the value is "1", then the XOR gate 1610 operates as an inverter, inverting the output value from the OR gate 1540. If the value is "0", then the XOR gate 1610 propagates the output of the OR gate 1540. Thus, the XOR gate 1610 function s as an "inverter with enable." This behavior is shown in Table 2:

TABLE 2

| data source value | OR output | XOR Result |
|---|---|---|
| 0 | 0 | 0 |
| 0 | 1 | 1 |
| 1 | 0 | 1 |
| 1 | 1 | 0 |

Thus, if a constant 0 is desired to be sent to the select input 240, the mask word is set to all 0's, and the data source value is set to 0. If a constant 1 is desired to be sent to the select input 240, the mask word is set to all 0's, and the data source value is set to 1. This alternative also allows the output of the OR gate 1540 to be inverted for all values of the mask word.

This means that the polarity of control to the multiplexer 200 can be varied. With the inverter activated, the second input 220 would be selected instead of the first input 210 by a "1" output from the OR gate 1540, and the first input 210 would be selected instead of the second input 220 by a "0" output from the OR gate 1540. This is useful when the multiplexer 200 has asymmetrical connections to the inputs 210, 220 of the multiplexer 200. An example of this is where a feedback path from a register output only connects to one of the inputs 210, 220, or where a dedicated constant input is only available on one of the inputs 210, 220.

Possible Contents of ALU Status Word

The ASW can include, for example, bits representing any or all of the following values:
ALU carry in,
ALU carry out,
ALU "overflow" (using the 2s complement definition of overflow),
ALU "correct sign" (again, following the 2s complement definition),
One or more bits taken directly from an ALU data input 110, 120, or
One or more bits taken directly from the ALU instruction input 130

In one example RAA design, the ALU instruction value can be stored in a register within the ALU, in which case the instruction input 130 is available for use as a dedicated multiplexer control input. This means that the instruction input 130 can be used to cover both the "bits from an instruction input" and the "bits from a data input" in the above list. Consequently, a useful subset of this list includes: carry out, correct sign and 2 bits from the ALU instruction input 130.

This subset means that the multiplexer control signal can be, for example, one of the following:
The result of an unsigned comparison (less than, greater than), via carry out,
The result of a signed comparison (less than, greater than), via the sign signal,
The sign of a signed arithmetic operation, to be used for sign extension (again via sign signal),
An overflow from an unsigned arithmetic operation (again via carry out),
The result of an equality test (for ALU designs that report equality test results via carry out), or
A bit derived from the instruction input 130, with a choice of 2 instruction bits. (Also covers the "bits from a data input" option).

This subset therefore covers some of the commonly tested conditions in applications. Signed arithmetic overflow, which is uncommon in RAA applications (since RAA commonly uses a different approach to wordlength management as discussed in detail below), can be synthesized from the correct sign and the MSB of the arithmetic result.

Possible Choices of Instruction Bits

Among the choices for which bits of the instruction input 130 should be available in the ASW are the following examples:

1. Instruction LSB and MSB.

The LSB is the bit used to propagate carries across the routing network, as it means that carry values have the correct numeric value (1 if there is a carry, 0 if there is not). Being able to connect a carry via the instruction input 130 means that the multiplexer 200 can be controlled by carry from its local ALU 100 and also (indirectly) by carry from any other ALU 100 in the array.

The MSB is selected for a similar reason—it is the sign bit in a word, so being able to choose it gives flexibility over the choice of sign data.

2. Instruction LSB and instruction bit n/2 (i.e. bit 2 in a 4-bit word, 3 in a 6-bit word . . . )

The LSB is selected for the same reasons as choice #1 above.

Choosing a bit in the middle of a word facilitates extracting all the bits from a word individually using the instruction inputs 130 of multiple ALUs 100 together with a series of shifts or rotates. The iterative sequence:
Extract bit 0 and n/2
Rotate 1 place left
Extract bit 0 and n/2 (equivalent to bits n-1 and n/2-1)
Rotate 1 place left
Extract bit 0 and n/2 (equivalent to bits n-2 and n/2-2)
Rotate 1 place left
etc.
gives an efficient, regular method to extract all n bits with n/2 rotates. For this to work the bits used have to be spaced evenly within the instruction word, and since bit 0 is useful for other reasons the other bit will be half a word up from bit 0.

An alternative useful subset for the ASW is a 5-bit word including the 4 bits of the instruction input 130, plus the ALU carry output 150. This subset has the following advantages:

1. Carry out provides unsigned comparison and overflow as described above.

2. Having all bits of the instruction input 130 available makes it possible to control a multiplexer 200 with an arbitrary bit taken from a word. This makes it relatively straightforward to construct arbitrary functions of the bits within a word (especially when combined with the use of multiplexers 200 to construct logic gates, as described above).

The ability to extract any bit from a word also makes it easy to perform sign extension, and therefore to guarantee that signed overflow will not occur.

State Encoding

The use of an n-bit mask to choose which bits of the ALU status word are to be connected to the select input 240 implies that there are $2^n$ possible combinations that may be used. In practice some combinations are much less common than others, and some are never used.

Taking the 4-bit ASW example outlined above, there are 16 possible combinations, as outlined in Table 3 below. The first four columns show the mask values, and the fifth column shows the resulting output function sent to the select input 240.

TABLE 3

| Carry | Sign | Instr_LSB | Instr_MSB | Multiplexer control function |
|---|---|---|---|---|
| 0 | 0 | 0 | 0 | Constant |
| 0 | 0 | 0 | 1 | Instr_MSB |
| 0 | 0 | 1 | 0 | Instr_LSB |
| 0 | 0 | 1 | 1 | Instr_LSB OR Instr_MSB |
| 0 | 1 | 0 | 0 | Sign |
| 0 | 1 | 0 | 1 | Sign OR Instr_MSB |
| 0 | 1 | 1 | 0 | Sign OR Instr_LSB |
| 0 | 1 | 1 | 1 | Sign OR Instr_LSB OR Instr_MSB |
| 1 | 0 | 0 | 0 | Carry |
| 1 | 0 | 0 | 1 | Carry OR Instr_MSB |
| 1 | 0 | 1 | 0 | Carry OR Instr_LSB |
| 1 | 0 | 1 | 1 | Carry OR Instr_LSB OR Instr_MSB |
| 1 | 1 | 0 | 0 | Carry OR Sign |
| 1 | 1 | 0 | 1 | Carry OR Sign OR Instr_MSB |
| 1 | 1 | 1 | 0 | Carry OR Sign OR Instr_LSB |
| 1 | 1 | 1 | 1 | Carry OR Sign OR Instr_LSB OR Instr_MSB |

The lines with both instruction bits used are very uncommon, and the lines with both Carry and Sign used never occur in practice. Carry OR Sign is not a control function that occurs in normal applications (because Sign already includes an XOR with Carry). Furthermore, the use of the two instruction bits is not equally likely—the LSB is more commonly used than the MSB, especially in the combinations of instruction and Carry or Sign.

It would therefore be possible to identify a "commonly used" subset of this table which could be encoded in fewer bits, with a more complex logic circuit to combine mask and ASW. For example, the 8 more common states in the table could be encoded in 3 bits. However, the required decoding would be significantly more complex. An alternative is to retain the 4-bit encoding for ease of decoding the common states, and use the uncommon states to encode alternative useful functions, an example of which is described below.

High-Fanout Control Signals

Many applications contain a small number of control signals that are widely used throughout the application. For example:

"Global Reset,"
"Global enable," or
Pipeline stall/enable.

These signals commonly connect to registers, either to their reset or enable inputs, and are therefore the kind of signals that would be expected to connect to the multiplexer select inputs 240 of the multiplexers 200 in an RAA.

These signals are also poorly supported by the general-purpose routing networks in conventional reconfigurable devices. These networks are normally optimized to handle the routing patterns typical of data flow in the applications, which typically have fanouts much lower than those of these global control signals. "Fanout" is the number of inputs of other processing elements that a given output drives. The mean fanout in a reconfigurable device constructed from n-input processing elements is <=n. (Since all inputs are driven either by outputs or by constants). For FPGAs and RAAs n is typically <=4, while high-fanout signals could easily have fanouts many times greater. Some devices add dedicated high-fanout connections to their routing networks for broadcasting a few high-fanout signals rapidly over long distances across the array. However, these dedicated connections still need to be connected to the clusters 300 in an effective manner. An alternative way to support these high-fanout signals is to add a second general-purpose routing network, or a special-purpose routing network, able to connect efficiently to the multiplexer select inputs 240. These alternatives are discussed further below.

The circuit 1500 discussed above can be extended to include efficient connections to various networks, (such as the second general-purpose routing network mentioned above) and can do so by making use of the uncommon parts of the ASW encoding scheme described above.

Figure 17:
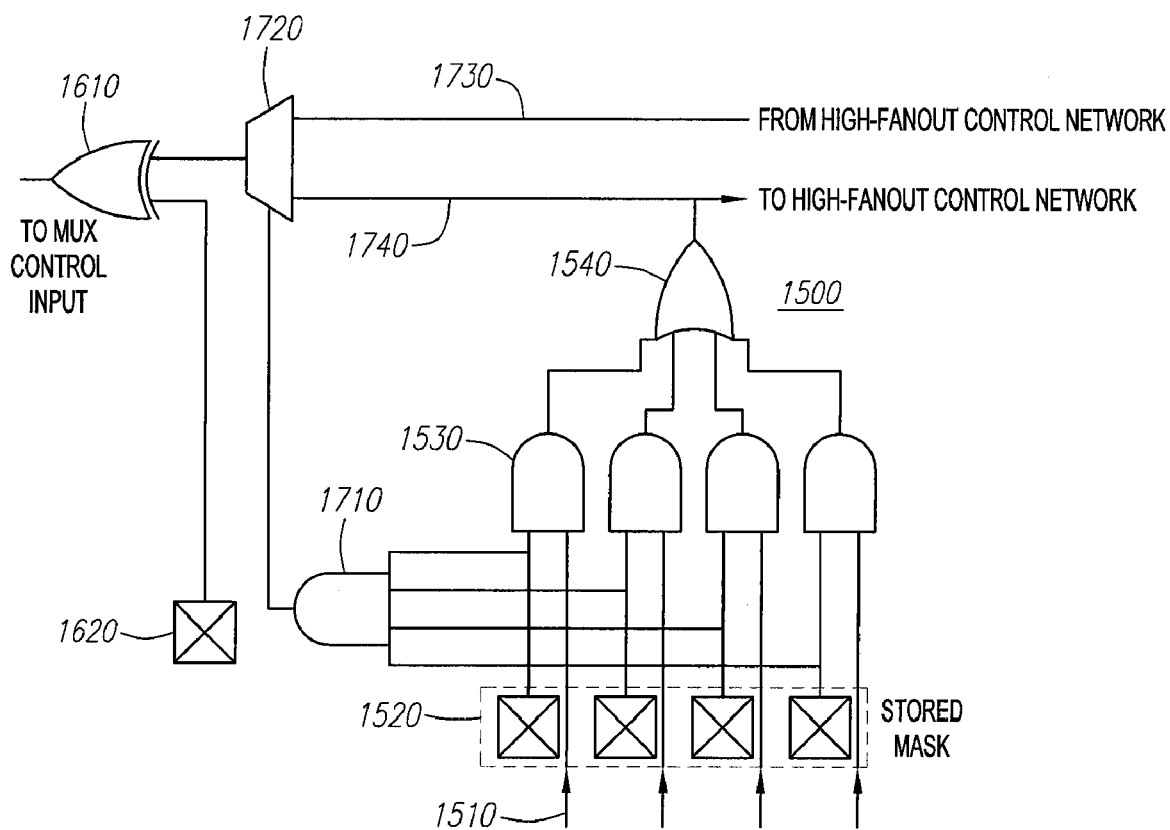
FIG. 17 depicts an extension to the circuit of FIG. 15, which allows a value to be diverted to control extended circuitry.

The "All mask bits set" state can be used to select an alternative input to the multiplexer control path, as shown in FIG. 17. The circuit 1500 as extended includes a 4-input AND gate 1710 which draws its inputs from the mask inputs 1520. The output of the 4-input AND gate 1710 is connected to the select input of a multiplexer 1720. The multiplexer 1720 receives a first input 1730 from the high-fanout network, and a second input 1740 from the circuit 1500. The multiplexer 1720 provides an output to the XOR gate 1610, to convey a select signal to the select input 240 of the multiplexer 200 as discussed above.

When the mask inputs 1520 are configured to all 1's (the final row of Table 3), this causes the output of the 4-input AND gate 1710 to go high (1), which causes the multiplexer 1720 to select the first input 1730, from the high-fanout network, to provide the select signal to the multiplexer 200, via the XOR gate 1610. Thus, the multiplexer 200 is controlled by a signal routed across the high-fanout network.

When the mask inputs 1520 are configured to any other value, the output of the 4-input AND gate 1710 stays low (0), causing the multiplexer 1720 to select the second input 1740, from the circuit 1500, to provide the select signal to the multiplexer 200, via the XOR gate 1610. Thus the multiplexer 200 is controlled by the ALU 100, as discussed above.

The ASW processing logic such as the circuit 1500, optionally extended as discussed, is also a useful source of high-fanout control signals to be provided to the high-fanout control network. "Global" control signals are typically derived in a similar way to "local" control signals, they are just provided to a larger part of the array. Therefore, the output of the circuit 1500 is also routed to the high-fanout control network. The output may be routed directly to the high-fanout control network as shown in FIG. 17, or alternatively the output can be routed first through the multiplexer 1720, with the connection to the high-fanout network being made to the output of the multiplexer 1720. This alternative connection allows the high-fanout output to be derived from the high-fanout input instead.

Variants of this circuit are possible which decode multiple "uncommon" states from the ASW selection table (Table 3) and choose between multiple inputs from the high-fanout network. Alternatively these multiple uncommon states can be used to select a state to drive the high-fanout output.

There are several ways in which the high-fanout output can be connected to the high-fanout network. A useful way is to make the connection via a tri-state buffer, with the tri-state enable driven by part of the configuration state of the device (e.g. a dedicated configuration bit). This form of connection has the advantage that multiple sources are capable of driving the high fanout wire, but the timing is independent of which one is actually used. This makes the timing of the high fanout network easy for routing software to analyze.

High-Fanout Control Network

The above section describes the usefulness of high-fanout control signals, and an example of how they could be interfaced to the multiplexer control circuit 1500. This section provides an example of a useful connection pattern for the high-fanout connection wires to use, to create a general purpose routing network.

It is assumed that the processing elements in a reconfigurable array are arranged in rows and columns on an X-Y grid, either a fully populated grid or a partially populated one (e.g. a checkerboard or chessboard arrangement). On such an array it is likely that those elements sharing a common multiplexer control signal can be arranged in:

Rows, or

Columns, or

Approximately rectangular patches.

(based on the assumption that the high-fanout control signal is being used to control a datapath that has a bitslice (or sub-word-slice) style layout).

These patterns are all variants of a basically rectangular structure. Therefore it is useful for the high-fanout wires to be able to efficiently construct these patterns. The following is an example of a high-fanout network which constructs such patterns:

1. The array contains high fanout wires in both the horizontal and vertical directions.

2. Each individual high fanout wire runs either horizontally or vertically (i.e. along a row or a column), and connects to all the ALUs 100 that it crosses. The wires may run along the whole row (column) or just part of it.

3. The high fanout wires connect to the multiplexer control circuits 1500 as indicated above, with the following additional constraints:

If there is more than one multiplexer 200 per ALU 100, then each circuit 1500 has its input from and output to the high-fanout wires connected to orthogonal wires (i.e. input from vertical, output to horizontal or vice versa).

If there is only 1 multiplexer 200 per ALU 100 then the circuit 1500 should be capable of connecting the inputs and outputs from/to the high-fanout network to both horizontal and vertical high-fanout wires.

The wires naturally run in horizontal and vertical directions, so it is easy to make row and column connections as described above. Furthermore, the ability to input from a horizontal wire and output to a vertical one (or vice versa) makes it possible to create 2-dimensional patches—a horizontal wire can be connected to several vertical wires that it crosses.

In the situation where wires do not run across the whole array their ends should be staggered—i.e. the ends of parallel wires in adjacent columns (and rows) should not be coincident but should be offset from each other. Consider the case of control wires that span 4 ALUs 100 ("Length 4" wires in the normal RAA terminology). In column 0 these wires can run from ALU 0 to ALU 3, ALU 4 to ALU 7 etc, while in column 1 they can run from ALU 2 to ALU 5, ALU 6 to ALU 9 etc. Because the spans of these wires overlap they can be connected by a horizontal control wire so that the total vertical reach of 2 wires is greater than that of a single wire on its own.

Figure 20:
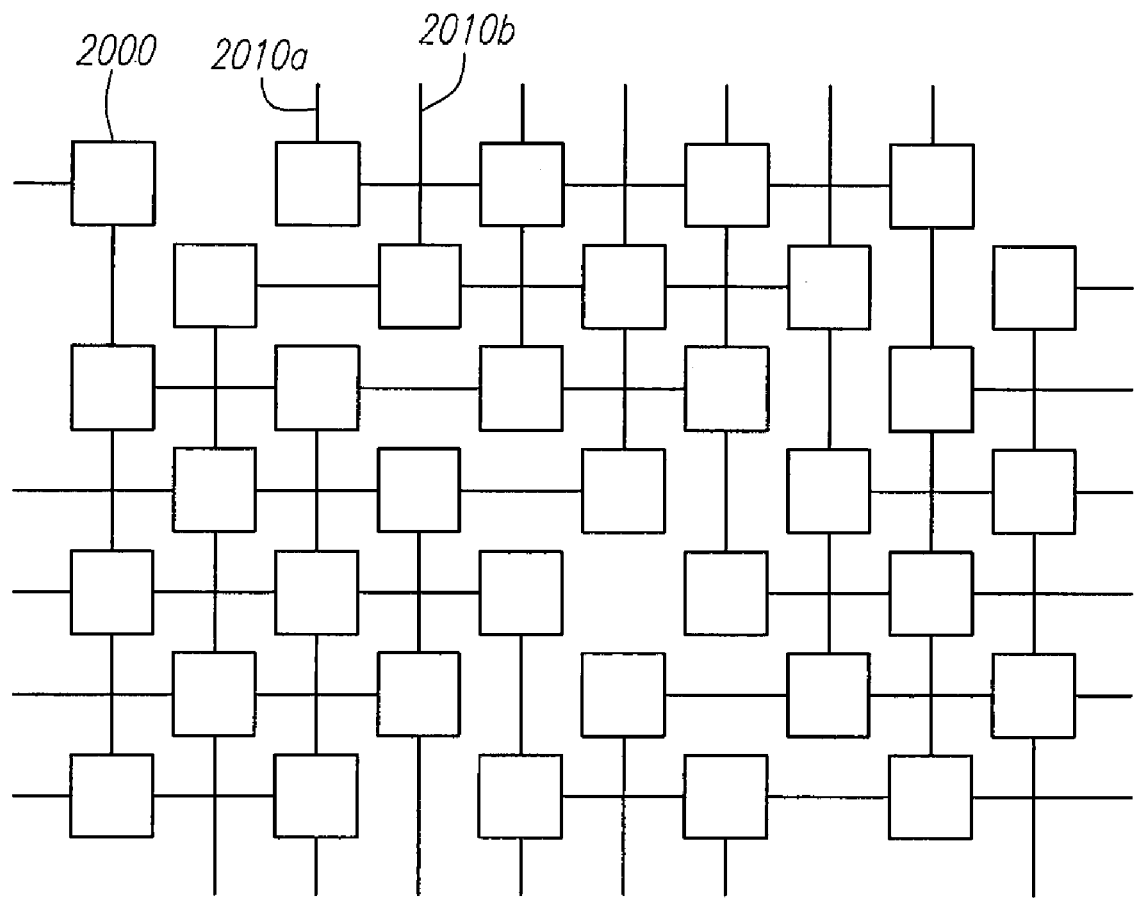
FIG. 20 depicts a reconfigurable array including two general purpose routing networks for control signals.

A checkerboard arrangement, such as shown in FIG. 20, has the property that there are no ALUs in an even row but an odd column (or vice versa)—those sites are occupied by the spaces between ALUs, or more commonly by hardware to support the routing network. The connection pattern described above results in the creation of two independent control networks 2010a and 2010b—one linking the ALUs 2000 in odd numbered rows and columns, and the other linking the ALUs 2000 in even numbered rows and columns. In FIG. 20, the lines between ALUs 2000 depict the control network connections. Lines crossing within an ALU 2000 are connectable to each other to form a control network 2010a, 2010b. Lines crossing outside of the ALUs 2000 are not connectable to each other to form control networks 2010a, 2010b. This may be an acceptable situation, with the two networks used to distribute two separate control signals, Alternatively it may be found to be useful to provide connections between these two networks 2010a, 2010b. The points at which they cross will lie over the routing regions of the checkerboard, so it is easy to support this connection if required.

The general-purpose routing networks 2010a, 2010b are separate from the first general-purpose routing network described above. A signal can only propagate from 2010a, 2010b to the first general-purpose routing network by controlling a multiplexer in the manner described in connection with FIG. 4B above.

The Usefulness of "Sign" and "Overflow" as Control Signals

"Sign" is especially useful as a control signal for an FPGA- or RAA-based reconfigurable array. This is a difference between such arrays and traditional processors, which tend to use overflow. The reasons for this are set out below.

Overflow

Processors have very limited control over wordlength, typically only supporting a small range of wordlengths (e.g. 8, 16 and 32 bits—a range of powers of 2 is common). FPGA and RAA devices can support a wide range of wordlengths, limited only by the granularity of the processing elements that make up the array (i.e. if the array has 4-bit processing elements then it can directly handle wordlengths equal to 4n (positive integer n)).

Many arithmetic applications have the property that when run with "typical" data sets all intermediate data calculated within the application will fit in a particular wordlength, but there are some uncommon data sets whose intermediate results do not fit. This is a significant issue for a processor when the typical case fits into one of the supported wordlengths but the uncommon case does not. A simple processor based implementation is then faced with an unfortunate choice:

always run with a wordlength large enough to handle the rare cases, and accept the efficiency penalty to do this, or run with the smaller wordlength, and accept that the results may occasionally be wrong.

The efficiency penalty can be quite significant—e.g. changing from a 16-bit to a 32-bit implementation can double the amount of memory required for intermediate results and halve the throughput of the main datapath. However the possibility of occasional errors may be unacceptable.

Fortunately there is a third option that can be used to avoid having to make this choice:

in normal circumstances run with the smaller wordlength, but detect the situations where this gives the wrong answer so that remedial action can be taken if required. (e.g. rerun all or part of the calculation with a wider wordlength).

This allows the application to have the benefits of the small wordlength (memory size, datapath throughput) most of the time, and only pay the penalty of the long wordlength version on those rare occasions where it is necessary.

Most processors therefore have an overflow detection mechanism that identifies when the result of a calculation doesn't fit in the target wordlength, and can branch to another part of the program when an overflow happens. "Overflow" is therefore an important concept for processors.

For FPGA- and RAA-based processing, the situation is significantly different—the cost of extending the wordlength is significantly lower because of the finer-grain control of wordlength, and the cost of branching is significantly higher. Suppose the application normally fits in 16 bit words, but occasionally requires 18 bits. A processor would have to use 32 bit words to handle these cases, but an RAA with 4-bit processing elements could use a 20-bit datapath. The penalty for supporting the worst-case situation is therefore a 25% area increase, not a 100% increase.

As described above, FPGA and RAA commonly implement branching by building datapaths for all possible paths through a program. They then use multiplexers to select the correct path for a particular data set. Having a 16-bit primary datapath with some sections repeated using 20 bits, plus multiplexing to choose between them can quickly result in a larger implementation than simply using a wider datapath throughout.

In summary, processors are bad at fine-grain wordlength control but good at branching, while FPGA and RAA are better at wordlength control, and worse at branching. Overflow detection is a way of converting wordlength problems into branches, and is therefore appropriate for processors, but not for FPGA or RAA.

Sign

Knowing the sign of a result is important for two specific operations within applications:

Comparison:
A>B can be implemented by subtracting A from B and checking the sign of the result (only the sign of the result is important, not the full value). Similar methods work for other comparisons (<, <=, >=).

Sign extension:
When increasing the wordlength of a 2s complement signed number, the sign bit needs to be copied into all the added bits. This is normally a simple operation once the sign bit is known.

Correct results must be obtained for both signed and unsigned numbers. The "unsigned" case can be viewed as a special case of signed operations (with the n-bit unsigned values embedded in n+1-bit signed values). In 2s complement notation, the value−X is expressed as (NOT X)+1, with a 1 in the most significant bit ("MSB"), representing the sign bit. Thus:

$-2_{decimal} = NOT(010_{binary}) + 1_{binary} = 101_{binary} + 1_{binary} = 110_{binary}$.

Unsigned comparison will always be correctly expressed by the carry out from the most significant bit of the calculation.

Signed comparison by subtraction and testing the carry out from the MSB will give the wrong result in the event of an arithmetic overflow. This can be fixed with a combination of "Carry out" and "Overflow" signals, or by directly generating the sign signal.

Unsigned "sign extension" is trivial—all the added bits are 0.

Signed sign extension is as described above—the sign is copied into all the added bits.

The different implementations of wordlength control and branching in processors, FPGA and RAA described above also have an impact on how signs are computed and used.

Processors

Processors use branching as their main control mechanism, and they use comparisons to control branching. This is done either with a combined "compare and branch" instruction or with separate "compare and set flag" and "branch if flag set" instructions. There is therefore some similarity between comparison operations and the description of overflow handling above—they both have a "do an operation" stage followed by a "branch if some condition occurs". (i.e. if there is an overflow, or if the comparison was true) This similarity is often made explicit, with the processor having a set of "condition flags" that indicate which of a set of interesting conditions have occurred (such as arithmetic overflow, calculation produced a negative result (i.e. "sign"), most recent carry out value), and a generic branch instruction that jumps if one or more of a specified subset of the flags are set.

Sign extension normally takes place as data is loaded into the processor from memory—if it is stored in a more compact format than it's being loaded into then sign extension is an option on the load operation, replicating the MSB of the stored representation into the extra bits of the in-processor version.

FPGA

Branching is an inefficient operation in an FPGA. Comparison operations in an FPGA are more likely to be used as control inputs to multiplexers, or blocks of logic to combine multiple conditions. Computation of sign is a straightforward operation, as the 1-bit nature of the routing network makes it easy to directly implement the expressions for the correct sign given below.

Sign extension in an FPGA can be a routing operation—the 1-bit nature of FPGA routing allows a sign bit to be easily connected to multiple destinations. However, there is often no need to extend the inputs to an arithmetic operation as it is easy to implement operators with n-bit inputs and n+1-bit outputs.

RAA

RAA is an intermediate case between processors and FPGAs—generic branching is still inefficient (although some limited forms can be implemented by multiplexing of instructions) but the routing network is word-based rather than bit-based, so a direct implementation of the expressions for sign and overflow is more complex, requiring shifts to adjust the positions of bits within the words. It is therefore worth considering adding extra logic to the RAA ALU to directly generate Sign and/or Overflow. For example, Sign is useful, and requires just 1 XOR gate to implement it.

Sign extension cannot be a simple routing option, due to the need to realign bits within words. However, sign extension of arithmetic outputs (as described in the FPGA case above) can also be used with RAA, and benefits directly from the availability of a sign signal. The circuit of FIG. 18—with the sign output 1810 of an addition (or subtraction) operation 1820 controlling a multiplexer 1830—maps directly onto the ALU 100 and multiplexer 200 of the cluster 300 shown in FIG. 3. It is identical to the circuit structure used for data selection following a signed comparison illustrated in FIG. 4A. The circuit receives as inputs two numbers to be added or subtracted, and generates as output the result of the operation and an additional number of bits that pad the output to the desired length, by extending the sign value.

Figure 18:
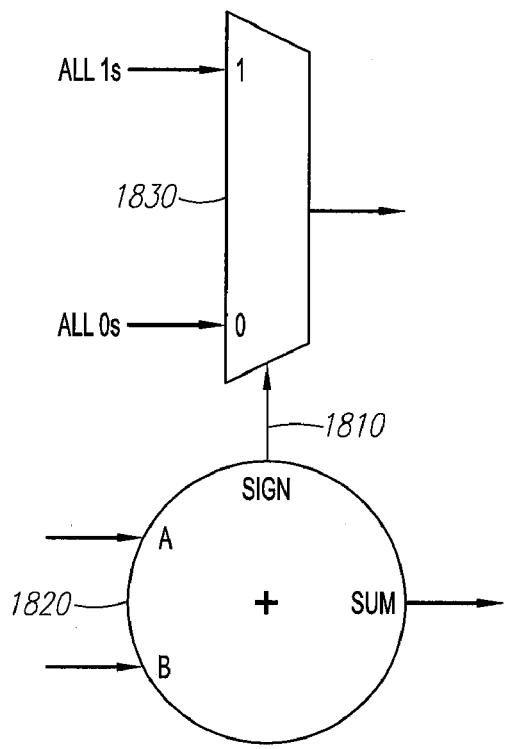
FIG. 18 depicts a circuit implementing sign extensions, which can be mapped onto the cluster of FIG. 3.

In the circuit of FIG. 18, if the sign output 1810 carries a value of "1", indicating a negative number, then the multiplexer 1830 selects the first input value of all 1's to pad the result. If the sign output 1810 carries a value of "0", indicating a positive number, then the multiplexer 1830 selects the second input value of all 0's to pad the result.

In summary, dedicated sign logic is of little benefit to an FPGA as it can directly implement the required logic. It is of much greater benefit to processors (as a control flag for a branch) and to RAA as a control signal for multiplexers 200 where it can be used for both conditional control and sign extension.

Derivation of Expressions for Sign and Overflow

For an individual bit in an addition, the sum and carry out are related to the inputs (A, B, Carry in) as follows (the same formulae work for subtraction if B is replaced with NOT B):

$$\Sigma_i = A_i \wedge B_i \wedge C_{i-1}$$

$$C_i = \text{if } (A_i \wedge B_i) \text{ then } (C_{i-1}) \text{ else } (A_i)$$

Where $C_{i-1}$ is the carry in and $C_i$ the carry out, and $\hat{0}$ represents an XOR operation.

An overflow has happened if the result of a calculation with n bits differs from the result which would have been obtained if the calculation had been done with greater precision, e.g. if the inputs and output were extended to n+1 bits. The signed and unsigned cases are to be treated separately:

Unsigned Case

Input extension is achieved by adding leading 0s, $$\Sigma_{n-1} = A_{n-1} \wedge B_{n-1} \wedge C_{n-2}$$

$$C_{n-1} = \text{if } (A_{n-1} \wedge B_{n-1}) \text{ then } (C_{n-2}) \text{ else } (A_{n-1})$$

$$\Sigma_n = A_n \wedge B_n \wedge C_{n-1}$$

$$A_n = 0$$

$$B_n = 0$$

$$\Sigma_n = C_{n-1}$$

With an unsigned addition the extra bit in the result should be 0, so there is an overflow if carry out from the n-bit calculation is non-zero. For the subtract case (i.e. replacing B with not B), we have $\Sigma_n = \overline{C}_{n-1}$ and the expected value is again 0. Overflow is therefore either carry out for addition or NOT (carry out) for subtraction.

The correct sign is always positive for unsigned addition. For subtraction, a negative result will cause an overflow, so for subtraction: correct sign=overflow=not carry out.

Signed Case

Input extension is achieved by repeating the MSB.

$$\Sigma_{n-1} = A_{n-1} \wedge B_{n-1} \wedge C_{n-2}$$

$$C_{n-1} = \text{if } (A_{n-1} \wedge B_{n-1}) \text{ then } (C_{n-2}) \text{ else } (A_{n-1})$$

$$\Sigma_n = A_n \wedge B_n \wedge C_{n-1}$$

$$A_n = A_{n-1}$$

$$B_n = B_{n-1}$$

$$\Sigma_n = A_{n-1} \wedge B_{n-1} \wedge C_{n-1}$$

The expected value of the extra output bit is that it too should repeat the MSB of the original calculation. Overflow, V, is therefore equal to the XOR of these two bits:

$$V = \Sigma_n \wedge \Sigma_{n-1}$$

$$= (A_{n-1} \wedge B_{n-1} \wedge C_{n-1}) \wedge (A_{n-1} \wedge B_{n-1} \wedge C_{n-2})$$

$$= (A_{n-1} \wedge A_{n-1}) \wedge (B_{n-1} \wedge B_{n-1}) \wedge (C_{n-1} \wedge C_{n-2})$$

-continued $$= 0 \wedge 0 \wedge (C_{n-1} \wedge C_{n-2})$$

$$= C_{n-1} \wedge C_{n-2}$$

So the overflow signal can be generated with a single XOR gate combining carry in and carry out of the last stage of the n-bit calculation.

The correct sign, (often referred to as the negative flag, N) is equal to the extra output bit:

$$N = \Sigma_n$$

$$= A_{n-1} \wedge B_{n-1} \wedge C_{n-1}$$

But the $A_{n-1} \hat{0} B_{n-1}$ term is already calculated as part of the calculation of the MSB of the n-bit value, so the sign also requires just 1 extra XOR gate to evaluate it.

In summary, for the unsigned case, correct sign and overflow have direct relationships to the carry output. For the signed case this is no longer true, but both sign and overflow require the addition of just 1 extra XOR gate each to generate them correctly.

Special-Purpose Routing Network

Figure 21:
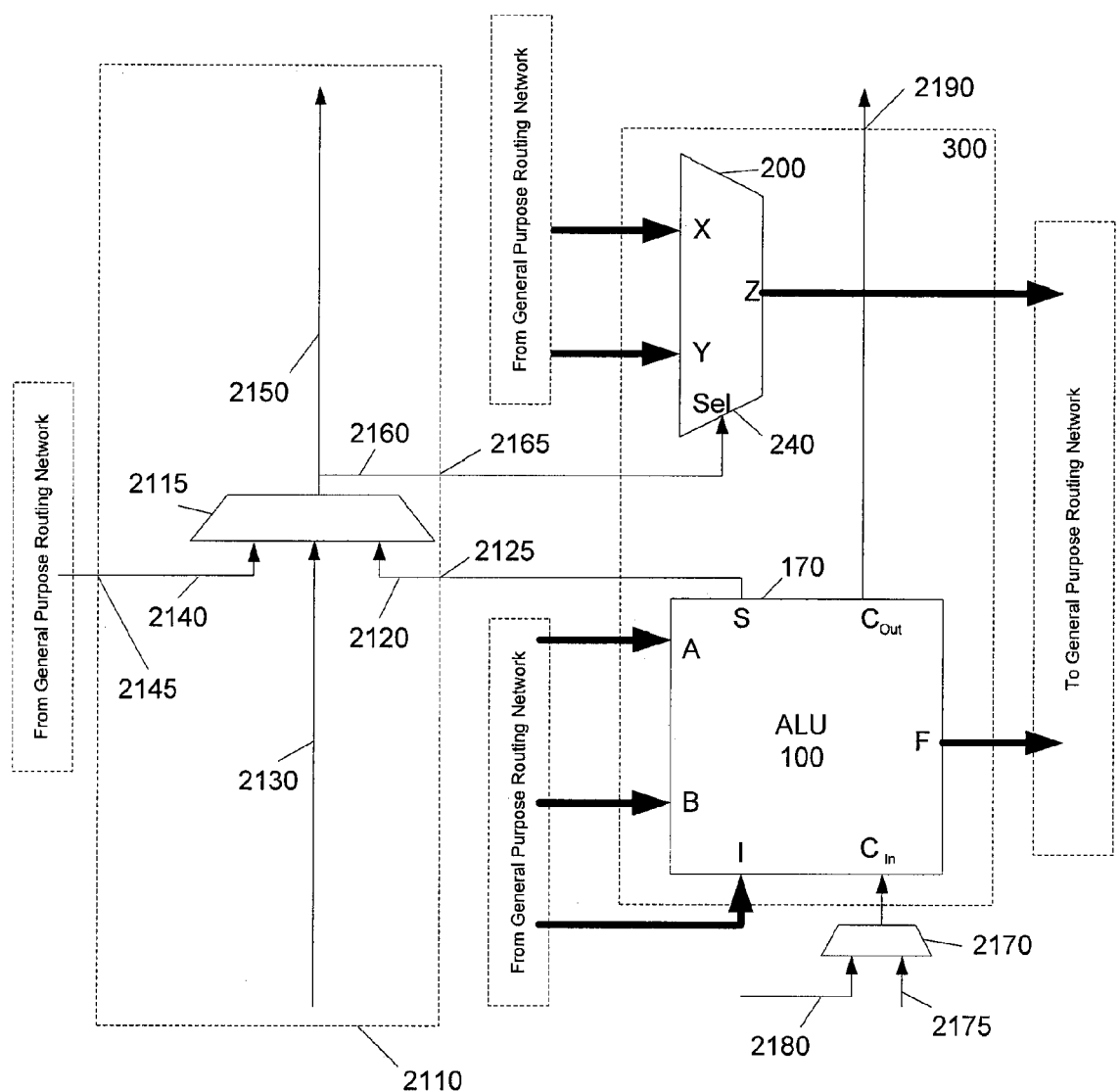
FIG. 21 depicts a cluster and an associated portion of a special-purpose routing network according to an embodiment of the invention.

Turning to FIG. 21, another embodiment of the invention will be discussed, where the cluster 300 is connected to a special-purpose routing network 2110. The cluster 300 includes the ALU 100 and primary multiplexer 200, as discussed above. The direct connection from the select output 170 of the ALU 100 to the select input 240 of the multiplexer 200 is replaced in this embodiment with a connection from the select output 170 to a first routing input 2125 of the special-purpose routing network 2110, and a connection from a first routing output 2165 to the select input 240 of the primary multiplexer 200. For sake of clarity, only the portion of the special-purpose routing network 2110 which corresponds to the cluster 300 is shown in FIG. 21. It will be appreciated that reconfigurable devices which include multiple clusters 300 will also include additional portions of the special-purpose routing network 2110 which serve to route signals to and from the additional clusters 300. Examples of portions of such reconfigurable devices are discussed further below.

Unless otherwise indicated, the embodiments shown in FIGS. 21-34 have 4-bit connections to and from the general purpose routing network (shown by thick lines), and 1-bit direct connections and connections to and from the special-purpose routing network (shown by thin lines). It will be appreciated that these bit widths are merely examples of some embodiments of the invention, and that other bit widths can be used for any of the connections, whether direct, or via the general purpose or special-purpose routing networks.

The special-purpose routing network 2110 includes a selector 2115, for example a routing element such as a multiplexer, which selects one of a plurality of input signals to provide as an output. The selector 2115 may alternatively include additional logic capabilities, including circuitry similar to the selection circuit 1500 discussed above. The selector 2115 may be configurable via a mask, or may receive select signals from another source, such as the general purpose routing network.

The inputs to the selector 2115 include the first selector input 2120, the second selector input 2130, and the third selector input 2140. The first selector input 2120 is connected to the first routing input 2125. The first selector input 2120 obtains values from the select output 170 of the ALU 100. The second selector input 2130 is connected to an adjacent selector within the special-purpose routing network 2110, and obtains values from the adjacent selector. The third selector input 2140 is connected to a second routing input 2145 of the special-purpose routing network 2110, which is connected to and obtains values from the general purpose routing network. Note that the second routing input 2145 is, in this example embodiment, a 1-bit wide input, though the general purpose routing network of this embodiment is a 4-bit network. As discussed above, and as developed in further detail below, 1-bit signals can be retrieved from a 4-bit network using a variety of techniques.

The special-purpose routing network 2110 also includes a selector link 2150 and a selector output 2160. The selector link 2150 provides the output of the selector 2115 to other selectors within the special-purpose routing network 2110, and ultimately to other multiplexers in other clusters associated with the special-purpose routing network 2110. The selector link 2160 provides the output of the selector 2115 to the routing output 2165 and ultimately to the select input 240 of the primary multiplexer 200.

The cluster 300 also connects to a special-purpose carry routing network, which routes carry signals from the ALU 100 to and from other ALUs in other clusters in the reconfigurable device. The carry network sends a carry out ($C_{out}$) signal generated by the ALU 100 via the carry output 2190 to an adjacent ALU in an adjacent cluster. The carry network receives carry in (Cin) signals generated by other ALUs in the reconfigurable device, or by other sources of carry in signals (such as inputs from external devices) on the first carry input 2175 and the second carry input 2180. The first carry input 2175 receives carry in signals from an adjacent ALU in the reconfigurable device. The second carry input 2180 receives carry in signals from the general purpose routing network. Additional sources of carry in signals can also be provided. A routing element such as a carry select multiplexer 2170 receives all of the desired carry in signal sources, and selects one of them for propagation to the ALU 100. The particular carry in signal to select is determined by the designer of the application configured onto the reconfigurable device, according to the application design. The selected carry in signal is then provided to the ALU 100.

In operation, the ALU 100 provides a select signal to the select signal output 170 as discussed above. This select signal is routed to the selector input 2120 via the routing input 2125, where the signal is further routed by the selector 2115. In addition to receiving a select signal from the ALU 100, the selector 2115 may also receive a select signal from another ALU connected to the special-purpose routing network 2110, via the second selector input 2130. Also, the selector 2115 may receive a select signal from the general purpose routing network, via the third selector input 2140. The signal on the third selector input 2140 may come from a wide variety of sources, including other elements of the reconfigurable device, or from sources external to the reconfigurable device. The selector 2115 then selects one of the inputs as the input which is to be routed onwards. The selector 2115 may be statically configured when the reconfigurable device is in a configuration phase, to select a particular input, or the selector 2115 may be dynamically configured when the reconfigurable device is in a design phase. The particular configuration of the selector 2115 will be determined by the particular application which is configured onto the reconfigurable device.

For example if the cluster 300 is configured by an application to be the master source for generation of a particular control signal, then the selector 2115 is configured to select the value on the first selector input 2120 (from the select output 170) and route it onwards to the selector output 2160 and then to the select input 240 of the primary multiplexer 200. This value is also routed over the special-purpose routing network 2110, using the selector link 2150, to other selectors and then to other multiplexers in other clusters within the reconfigurable device.

However, if the cluster 300 is slaved to another cluster connected to the special-purpose routing network 2110, which is the master source for a particular control signal, then the selector 2115 is configured to select the value on the second selector input 2130 (from an adjacent cluster) and route it onwards to the selector output 2160, select input 240, and also onwards to other selectors via the selector link 2150. If the cluster is slaved to another cluster not connected to the special-purpose routing network 2110, then the selector 2115 is configured to select the value on the third selector input 2140 (from the general purpose routing network) and route it onwards as discussed above. Thus control or other signals may be received from a wide variety of sources and efficiently routed to the select inputs (or other inputs as desired) of the multiplexers or other components of the clusters within the reconfigurable device.

Figure 22:
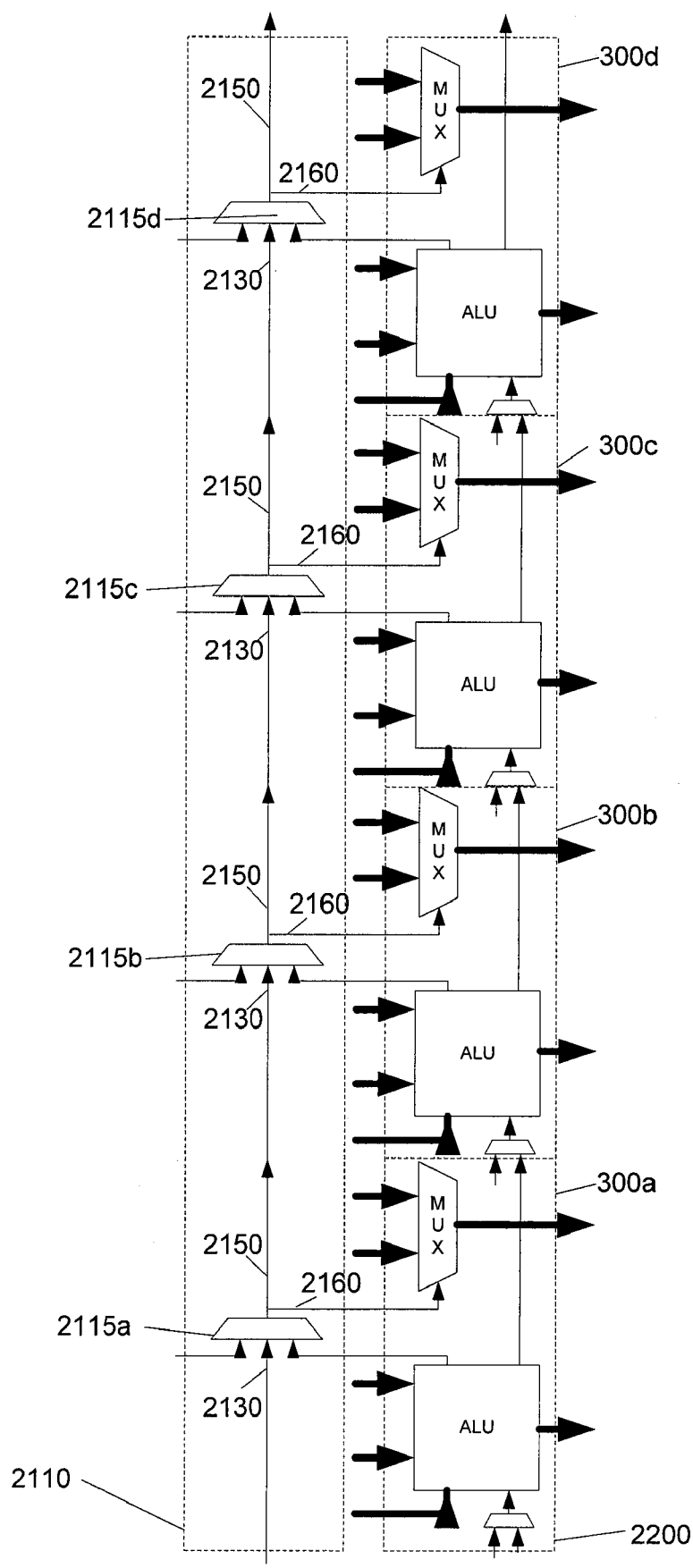
FIG. 22 depicts a column of a reconfigurable device with an associated special-purpose routing network according to an embodiment of the invention.

In an embodiment of a reconfigurable device, the special-purpose routing network 2110 is laid out in column form in the device, corresponding to a column 2200 of clusters 300 within the device, as shown in FIG. 22. The selector link 2150 of each selector 2115a-d is connected to the second selector input 2130 of the adjacent selector 2115a-d. This allows a signal, such as a select signal, to be generated in one cluster 300a-d and rapidly propagated to the other clusters in the column 2200.

For example, if the column 2200 is used to implement a 16-bit wide data path (using four 4-bit wide ALUs), then the same control signal will typically need to be used by all four primary multiplexers 200. The control signal may therefore be generated by the ALU 100 in the cluster 300a, and routed using the special-purpose routing network 2110 to the primary multiplexers 200 in the clusters 300b-d. Alternatively the control signal may be generated elsewhere in the reconfigurable device, and supplied to the column 2200 via one or more of the third selector inputs 2140.

The control signal is routed from the ALU 100 of cluster 300a to the selector 2115a, as discussed above, or alternatively received by the selector 2115a on the third selector input 2140. The selector 2115a selects the appropriate selector input, which carries the control signal, and routes the control signal to the primary multiplexer 200 of cluster 300a, via the selector output 2160 connected to cluster 300a. The selector 2115a also routes the control signal to the selector 2115b associated with cluster 300b. The selector 2115b receives the control signal and routes it onwards to the primary multiplexer 200 of cluster 300b, via the selector output 2160 connected to cluster 300b. The selector 2115b also routes the control signal onwards to the clusters 300c-d in the column 2200, in similar fashion as discussed above. Thus the same control signal is rapidly propagated to all of the primary multiplexers 200 in the clusters 300a-d.

In FIG. 22, the path from the ALU in cluster 300a to the MUX in cluster 300a through the portion defined by selector 2115a and associated wires is a direct connect equivalent because the path does not block any of the physically and logically equivalent paths (ALU in cluster 300b-MUX in cluster 300b, ALU in cluster 300c-MUX in cluster 300c, ALU in cluster 300D-MUX in cluster 300d) shown in FIG. 22. The path from the ALU in cluster 300a to the MUX in cluster 300b, through the portion defined by selector 2115a and selector 2115b and associated wires, however, is not a direct connect equivalent, because this path blocks (at selector 2115b) the equivalent path from the ALU in cluster 300b to the MUX in cluster 300c, through the equivalent portion defined by selector 2115b and selector 2115c and associated wires.

The special-purpose routing network 2110 of this embodiment is a separate network from the chain of carry networks which connect the ALUs 100 of the clusters 300a-d together. The special-purpose routing network 2110 connects the input, such as the select input 240, of each multiplexer 200 within the clusters 300a-d of the reconfigurable device to the input of another multiplexer 200, whereas the chain of carry networks connect the carry output of each ALU 100 to the carry input of the adjoining ALU 100.

Figure 23:
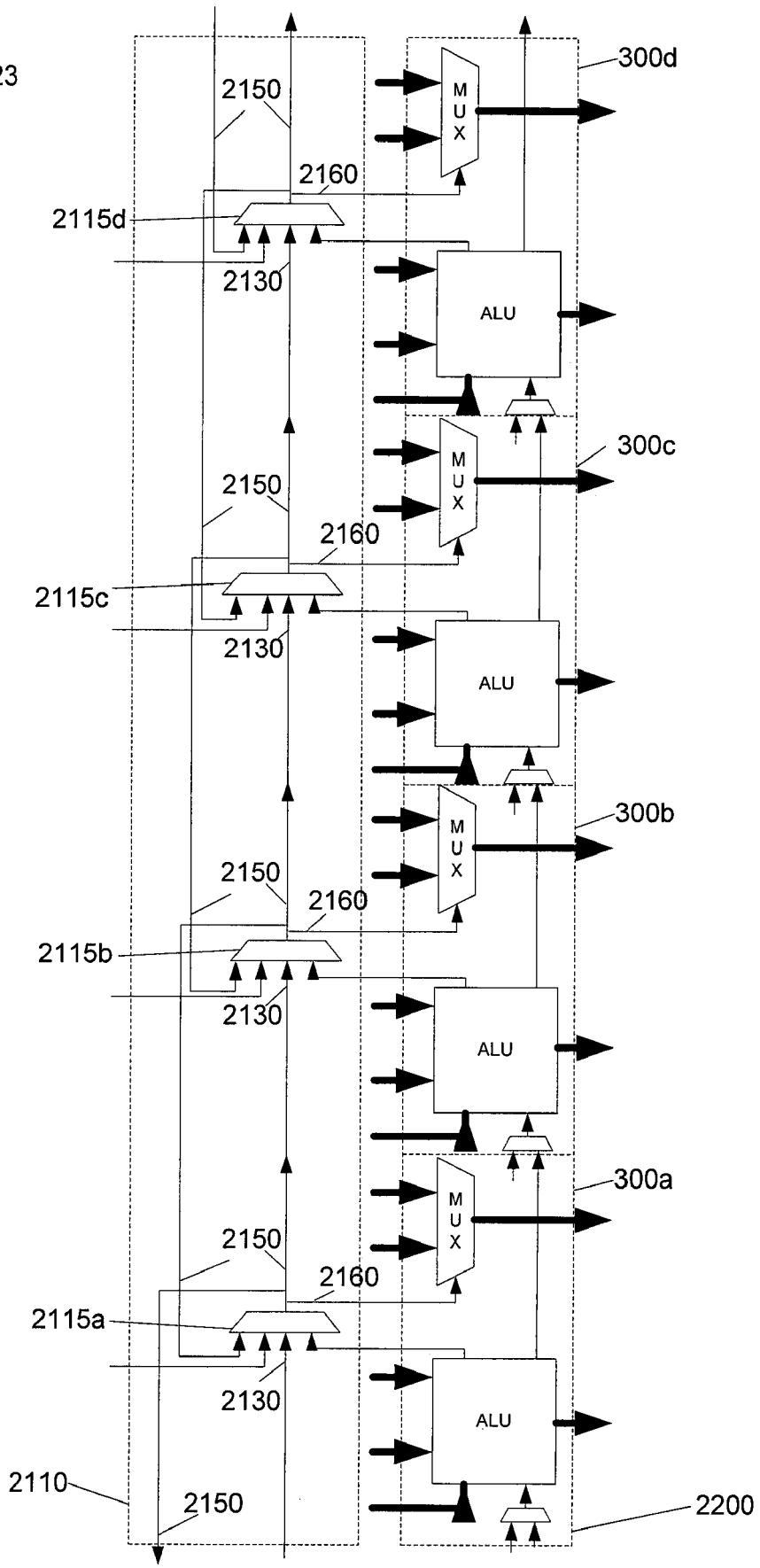
FIG. 23 depicts a column of a reconfigurable device with an associated bi-directional special-purpose routing network according to an embodiment of the invention.
Figure 24:
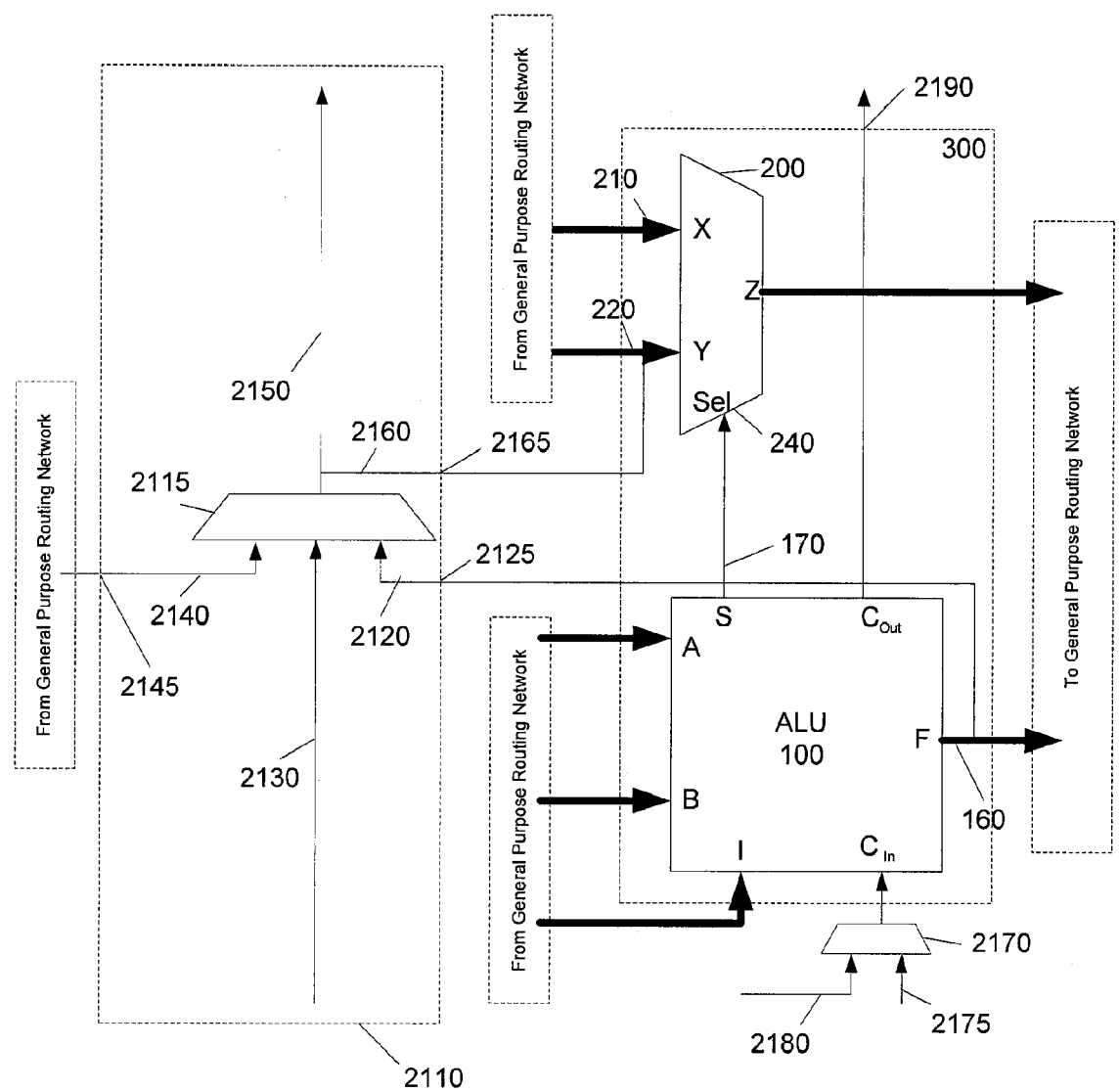
FIGS. 24-28 depict clusters and associated portions of a special purpose routing network according to various alternate embodiments of the invention.

Turning to FIG. 23, the special-purpose routing network 2110 can additionally be constructed to allow the select signals to be propagated in multiple directions, such as both up and down the column 2200. In this embodiment, additional selector links 2150 have been added to link the selectors 2115a-d in a downwards direction. These additional selector links 2150 each connect to a fourth selector input 2310 on the selectors 2115a-d. With this configuration, a signal can be routed, for example, from the select output 170 of the ALU 100 in cluster 300d to the selector 2115d, and out to the selector link 2150. The signal is then routed downwards along the selector link 2150 to the fourth input 2310 of the downwardly adjacent selector 2115c. The selector 2115c selects the fourth input 2310, receives the select signal, and routes the select signal to the selector output 2160 connected to the primary multiplexer 200 of the cluster 300c.

In the embodiment discussed above, the special-purpose routing network 2110 was configured to transport select signals from the ALUs to the primary multiplexers. In alternative embodiments shown in FIGS. 24-26, signals other than select signals may be routed using the special-purpose routing network 2110. For example, in FIG. 24, the function output 160 of the ALU 100 is connected to the first routing input 2125 of the special-purpose routing network 2110. The routing output 2165 is connected to the second input 220 of the primary multiplexer 200. Alternatively, the routing output 2165 could be connected to the first input 210. This routing network routes the data output of the ALU 100 to a data input of the primary multiplexer in the same cluster, as well as to data inputs of other primary multiplexers connected to the special-purpose routing network 2110.

Figure 25:
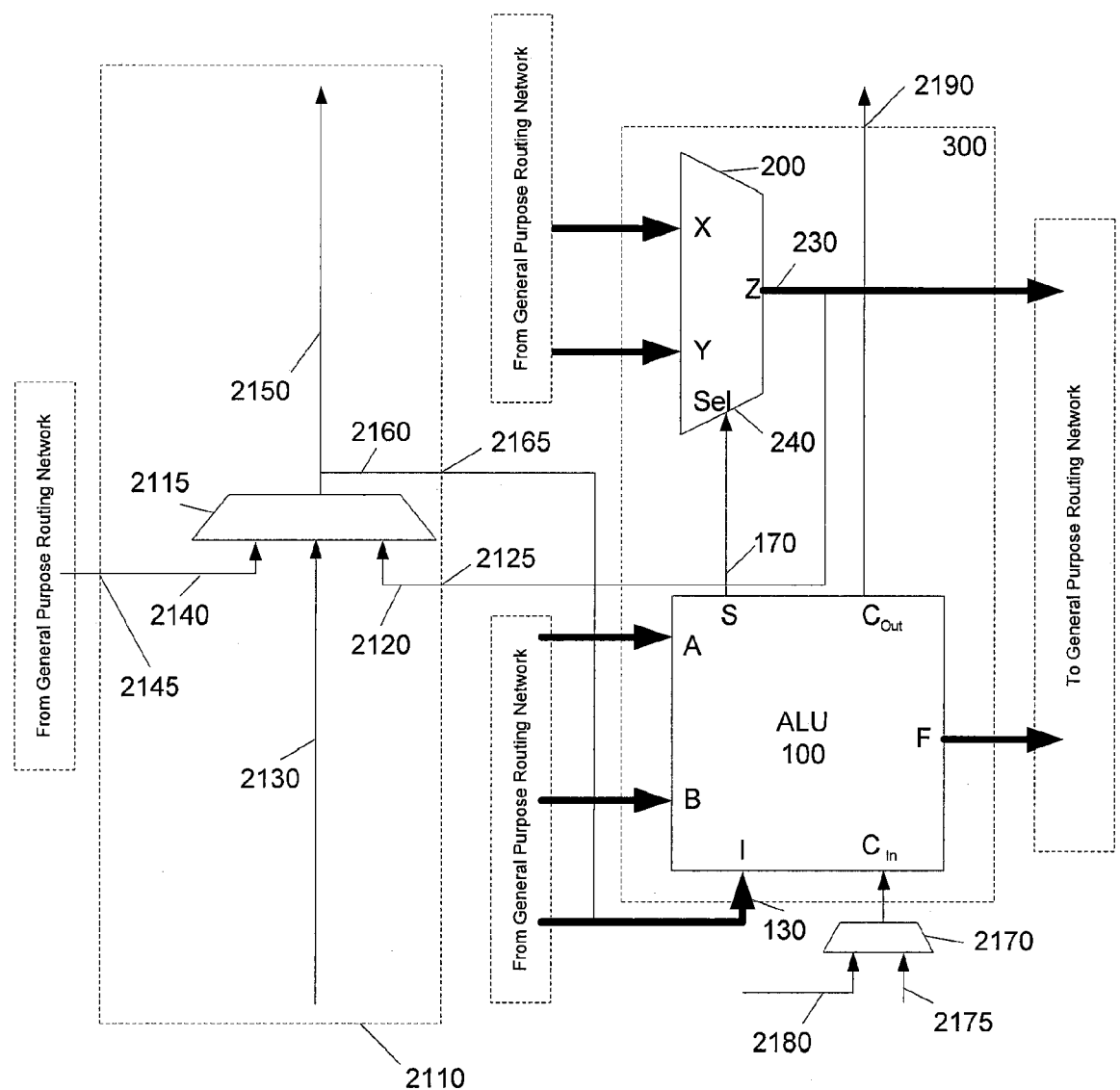

In FIG. 25, the multiplexer output 230 is connected to the first routing input 2125. The routing output 2165 is connected to the instruction input 130 of the ALU 100, as well as via the special-purpose routing network 2110 to the instruction inputs of other ALUs. This configuration allows the primary multiplexer 200 to send an instruction to the ALU 100, as well as to other ALUs connected to the special-purpose routing network 2110.

Figure 26:
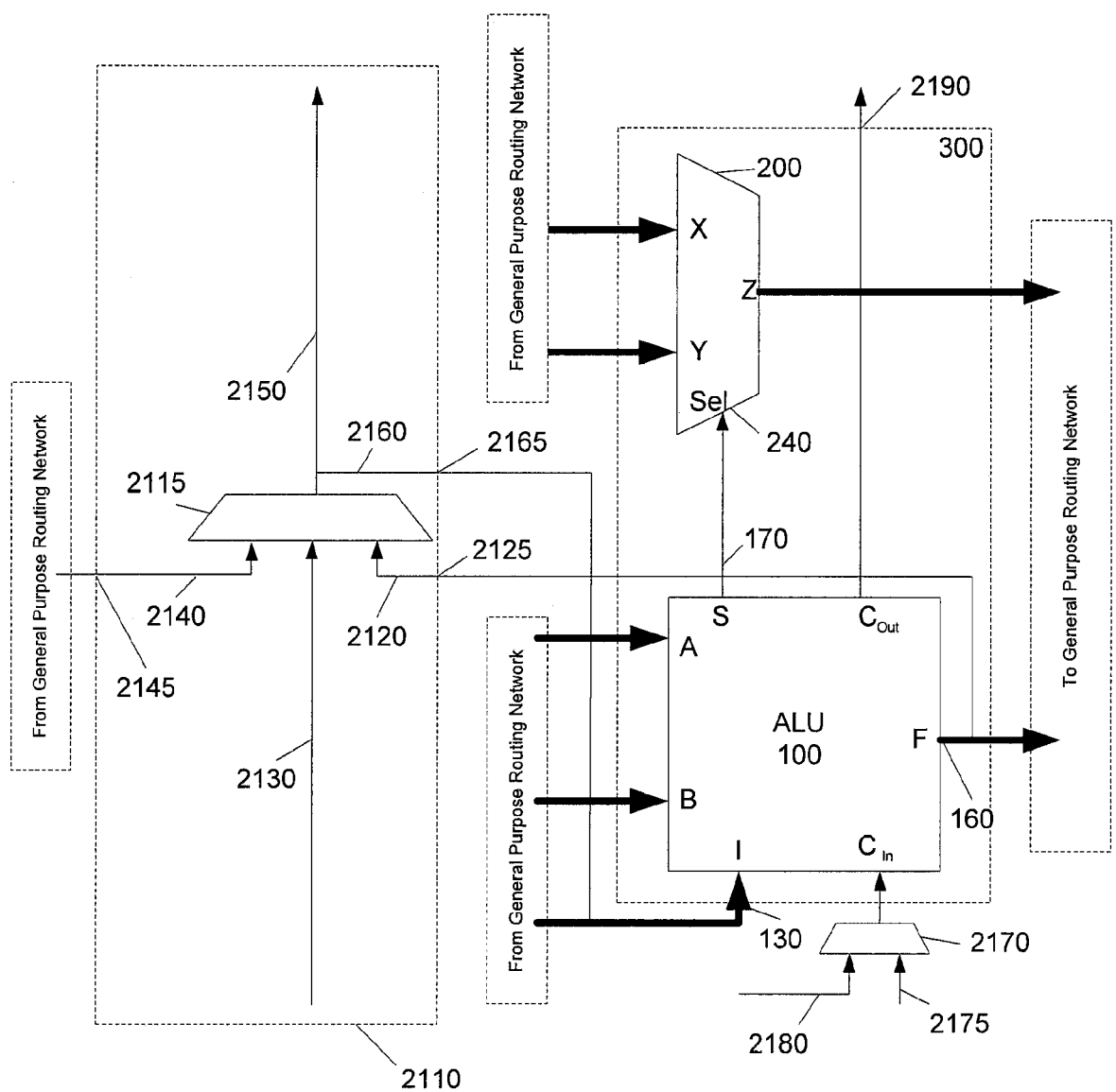

In FIG. 26, the function output 160 of the ALU 100 is connected to the first routing input 2125 of the special-purpose routing network 2110. The routing output 2165 is connected to the instruction input 130 of the ALU 100, as well as via the special-purpose routing network 2110 to the instruction inputs of other ALUs. This configuration allows the ALU 100 to send an instruction to itself, as well as to other ALUs connected to the special-purpose routing network 2110.

Figure 27:
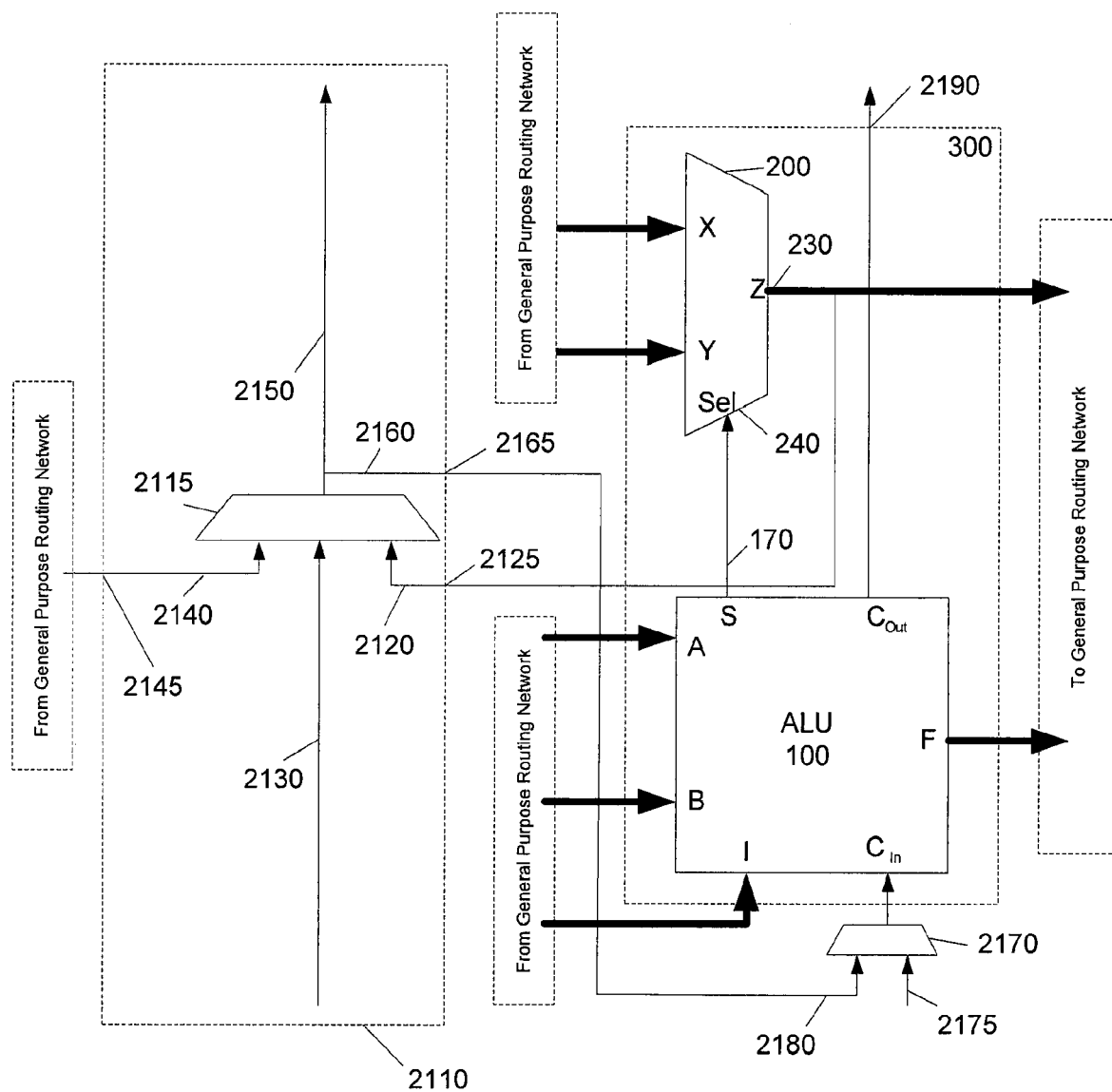

In FIG. 27, the multiplexer output 230 is connected to the first routing input 2125. The routing output 2165 is connected to the second carry input 2180 of the carry select multiplexer 2170, as well as via the special-purpose routing network 2110 to inputs of other carry select multiplexers. This configuration allows the primary multiplexer 200 to send carry information to the ALU 100, as well as to other ALUs connected to the special-purpose routing network 2110. This configuration is similar to the configuration of FIG. 12, where the primary multiplexer output 230 is connected to carry input multiplexer 1210, with the additional connection via the special-purpose routing network 2110 to carry input multiplexers in other clusters.

Figure 28:
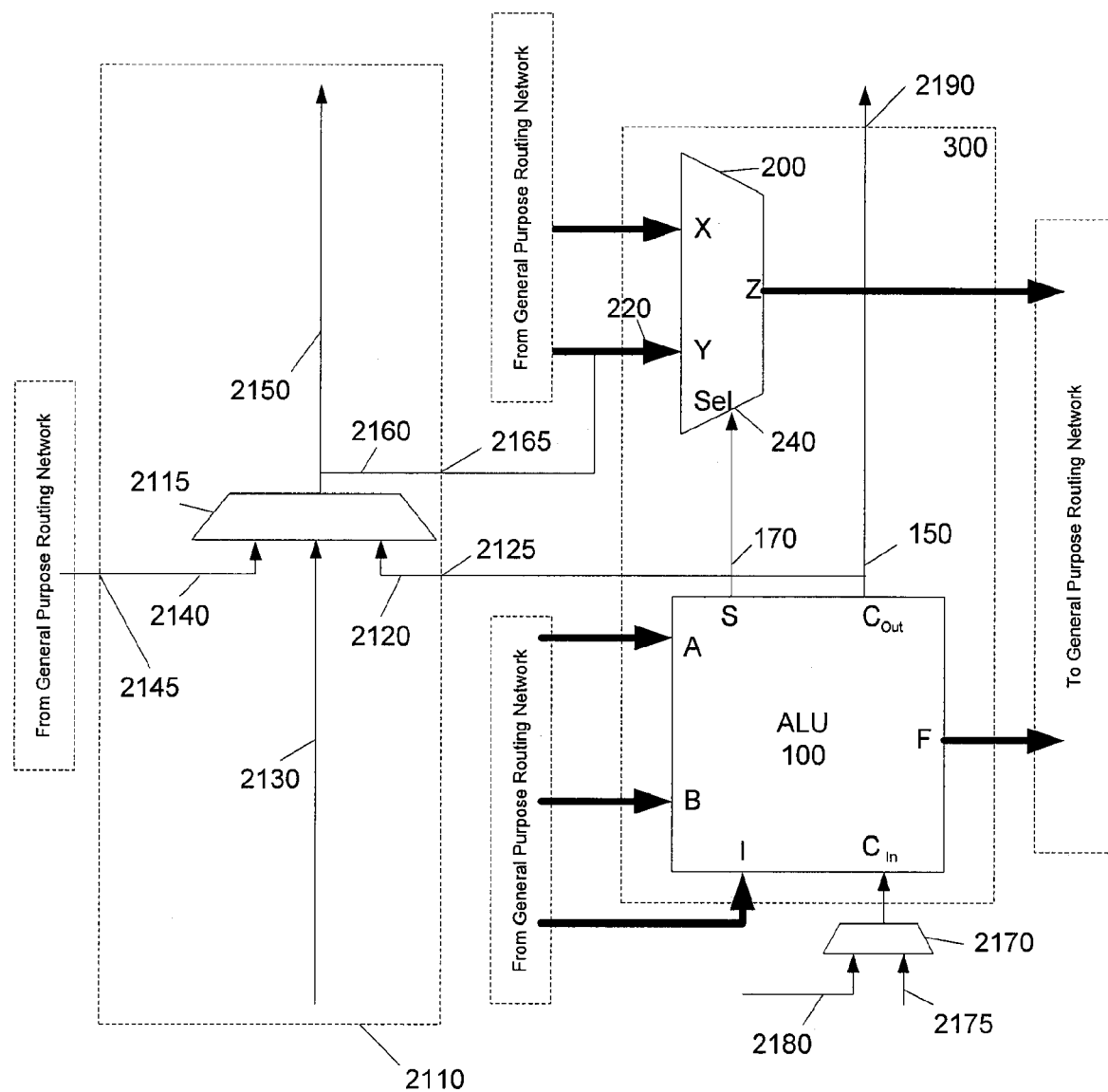

In FIG. 28, the carry-out output 150 is connected to the first routing input 2125. The routing output 2165 is connected to the second input 220 of the primary multiplexer 200, as well as via the special-purpose routing network 2110 to inputs of other primary multiplexers in other clusters. This configuration allows the ALU 100 to send carry-out data to the primary multiplexer 200, as well as to other primary multiplexers connected to the special-purpose routing network 2110. This configuration is similar to the configuration of FIG. 12, where the carry-out output 150 is connected to the input select multiplexer 910, with the additional connection via the special-purpose routing network 2110 to input select multiplexers in other clusters.

In other embodiments, the special-purpose routing network 2110 maybe connected to any of the inputs and outputs of the components of the reconfigurable device, in order to provide a fast network which can propagate signals to and from specific terminals of other components in the reconfigurable device. The special-purpose routing network 2110, by connecting together the inputs of several equivalent components in the reconfigurable device, allows the reconfigurable device to implement a wider datapath equivalent to the various components, such as ALUs and primary multiplexers, found in the reconfigurable device.

The special-purpose routing network 2110 may also include connections to a general purpose routing network on the reconfigurable device, which will allow signals to be sent to and from the general purpose routing network. Examples of these connections are the connections to the second routing input 2145. These connections enhance the flexibility of the reconfigurable device, by allowing the special-purpose routing network to transfer signals to and from the general purpose routing network.

Figure 29:
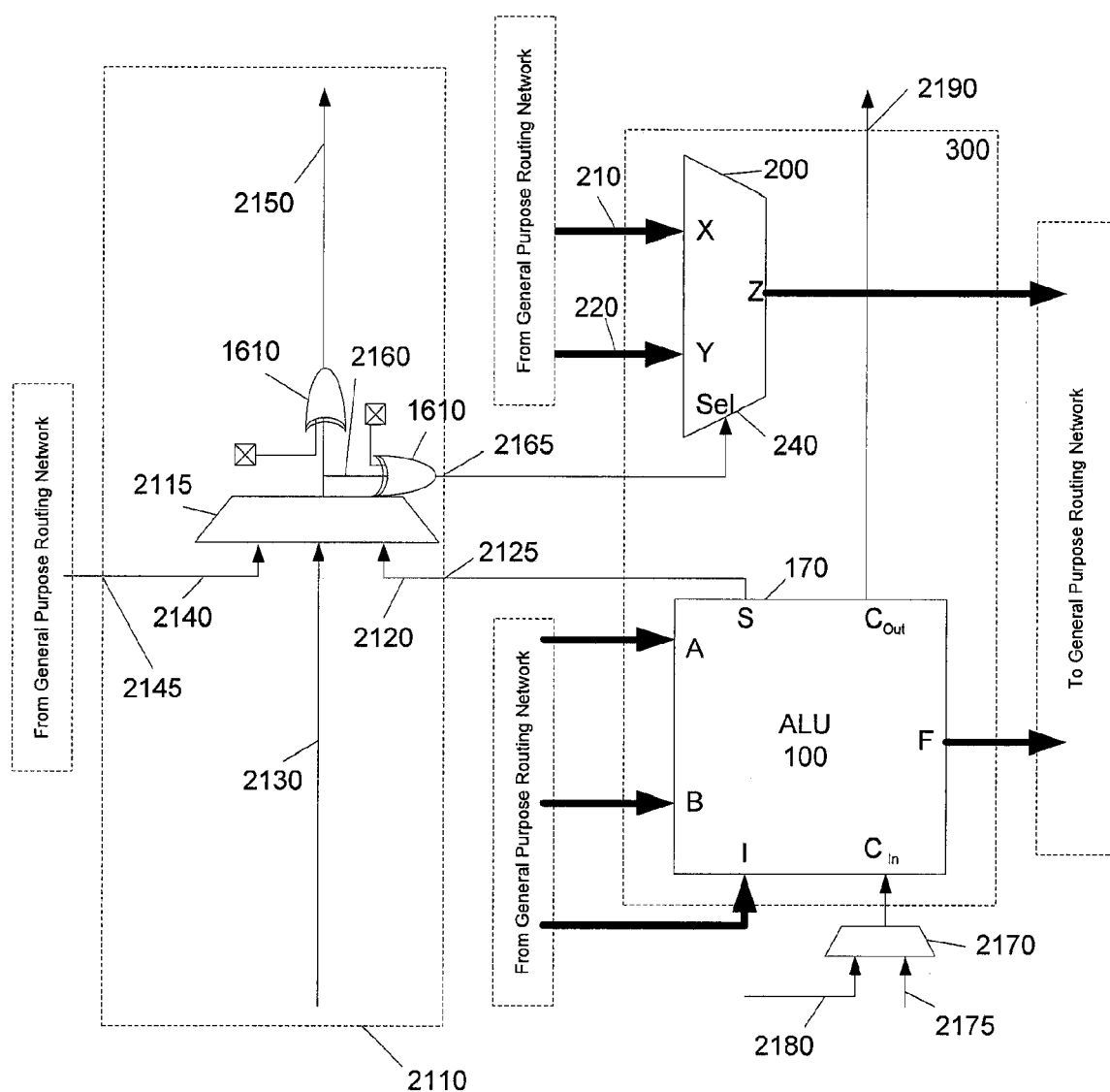
FIG. 29 depicts a cluster and associated special-purpose routing network including output inverters according to an embodiment of the invention.

Turning to FIG. 29, output inverters 1610 may optionally be added to either or both of the selector link 2150 and the selector output 2160. These output inverters 1610 are discussed in more detail above. As applied to the embodiment of FIG. 29, inverting the select signal to the primary multiplexer 200 is equivalent to exchanging the role of its inputs 210, 220. So inverting the select signal 240 allows the inputs 210, 220 of the controlled multiplexer 200 to be connected in the opposite order. In some cases this can reduce the cost of making these connections, and so the cost of the optional inversion of the select signal 240 can be recouped through needing to provide a less capable general purpose routing network to achieve the same level of routability. Adding an optional inversion of the selector link 2150 allows additional flexibility in mapping inputs or logic to the selector 2115. This output inversion can be either shared with the optional inversion of the select signal to the primary multiplexer 200, or selected independently if the two choices are determined by unrelated issues.

Programmable Selectors

In a reconfigurable device such as those discussed herein, which include two networks, such as a general purpose routing network and a special-purpose routing network, signals sometimes are transferred from one network to the other. If the general purpose routing network is a different bit width than the special-purpose routing network, as is frequently the case, then it is useful to provide connections between the two networks which efficiently use the bit width capacity of the wider of the two networks.

The embodiments discussed in FIGS. 29-33 below assume a 4-bit general purpose routing network and a 2-bit special-purpose routing network, but those skilled in the art will appreciate that the concepts discussed below apply equally to any arbitrary bit-widths of either the general purpose routing network or the special-purpose routing network.

A 2-bit wide signal on a special-purpose routing network, such as a processor condition signal, can be represented on a 4-bit wide general purpose routing network by simply placing a signal with the same arithmetic value onto the 4-bit wide network. For example, a 2-bit processor condition signal of [1 1] can be represented on a 4-bit wide network as [0 0 1 1], where the condition signal is placed in the least significant two bits of the 4-bit wide network. This same signal can then be placed back onto the 2-bit network by simply placing the least significant two bits of the 4-bit wide signal onto the 2-bit network.

This principle also applies to transferring signals on direct connections to and from a routing network. For example, transferring signals from a 1-bit direct connection to a 4-bit network. A configuration which implements this is shown in FIG. 4B and the text discussing FIG. 4B. Similarly, signals can be transferred from the 4-bit network back to a 1-bit direct connection. A configuration which implements this is shown in FIG. 12 and the text discussing FIG. 12.

Routing 2-bit signals on a 4-bit network in this manner causes two of the four bits of the 4-bit network to be unused. According to further embodiments of the invention, as shown in FIGS. 30-34, signals on a reconfigurable device may be more efficiently routed between routing networks of differing bit widths, using selectors.

Figure 30A:
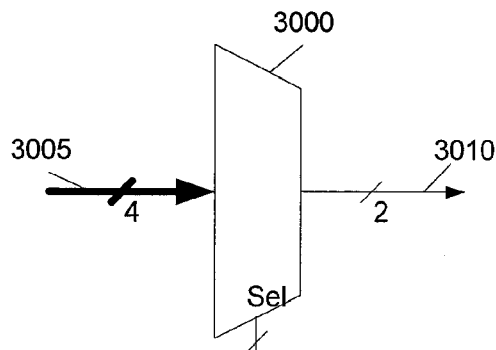
FIGS. 30A-D depict a narrowing selector according to an embodiment of the invention.

Turning to FIG. 30A, a narrowing selector 3000 of an embodiment includes a data input 3005 from a first network, such as a general purpose routing network, and a select input 3007. The narrowing selector 3000 also includes a data output 3010 to a second network, such as a special-purpose network or a direct connection. The data input 3005 is wider than the data output 3010. In this embodiment, the data input 3005 is 4 bits wide, and the data output 3010 is 2 bits wide, though other widths can be used in alternate embodiments. The narrowing selector 3000 selects amongst the four bits on the data input 3005 and provides the selected bits to the data output 3010, according to the signal on the select input 3007.

Figure 30B:
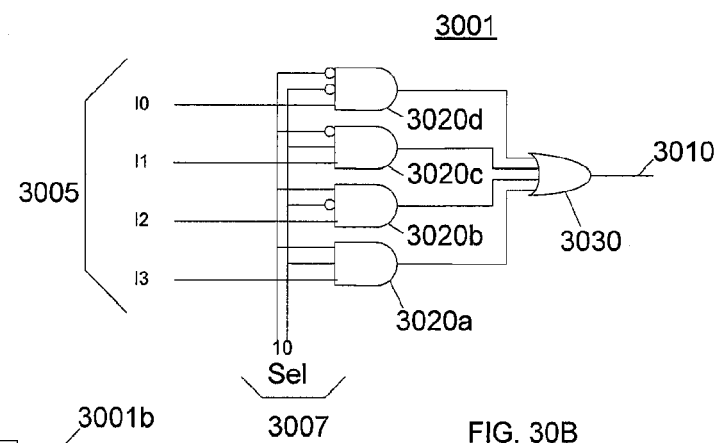
Figure 30C:
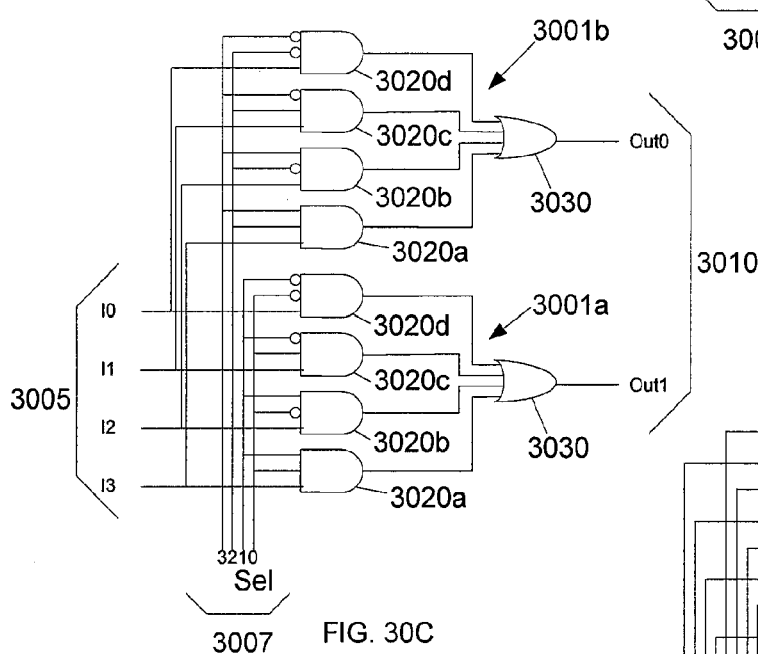

Turning to FIGS. 30B-C, the narrowing selector 3000 of an embodiment is constructed using logic gates. The basic block 3001 used in the narrowing selector 3000 is shown in FIG. 30B. The block 3001 includes four AND-gates 3020*a-d*, and one OR-gate 3030. Each AND-gate 3020*a-d* receives one bit ($I_0$, $I_1$, $I_2$, $I_3$) of the data input 3005, and two bits (0,1) of the select input 3007. The bits of the select input 3007 may be inverted prior to being provided to the AND-gates, in order to implement the select scheme shown in Table 4 below. Each AND-gate 3020*a-d* outputs the logical AND of its inputs to the OR gate 3030. The OR-gate outputs the logical OR of all four of its inputs on a bit line of the output 3010.

The bits on the select input 3007 are inverted on some of the inputs to some of the AND-gates 3020*a-d*, to implement the select scheme of FIG. 4. The first AND-gate 3020*a* has neither bit line inverted. The second AND-gate 3020*b* has bit line 0 inverted. The third AND-gate 3020*c* has bit line 1 inverted. The fourth AND-gate 3020*d* has both bit lines 0 and 1 inverted. This select scheme causes the input bit lines $I_0$, $I_1$, $I_2$, $I_3$ to be routed to the output bit line (Out) according to Table 4:

TABLE 4

| Select Signal | Selected Input on Output (Out) |
|---|---|
| 00 | $I_0$ |
| 01 | $I_1$ |
| 10 | $I_2$ |
| 11 | $I_3$ |

Turning to FIG. 30C, the narrowing selector 3000 includes two basic blocks 3001*a-b*, one for each output line ($Out_0$, $Out_1$) of the data output 3010. The input bit lines ($I_0$, $I_1$, $I_2$, $I_3$) of the data input 3005 are connected in parallel to both of the basic blocks 3001*a-b*. The select input 3007 comprises two sets of two select bit lines, each set controlling one of the basic blocks 3001*a-b*. Select bit lines (0, 1) control the first basic block 3001 a, and select bit lines (2, 3) control the second basic block 3001*b*.

The select signal on the select input 3007 selects the bits to provide to the data output 3010 according to Table 5 below.

TABLE 5

| Select Signal (3-2-1-0) | Selected Input on Output $Out_0$ | Selected Input on Output $Out_1$ |
|---|---|---|
| 0000 | $I_0$ | $I_0$ |
| 0001 | $I_0$ | $I_1$ |
| 0010 | $I_0$ | $I_2$ |
| 0011 | $I_0$ | $I_3$ |
| 0100 | $I_1$ | $I_0$ |
| 0101 | $I_1$ | $I_1$ |
| 0110 | $I_1$ | $I_2$ |
| 0111 | $I_1$ | $I_3$ |
| 1000 | $I_2$ | $I_0$ |
| 1001 | $I_2$ | $I_1$ |
| 1010 | $I_2$ | $I_2$ |
| 1011 | $I_2$ | $I_3$ |
| 1100 | $I_3$ | $I_0$ |
| 1101 | $I_3$ | $I_1$ |
| 1110 | $I_3$ | $I_2$ |
| 1111 | $I_3$ | $I_3$ |

Figure 30D:
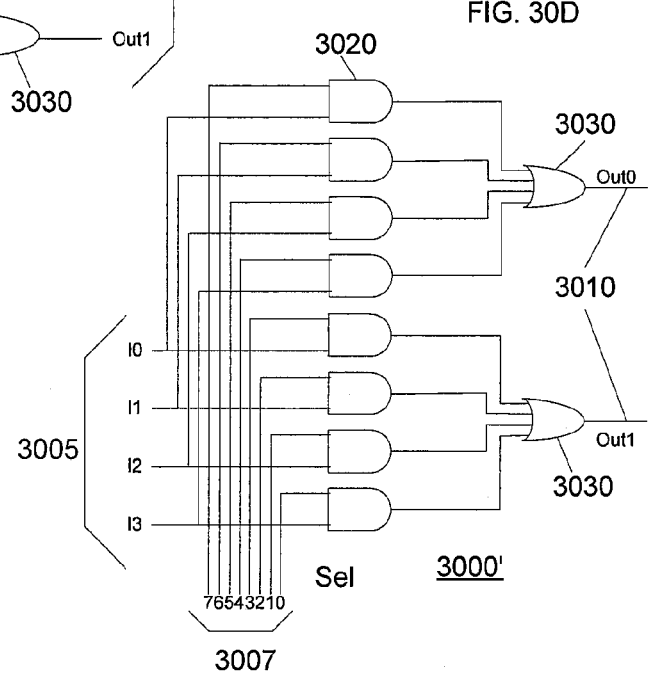

Turning to FIG. 30D, an alternate embodiment of the narrowing selector 3000' is shown. In this alternative embodiment, additional select bit lines (4, 5, 6, 7) are provided, and each of the AND-gates 3020 is individually selectable via one of the select bit lines (0-7). Thus, it is possible to select multiple input bit lines for each output bit line. The multiple input bit lines are then OR-ed together using the OR-gate 3030 to generate each output bit line. This embodiment is an example of a narrowing selector 3000 that also includes additional logic functionality, namely the ability to OR together several input lines. When controlled by the select signals of Table 6 below, the embodiment of FIG. 30D produces the same outputs as the embodiment of FIG. 30C.

TABLE 6

| Select Signal (7-6-5-4-3-2-1-0) | Selected Input on Output $Out_0$ | Selected Input on Output $Out_1$ |
|---|---|---|
| 1000-1000 | $I_0$ | $I_0$ |
| 1000-0100 | $I_0$ | $I_1$ |
| 1000-0010 | $I_0$ | $I_2$ |
| 1000-0001 | $I_0$ | $I_3$ |
| 0100-1000 | $I_1$ | $I_0$ |

TABLE 6-continued

| Select Signal (7-6-5-4-3-2-1-0) | Selected Input on Output Out$_0$ | Selected Input on Output Out$_1$ |
|---|---|---|
| 0100-0100 | I$_1$ | I$_1$ |
| 0100-0010 | I$_1$ | I$_2$ |
| 0100-0001 | I$_1$ | I$_3$ |
| 0010-1000 | I$_2$ | I$_0$ |
| 0010-0100 | I$_2$ | I$_1$ |
| 0010-0010 | I$_2$ | I$_2$ |
| 0010-0001 | I$_2$ | I$_3$ |
| 0001-1000 | I$_3$ | I$_0$ |
| 0001-0100 | I$_3$ | I$_1$ |
| 0001-0010 | I$_3$ | I$_2$ |
| 0001-0001 | I$_3$ | I$_3$ |

The embodiment of FIG. 30D is also capable of further configurations, such as de-activating all inputs (select 0000-0000), or activating all inputs (1111-1111), or selecting any other arbitrary combination of inputs to be provided to the OR-gates 3030 (e.g. 1101-1001).

Using the select input, the gate-level design for the narrowing selector 3000 shown in the embodiment of FIGS. 30B-C is programmable to allow any single bit line of the data input 3005 to be directed to each bit line of the data output 3010. The embodiment of FIGS. 30B-C trades off a reduced bit width select input 3007 against the ability to make arbitrary connection patterns between the lines on the data input 3005 and the lines on the data output 3010. The gate-level design for the narrowing selector 3000 shown in the alternate embodiment of FIG. 30D does allow for any arbitrary connection pattern between the lines on the data input 3005 and the lines on the data output 3010. Additionally, the narrowing selector 3000 may be programmed such that one or more lines of the data output 3010 do not receive any of the signals on the data input 3005. The trade-off is an increased bit width select input 3007. The output lines which do not receive any of the signals on the data input 3005 could alternatively receive a constant signal from a configuration memory associated with the narrowing selector, or from some other source.

Figure 31A:
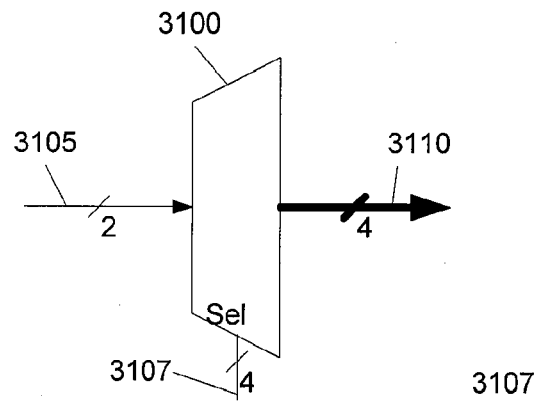
FIGS. 31A-C depict a widening selector according to an embodiment of the invention.

Turning to FIG. 31A, a widening selector 3100 of an embodiment includes a data input 3105 from the second network and a select input 3107. The widening selector 3100 also includes a data output 3110 to the first network. The data input 3105 is narrower than the data output 3110. In this embodiment, the data input 3105 is 2 bits wide, and the data output 3110 is 4 bits wide, though other widths can be used in alternate embodiments. The widening selector 3100 provides the two bits on the data input 3105 to two or more selected bits on the data output 3110, according to the signal on the select input 3107.

Figure 31B:
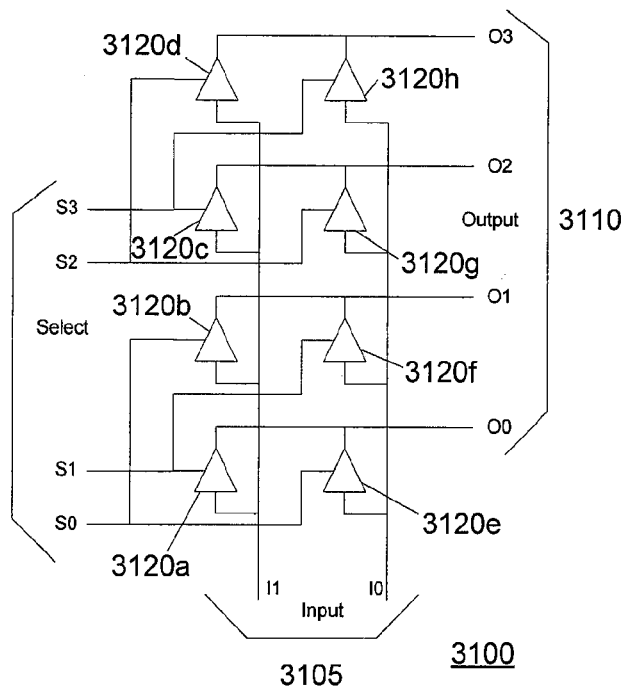

Turning to FIG. 31B, the widening selector 3100 of an embodiment is constructed using logic gates. The widening selector 3100 includes eight tri-state drivers 3120a-h. The data input 3105 includes two bit lines (I$_0$, I$_1$). Each bit line is connected to the input of four tri-state drivers. The bit line I$_0$ is connected to tri-state drivers 3120a-d. The bit line I$_1$ is connected to tri-state drivers 3120e-h. The select input 3107 includes four bit lines (S$_0$, S$_1$, S$_2$, S$_3$), each of which is connected to the control input of two of the tri-state drivers. The bit line S$_0$ controls tri-state drivers 3120b and 3120e. The bit line S$_1$ controls tri-state drivers 3120a and 3120f. The bit line S$_2$ controls tri-state drivers 3120d and 3120g. The bit line S$_3$ controls tri-state drivers 3120c and 3120h. The data output 3110 includes four bit lines O$_0$, O$_1$, O$_2$, O$_3$. The bit line O$_0$ is connected to the output of tri-state drivers 3120a and 3120e. The bit line O$_1$ is connected to the output of tri-state drivers 3120b and 3120f. The bit line O$_2$ is connected to the output of tri-state drivers 3120c and 3120g. The bit line O$_3$ is connected to the output of tri-state drivers 3120d and 3120h. The values of the pairs of bits (S$_0$, S$_1$), and (S$_2$, S$_3$) are constrained so that at most 1 bit in a pair is high. With this constraint, only one of each of the two tri-state drivers connected to each output bit line O$_0$, O$_1$, O$_2$, O$_3$ will be driven, and thus each output bit line will be connected to at most one input bit line. With the further constraint that at most 1 bit in total of the select input bit lines is high, then either the bottom or the top 2 output bits (or none of them) is connected to the inputs, as shown in Table 7 below. Alternatively, when it is permitted for a single bit in each pair to be high at the same time (e.g. 1001), then the input signal can be connected to both the bottom and the top two output bits, resulting in a signal splitting effect.

TABLE 7

| select (3-2-1-0) | output O$_3$ | output O$_2$ | output O$_1$ | output O$_0$ |
|---|---|---|---|---|
| 0000 | X (undriven) | X (undriven) | X (undriven) | X (undriven) |
| 0001 | X | X | I$_1$ | I$_0$ |
| 0010 | X | X | I$_0$ | I$_1$ |
| 0100 | I$_1$ | I$_0$ | X | X |
| 1000 | I$_0$ | I$_1$ | X | X |

Figure 31C:
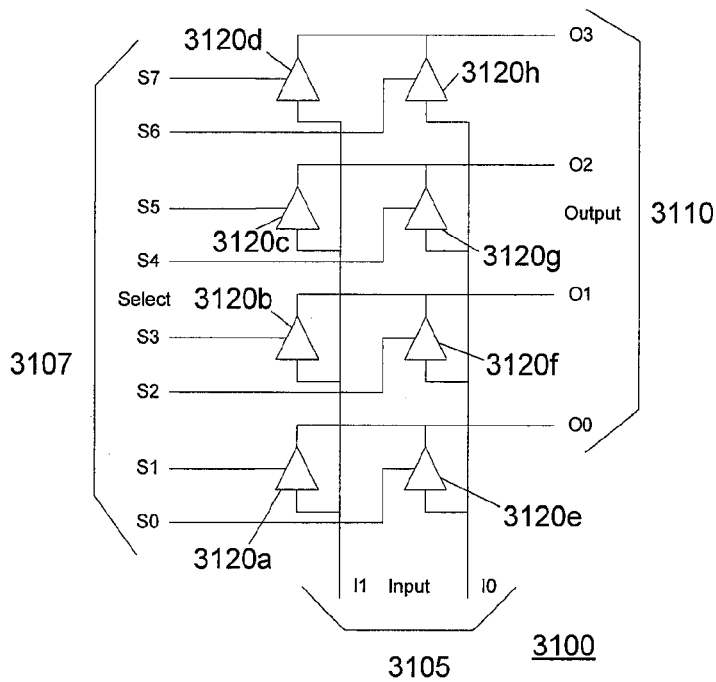

Turning to FIG. 31C, an alternate embodiment of the widening selector 3100 is shown. In this Embodiment, there are eight select bit lines, with each select bit line controlling a single tri-state driver. The values of the pairs of control bits (S$_0$,S$_1$), (S$_2$,S$_3$), (S$_4$,S$_5$), (S$_6$,S$_7$) are constrained so that at most 1 of each pair is high, (i.e. that only 1 driver is connected to each output). With the additional constraint that the inputs can be directed to only one of the two pairs of outputs (O$_0$, O$_1$) or (O$_2$, O$_3$), the permissible control signals and the resultant outputs on the data output 3110 are shown in Table 8 below.

TABLE 8

| select (76543210) | output O$_3$ | output O$_2$ | output O$_1$ | output O$_0$ |
|---|---|---|---|---|
| 0000 0000 | X (undriven) | X (undriven) | X (undriven) | X (undriven) |
| 0000 1001 | X | X | I$_1$ | I$_0$ |
| 0000 0101 | X | X | I$_0$ | I$_0$ |
| 0000 0110 | X | X | I$_0$ | I$_1$ |
| 0000 1010 | X | X | I$_1$ | I$_1$ |
| 1001 0000 | I$_1$ | I$_0$ | X | X |
| 0101 0000 | I$_0$ | I$_0$ | X | X |
| 0110 0000 | I$_0$ | I$_1$ | X | X |
| 1010 0000 | I$_1$ | I$_1$ | X | X |

When the additional constraint discussed above is removed, the configuration of FIG. 31C allows any arbitrary connections between the input bit lines I$_0$, I$_1$ and the output bit lines O$_0$, O$_1$, O$_2$, O$_3$ to be made. For example, a select input of 1001-0110 would result in connections from I$_1$ to O$_3$, I$_0$ to O$_2$, I$_0$ to O$_1$ and I$_1$ to O$_0$. Thus the widening selector 3100 of an embodiment is programmable, to allow for any arbitrary connection pattern between the lines on the data input 3105 and the lines on the data output 3110. Additionally, the widening selector 3100 may be programmed such that one or more lines of the data input 3105 are not provided to any of the lines on the data output 3110, and/or such that one or more of the lines on the data output 3110 are not connected to any of the lines of the data input 3105. If there are lines on the data output 3110 which are not connected to any lines of the data input 3105, the widening selector 3100 may be programmed to connect these data output 3110 lines to another data source, such as a constant value. When using a widening selector of the embodiment using tri-state drivers as discussed above, it is preferable that either 1) none of the lines on the output 3110 are driven by any tri-state driver, or 2) all of the lines on the output 3110 which are ultimately connected to other inputs within the reconfigurable device be driven by exactly one tri-state driver. That is, there should be no output 3110 that is connected to some other input in which only some of the output lines are driven.

The narrowing selector 3000 and the widening selector 3100 may be used to construct more complex selectors as well. For example, turning to FIG. 32A, a merge selector 3200 is shown. The merge selector 3200 merges bits from multiple narrower sources, such as from various different sources on the second network, or even direct connections from components to the merge selector 3200. The merged bits are provided to a wider network, such as the first network. The merge selector 3200 includes a plurality of data inputs 3205a-b for receiving data from the narrower sources, and a data output 3210 for providing the merged data to a wider target. The merge selector 3200 also includes a select input 3207, which receives a select signal that indicates which bits of each data input 3205a-b are to be directed to each line of the data output 3210.

As with the narrowing selector 3000 and widening selector 3100 discussed above, the merge selector 3200 is programmable to direct any of the data inputs 3205a-b, including any of the individual bit lines on the data inputs 3205a-b, to any of the lines of the data output 3210. The merge selector 3200 need not provide a signal on each line of the data output 3210, nor need each line of each data input 3205a-b be provided to a line of data output 3210. The signals on the data inputs 3205a-b may be provided to disjoint subsets of the lines of the data output 3210 (e.g. provide the lines of data input 3205a to line 1 and 2 of the data output 3210, and provide the lines of data input 3205b to lines 3 and 4 of the data output 3210). Alternatively, the subsets may overlap if such a design is desirable.

Figure 32A:
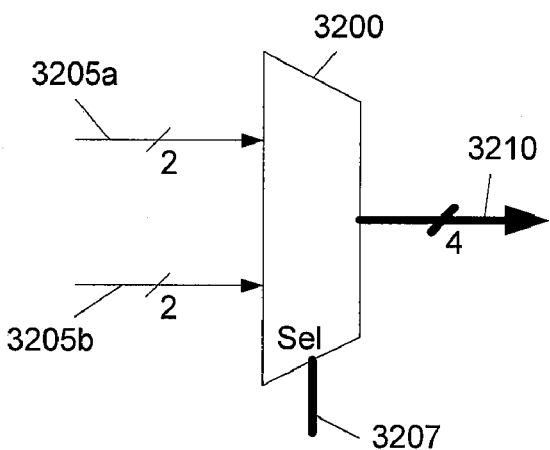
FIGS. 32A-B depict a merge selector according to an embodiment of the invention.
Figure 32B:
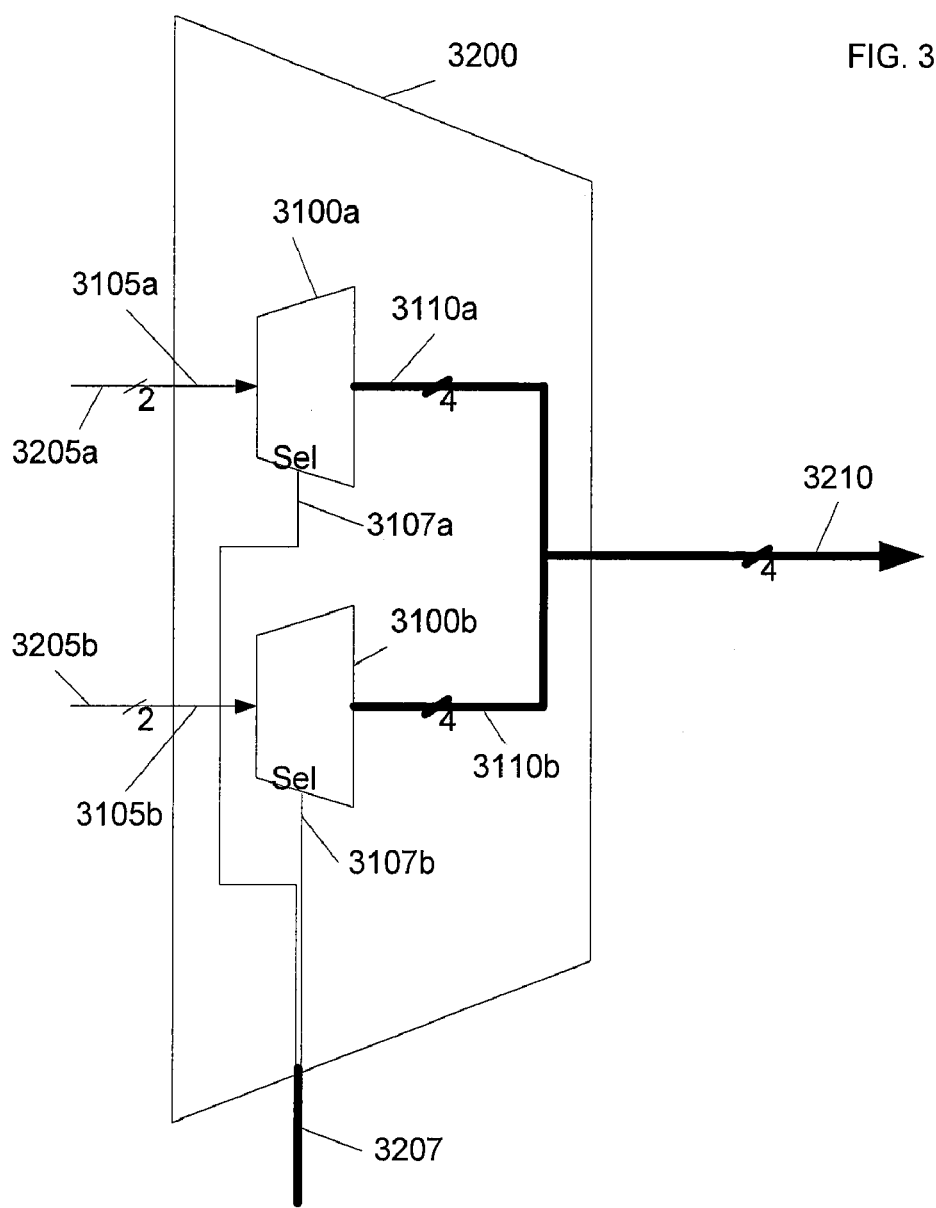

Turning to FIG. 32B, the merge selector 3200 is constructed using two widening selectors 3100, connected in parallel to the data output 3210. The first widening selector 3100a receives the first data input 3205a on its data input 3105a. The first widening selector receives a select signal on the first select input 3107a, which signal directs the lines of the data input 3105a to the selected lines of the first data output 3110a. The second widening selector 3100b receives the second data input 3205b on its data input 3105b. The second widening selector receives a select signal on the second select input 3107b, which signal directs the lines of the data input 3105b to the selected lines of the second data output 3110b. The lines of the data outputs 3110a and 3110b are combined and provided to the data output 3210 of the merge selector 3200. The select input 3207 receives the select signal for the merge selector 3200, which signal includes the select signals for each of the widening selectors 3110a-b in the merge selector 3200. The widening selector of FIG. 31B above can be used in the merge selector of FIG. 32B (where the output buses of 2 such circuit are tied together) provided that only 1 bit from each group of 4 control bits: {3107a($S_0$, $S_1$), 3107b($S_0$, $S_1$)}, and {3107a($S_2$, $S_3$), 3107b($S_2$, $S_3$)} is high at any one time.

Figure 33A:
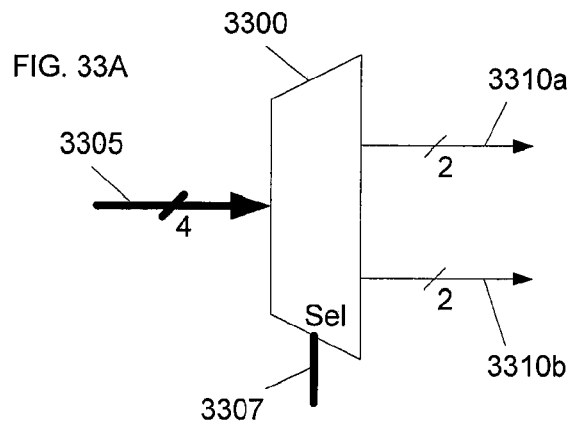
FIGS. 33A-B depict a demerge selector according to an embodiment of the invention.

Turning to FIG. 33A, a demerge selector 3300 is shown. The demerge selector 3300 separates bits from a wider source, such as from the first network. The separated bits are provided to one or more narrower networks, such as the second network, or to direct connections from the demerge selector 3300 to components of the reconfigurable device. The demerge selector 3300 includes a data input 3305 for receiving data from a wider source, and a plurality of data outputs 3310a-b for providing the demerged data to narrower targets. The demerge selector 3300 also includes a select input 3307, which receives a select signal that indicates which bits of each data output 3310a-b are to receive each line of the data input 3305.

As with the narrowing selector 3000 and widening selector 3100 discussed above, the demerge selector 3300 is programmable to direct any of the lines of the data input 3305 to any of the data outputs 3310a-b, including any of the individual bit lines on the data outputs 3310a-b. The demerge selector 3300 need not provide a signal on each line of the data outputs 3310a-b, nor need each line of the data input 3305 be provided to a line of a data output 3310a-b. The signals on the data input 3305 may be provided to only one of the data outputs 3310a-b (e.g. provide lines 1-2 of the data input 3305 to the data output 3310a and provide lines 304 of the data input 3305 to the data output 3310b) Alternatively, the same input signals may be provided to multiple data outputs if such a design is desirable.

Figure 33B:
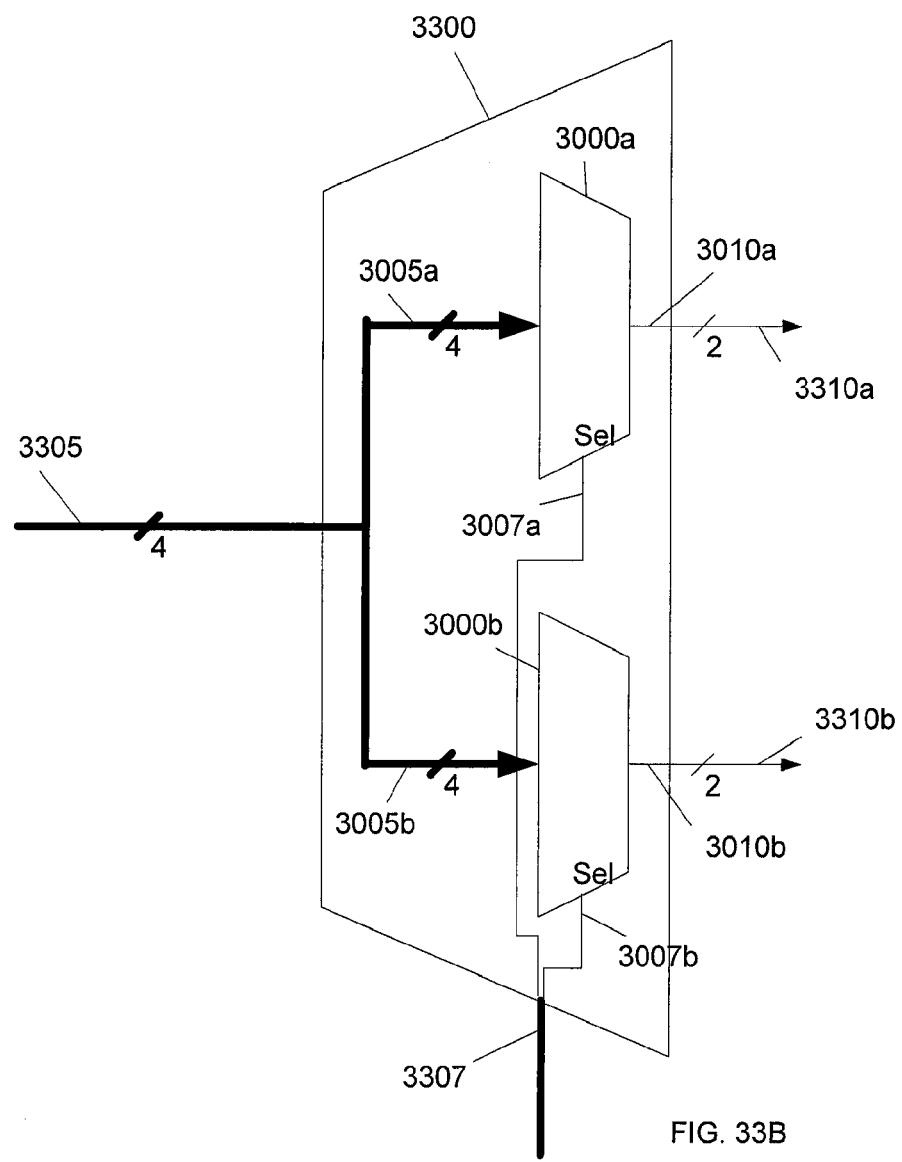

Turning to FIG. 33B, the demerge selector 3300 is constructed using two narrowing selectors 3000, connected in parallel to the data input 3305. The first narrowing selector 3000a receives the data input 3305 on its data input 3005a. The first narrowing selector 3000a receives a select signal on the select input 3007a, which signal selects the desired lines of the data input 3005a and directs them to the lines of the data output 3010a. The second narrowing selector 3000b receives the data input 3305 on its data input 3005b. The second narrowing selector 3000b receives a select signal on the select input 3007b, which signal selects the desired lines of the data input 3005b and directs them to the lines of the data output 3010b. The data output 3010a is connected to the data output 3310a of the demerge selector 3300. The data output 3010b is connected to the data output 3310b of the demerge selector 3300. The select input 3307 receives the select signal for the demerge selector 3300, which signal includes the select signals for each of the narrowing selectors 3010a-b in the demerge selector 3300.

Figure 34:
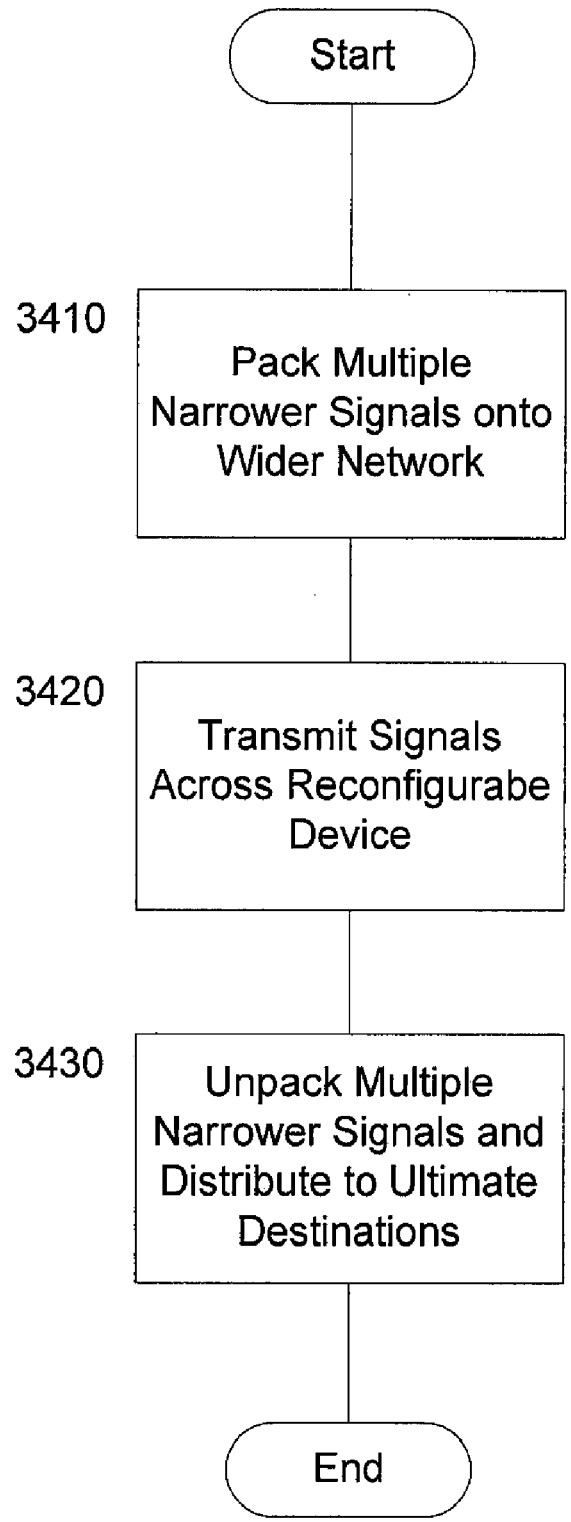
FIG. 34 depicts a method of transmitting signals across a network, according to an embodiment of the invention.

In an embodiment, a reconfigurable device uses the merge selector 3200 and the demerge selector 3300 to streamline the sending of signals across the device. Turning to FIG. 34, a method of routing signals is shown. At step 3410, the merge selector 3200 is used to pack multiple signals from narrower sources, such as special-purpose networks or direct connections, onto a single wider target, such as a general-purpose routing network or a wider special-purpose routing network. At step 3420, the packed signals are then transmitted across the wider target to a destination location within the reconfigurable device. At step 3430, a corresponding demerge selector 3300 is then used to unpack the multiple signals at the far end of the wider target, and distribute the signals to the respective narrower networks or direct connections which are the ultimate destinations of the various signals.

Figure 35:
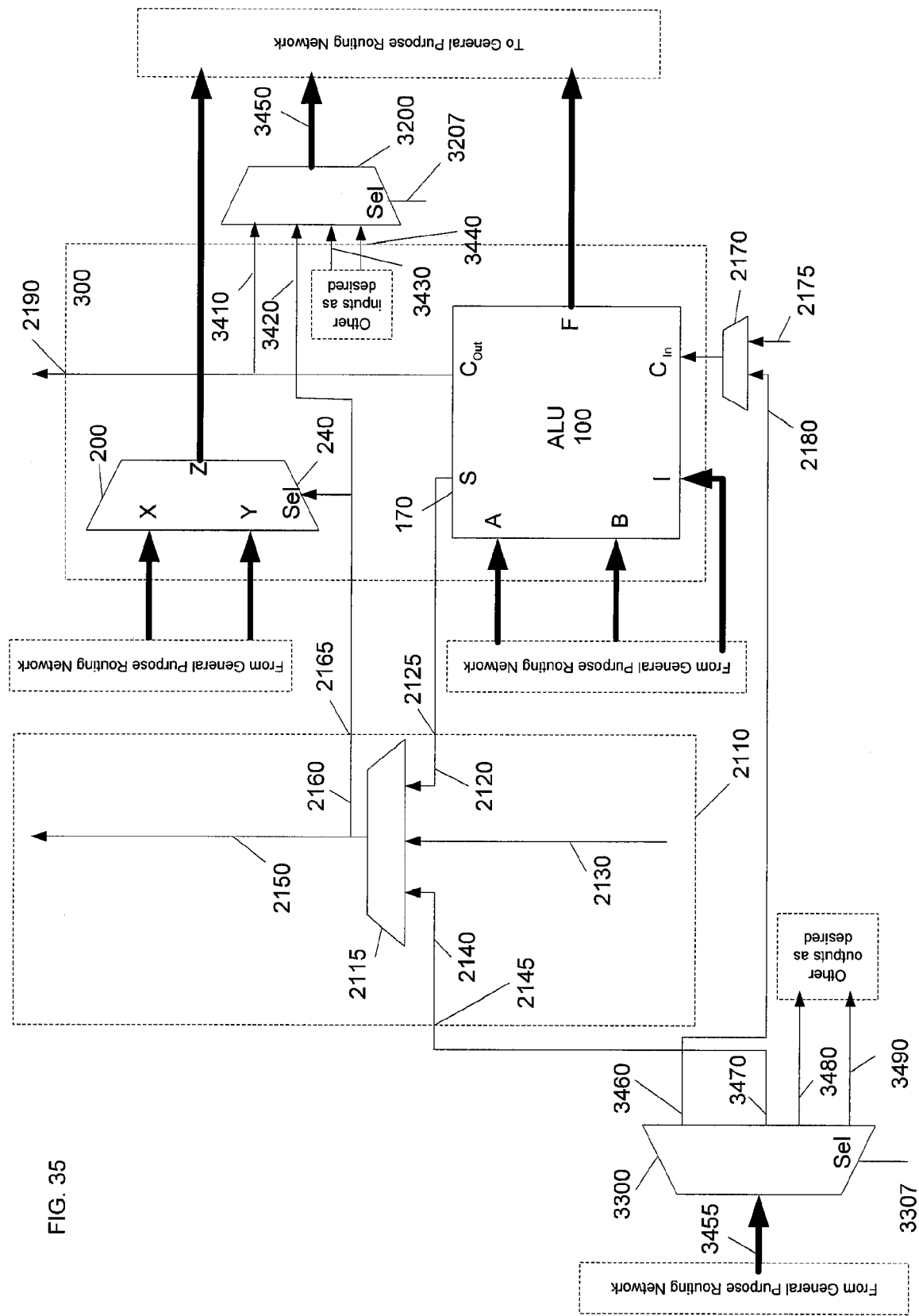
FIG. 35 depicts a cluster and an associated portion of a special-purpose routing network, including merge and demerge selectors according to an embodiment of the invention.

For a specific example of the use of the merge selector 3200 and demerge selector 3300 in a reconfigurable device, turn to FIG. 35. The portion of the reconfigurable device previously shown in FIG. 21 has been extended by the addition of a merge selector 3200 and a demerge selector 3300. The merge selector 3200 includes a first input 3410, a second input 3420, a third input 3430 and a fourth input 3440, which are all 1-bit wide. The first input 3410 is connected to the carry output 2190. The second input 3420 is connected to the select input 240 of the primary multiplexer 200. The third input 3430 and fourth input 3420 and any additional inputs may be connected to any sources that the designer desires to interface to the general purpose routing network. The merge selector 3200 also includes a first output 3450, which is connected to the general purpose routing network. The first output 3450 is 4-bits wide.

The merge selector 3200 therefore receives the following 1-bit signals:

1. $C_{out}$
2. Primary multiplexer select signal
3. Other desired signal 1
4. Other desired signal 2

These signals are packed onto the 4-bit general purpose routing network by the merge selector 3200, according to a select signal received on the select input 3207. For example, the select signal may cause the four bits of the general purpose routing network to carry the packed signals in the following order:

TABLE 9

| Routing network Bit | Contents |
| --- | --- |
| 1 | $C_{out}$ |
| 2 | Primary multiplexer select signal |
| 3 | Other desired signal 1 |
| 4 | Other desired signal 2 |

Other orderings are of course possible, depending on the wishes of the application designer. Once packed, these signals are placed on the general purpose routing network and routed to the desired target cluster.

Turning now to the demerge selector 3300, it includes an input 3455 from the general purpose routing network, which is 4-bits wide. The demerge selector 3300 also includes a first output 3460, a second output 3470, a third output 3480 and a fourth output 3490, which are all 1-bit wide. The first output 3460 is connected to the second carry input 2180, which it will be recalled is for receiving carry in (Cin) signals from the general purpose routing network, as discussed above. The second output 3470 is connected to the second routing input 2145 of the special-purpose routing network 2110, which it will be recalled is for receiving select signals for the primary multiplexer 200 from the general purpose routing network, as discussed above. The third output 3480 and fourth output 3490 may be connected to any other targets that the designer wishes to interface with the general purpose routing network.

The demerge selector 3300 receives a packed signal from the general purpose routing network, such as the packed signal discussed at Table 6 above. This packed signal is unpacked by the demerge selector 3300, according to a select signal received on the select input 3307. For example, the demerge selector 3300 unpacks the signal of Table 6 into the following four signals:

1. $C_{in}$ ($C_{out}$)
2. Primary multiplexer select signal
3. Other desired signal 1
4. Other desired signal 2

The demerge selector 3300 provides the $C_{in}$ signal on the first output 3460, which is connected to the second carry input 2180. Thus the $C_{out}$ signal from another cluster is provided as the $C_{in}$ signal to the cluster 300. The demerge selector 3300 provides the primary multiplexer select signal on the second output 3470, which is connected to the second routing input 2145 of the special purpose routing network 2110. Thus the primary multiplexer select signal from another cluster is provided to the cluster 300. This primary multiplexer select signal can then be propagated via the selector 2115, selector output 2160 and first routing output 2165 to the select input 240 of the primary multiplexer 200, thereby allowing the primary multiplexer 200 to be controlled by signals generated on clusters or other components which are not directly connected to the special-purpose routing network 2110. The other desired signals are provided on the third output 3480 and the fourth output 3490, which can be connected to other components of the reconfigurable device as desired by the designer.

Packing signals according to this embodiment of the invention allows, for example, the $C_{out}$ signal from a first cluster to be routed across the general purpose routing network to a second cluster where the $C_{out}$ signal can be applied as a $C_{in}$ signal for the ALU of the second cluster. Similarly, the multiplexer select signals can be routed across the general purpose routing network from a first cluster to a second cluster, where these signals can be used to control the primary multiplexer in the second cluster. Therefore the reconfigurable devices of an embodiment of the invention can transport signals, such as carry and select signals, between clusters in either of two ways. If the clusters are both connected to the same special-purpose routing network, then it may be possible to route on the special-purpose routing network depending on the relative positions of the clusters. If the two clusters are not both connected to the same special-purpose routing network, then the signals can be packed and efficiently routed across the general purpose routing network from one cluster to the other. The amount of wasted bit width is reduced and sometimes eliminated by using the data packing features of the merge and demerge selectors of an embodiment of the invention.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense, and the invention is not to be restricted or limited except in accordance with the following claims and their legal equivalents.

We claim:

1. A reconfigurable device, comprising:
   a first routing network comprising a plurality of routing network inputs and a plurality of routing network outputs;
   a second routing network, comprising a plurality of selectors and a plurality of selector links, each of the selector links connecting two of the plurality of selectors together; and
   a plurality of clusters each comprising a plurality of processing elements, each cluster connected to the first routing network and the second routing network;
   wherein each cluster comprises a first processing element of a first processing element type and a second processing element of a second processing element type, wherein the first processing element of the first processing element type provides a control input to the second processing element of the second processing element type, wherein the first routing network comprises a reconfigurable network; and wherein the second routing network is adapted to receive a signal from one of the plurality of clusters and route the signal to one of the plurality of clusters using one or more of the plurality of selectors.

2. The reconfigurable device of claim 1, wherein the second routing network further comprises a plurality of first routing inputs and a plurality of routing outputs; and wherein the plurality of selectors each comprises a first selector input, a second selector input, and a selector output wherein the first selector input of one of the plurality of selectors is connected to one of the plurality of first routing inputs, the selector output of one of the plurality of selectors is connected to one of the plurality of routing outputs and the plurality of selector links each connects the selector output of one of the plurality of selectors to a selector input of another of the plurality of selectors.

3. The reconfigurable device of claim 2, wherein each of the plurality of clusters further comprises a cluster input connected to one of the plurality of routing outputs of the second routing network and a cluster output connected to one of the plurality of first routing inputs of the second routing network.

4. The reconfigurable device of claim 3, wherein each cluster comprises an arithmetic logic unit (ALU) and a primary multiplexer;
the ALU comprising:
first and second data inputs each connected to one of the plurality of routing network outputs, and a data output connected to one of the plurality of routing network inputs, and
an ALU select output connected to the cluster output, wherein the ALU is adapted to provide a selector select signal on the ALU select output;
the primary multiplexer comprising:
third and fourth data inputs each connected to one of the plurality of routing network outputs, and a second data output connected to one of the plurality of routing network inputs, and
a multiplexer select input connected to the cluster input, wherein the primary multiplexer is adapted to connect one of the third and fourth data inputs to the second data output depending on a select signal provided on the multiplexer select input.

5. The reconfigurable device of claim 4, wherein the ALU select output is connected to the multiplexer select input of the primary multiplexer via the cluster output, a first selector of the plurality of selectors of the second routing network, the first selector corresponding to the cluster, and the cluster input.

6. The reconfigurable device of claim 4, wherein the ALU select output is connected to the multiplexer select input of a primary multiplexer belonging to a second cluster, via the cluster output, a first selector of the plurality of selectors of the second routing network, the first selector corresponding to the cluster, a selector link, a second selector of the plurality of selectors of the second routing network, the second selector corresponding to the second cluster, and a cluster input belonging to the second cluster.

7. The reconfigurable device of claim 2, wherein each of the plurality of clusters further comprises a second cluster input connected to one of the plurality of routing network outputs of the first routing network, and a second cluster output connected to one of the plurality of routing network inputs of the first routing network.

8. The reconfigurable device of claim 2, wherein the second routing network further comprises a plurality of second routing inputs, each connected to one of the routing network outputs of the first routing network, and wherein the plurality of selectors each further comprises a third selector input, wherein each of the plurality of second routing inputs is connected to the third selector input of one of the plurality of selectors.

9. The reconfigurable device of claim 2, wherein the plurality of selectors comprise a plurality of multiplexers corresponding to the plurality of clusters, each multiplexer further comprising a select signal input connected to a select signal source; wherein the multiplexer is adapted to connect one of the first or second selector inputs to the selector output depending on the select signal provided on the select signal input.

10. The reconfigurable device of claim 2, wherein the plurality of routing outputs of the second routing network are each connected to one of the plurality of processing elements in one of the plurality of clusters, each of the plurality of connected processing elements being of the same processing element type.

11. The reconfigurable device of claim 10, wherein the plurality of routing outputs are each connected to an equivalent input of each of the plurality of connected processing elements.

12. The reconfigurable device of claim 11, wherein the plurality of routing outputs are each connected to the multiplexer select input of a primary multiplexer.

13. The reconfigurable device of claim 2, further comprising a selectable inverter connected to a routing output of the second routing network, wherein the selectable inverter either inverts or does not invert a signal on the routing output of the second routing network, depending on the state of an inverter enable signal.

14. The reconfigurable device of claim 2, further comprising a selectable inverter connected to the selector link, wherein the selectable inverter either inverts or does not invert a signal on the selector link, depending on the state of an inverter enable signal.

15. The reconfigurable device of claim 1, wherein the first routing network comprises a first physical bit width and the second routing network comprises a second physical bit width different from the first bit width.

16. The reconfigurable device of claim 1, further comprising a plurality of carry routing networks, wherein each cluster further comprises a carry input and carry output each connected to one of the plurality of carry routing networks.

17. The reconfigurable device of claim 1, wherein the second routing network routes select signals.

18. The reconfigurable device of claim 1, wherein the plurality of selector links connect the plurality of selectors in a chain formation.

19. The reconfigurable device of claim 1, wherein the plurality of selector links are adapted to connect the plurality of clusters in a tree formation.

20. The reconfigurable device of claim 1, wherein the first routing network comprises a general purpose routing network.

21. The reconfigurable device of claim 1, wherein the second routing network comprises a special purpose routing network.

22. A reconfigurable device comprising:
a plurality of first processing elements of a first processing element type;
a plurality of second processing elements of a second processing element type;
a general purpose routing network connected to each of the pluralities of first and second processing elements and adapted to route a signal from any one of the pluralities of first or second processing elements to any other of the pluralities of first or second processing elements;

a first special-purpose routing network connected to the plurality of first processing elements and configured to cascade, in width across a data path, the plurality of first processing elements, such that the plurality of first processing elements have the same logical function as a single processing element of the first processing element type, having an aggregate data path width corresponding to a width of the plurality of first processing devices; and a second special-purpose routing network connected to the plurality of second processing elements and adapted to cascade, in width across a data path, the plurality of second processing elements, such that the plurality of second processing elements have the same logical function as a single processing element of the second processing element type, having an aggregate data path width corresponding to a width of the plurality of second processing devices.

23. The reconfigurable device of claim 22, wherein the first processing element type comprises ALUs, the second processing element type comprises multiplexers, the first special-purpose routing network comprises a carry network and the second special-purpose routing network comprises a select signal network.

24. A reconfigurable device comprising:
a plurality of processing elements;
a first routing network comprising a first physical bit width and a first processing element connection connected to a first one of the plurality of processing elements;
a second routing network comprising a second physical bit width, narrower than the first physical bit width, and a second processing element connection connected to a second one of the plurality of processing elements; and
a programmable selector comprising an input of the first physical bit width connected to the first routing network and an output of the second physical bit width connected to the second routing network;
wherein the programmable selector is configured to receive at the input an input signal of the first physical bit width from the first routing network, and to provide on the output an output signal of the second physical bit width to the second routing network, the output signal comprising one or more bits of the input signal.

25. The reconfigurable device of claim 24, wherein the programmable selector is programmable to allow any one of a plurality of the bits of the input to be provided to a bit of the output.

26. The reconfigurable device of claim 24, wherein the programmable selector comprises a narrowing selector.

27. The reconfigurable device of claim 26, wherein the narrowing selector selects a subset of the bits of the input and provides the subset of the bits to the output.

28. The reconfigurable device of claim 26, wherein the narrowing selector is programmable such that each bit of the output can receive any bit from the input.

29. The reconfigurable device of claim 24, wherein the programmable selector comprises a demerge selector.

30. The reconfigurable device of claim 29, wherein the demerge selector further comprises a second output, and the demerge selector selects a first subset of the bits of the input and provides the first subset of bits to the output, and selects a second subset of the bits of the input and provides the second subset of bits to the second output.

31. The reconfigurable device of claim 30, wherein the first subset and the second subset are disjoint.

32. The reconfigurable device of claim 30, wherein the demerge selector is programmable such that each bit of the output and the second output can receive any bit from the input.

33. The reconfigurable device of claim 24, wherein the programmable selector further comprises a select input and the programmable selector is programmed using a select signal.

34. The reconfigurable device of claim 24, wherein the first routing network comprises a general purpose routing network and the second routing network comprises a special purpose routing network.

35. A reconfigurable device comprising:
a plurality of processing elements;
a first routing network comprising a first physical bit width and a first processing element connection connected to a first one of the plurality of processing elements;
a second routing network comprising a second physical bit width, wider than the first bit width, and a second processing element connection connected to a second one of the plurality of processing elements; and
a programmable selector comprising an input of the first physical bit width connected to the first routing network and an output of the second physical bit width connected to the second routing network;
wherein the programmable selector is configured to receive at the input an input signal of the first physical bit width from the first routing network, and to provide on the output an output signal of the second physical bit width to the second routing network, the output signal comprising one or more bits of the input signal.

36. The reconfigurable device of claim 35, wherein the programmable selector is programmable to allow a bit of the input to be provided to any one of a plurality of the bits of the output.

37. The reconfigurable device of claim 35, wherein the programmable selector comprises a widening selector.

38. The reconfigurable device of claim 37, wherein the widening selector provides one or more of the bits of the input to a subset of the bits of the output.

39. The reconfigurable device of claim 37, wherein the widening selector is programmable such that each bit of the input can be provided to any bit of the output.

40. The reconfigurable device of claim 35, wherein the programmable selector comprises a merge selector.

41. The reconfigurable device of claim 40, wherein the merge selector further comprises a second input, and the merge selector selects one or more bits of the input and provides the one or more bits of the input to a first subset of the bits of the output, and selects one or more bits of the second input and provides the one or more bits of the second input to a second subset of the bits of the output.

42. The reconfigurable device of claim 41, wherein the first subset and second subset are disjoint.

43. The reconfigurable device of claim 41, wherein the merge selector is programmable such that each bit of the input and the second input can be provided to any bit of the output.

44. The reconfigurable device of claim 35, wherein the programmable selector further comprises a select input and the programmable selector is programmed using a select signal.

45. The reconfigurable device of claim 35, wherein the programmable selector is programmable to select a default value for any bit of the output which does not receive a bit of the input.

46. The reconfigurable device of claim 35, wherein the first routing network comprises a special purpose routing network and the second routing network comprises a general purpose routing network.

47. A method of routing a plurality of signals, each signal having a signal bit width, across a reconfigurable device, comprising:
- receiving the plurality of signals at a merge selector at a first location within the reconfigurable device, the plurality of signals having a combined bit width totaling a first bit width, the combined bit width comprising a sum of the signal bit widths of the plurality of signals;
- merging the plurality of signals into a composite signal having a bit width of at least the first bit width using a merge selector;
- routing the composite signal to a second location within the reconfigurable device, over a routing network having a bit width of at least the first bit width;
- receiving the composite signal at a demerge selector at the second location within the reconfigurable device; and
- demerging the composite signal of the first bit width into the plurality of signals, each having the signal bit width of the corresponding one of the plurality of signals received at the merge selector.

48. The reconfigurable device of claim 1, wherein the first routing network comprises a plurality of switches.

49. The reconfigurable device of claim 1, wherein the first routing network comprises a plurality of multiplexers.

50. A reconfigurable device, comprising:
- a first routing network comprising a plurality of routing network inputs and a plurality of routing network outputs;
- a second routing network, comprising a plurality of selectors and a plurality of selector links, each of the selector links connecting two of the plurality of selectors together; and
- a plurality of clusters each comprising a plurality of processing elements, each cluster connected to the first routing network and the second routing network;
- wherein each cluster comprises a first processing element of a first processing element type and a second processing element of a second processing element type,
- wherein the first processing element of the first processing element type in a first cluster of the plurality of clusters provides a control input to the second processing element of the second processing element type in a second cluster of the plurality of clusters, the control input being routed via a first selector of the plurality of selectors, a selector link, and a second selector of the plurality of selectors; and
- wherein the first routing network comprises a reconfigurable network.

* * * * *